US012713754B2

(12) United States Patent
Lee

(10) Patent No.: US 12,713,754 B2
(45) Date of Patent: Aug. 18, 2026

(54) DISPLAY DEVICE AND METHOD OF FABRICATING THE SAME

(71) Applicant: Samsung Display Co., LTD., Yongin-si (KR)

(72) Inventor: Sang Hoon Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 827 days.

(21) Appl. No.: 17/842,390

(22) Filed: Jun. 16, 2022

(65) Prior Publication Data

US 2022/0406840 A1 Dec. 22, 2022

(30) Foreign Application Priority Data

Jun. 17, 2021 (KR) ........................ 10-2021-0079003

(51) Int. Cl.
*H10H 29/14* (2025.01)
*G09G 3/3233* (2016.01)
(Continued)

(52) U.S. Cl.
CPC .......... *H10H 29/142* (2025.01); *H10H 20/01* (2025.01); *H10H 20/821* (2025.01); *H10H 20/831* (2025.01); *H10H 20/8312* (2025.01); *H10H 20/84* (2025.01); *H10H 20/8512* (2025.01); *G09G 3/3233* (2013.01);
(Continued)

(58) Field of Classification Search
CPC .... H10H 29/142; H10H 20/01; H10H 20/831; H10H 20/84; H10H 20/8512; H10H 20/032; H10H 20/882; H10H 20/83; H10H 20/857; G09G 3/3233; G09G 2300/0426;
(Continued)

(56) References Cited

U.S. PATENT DOCUMENTS 11,749,783 B2 9/2023 Basrur et al.
11,978,834 B2 * 5/2024 Li ........................ H01L 25/0753
(Continued)

FOREIGN PATENT DOCUMENTS

KR 10-2020-0010704 A 1/2020
KR 10-2020-0013190 A 2/2020
(Continued)

*Primary Examiner* — William B Partridge
*Assistant Examiner* — Alexandre X Ramirez
(74) *Attorney, Agent, or Firm* — Womble Bond Dickinson (US) LLP

(57) ABSTRACT

A display device includes a pixel in a display area. The pixel may include a first electrode and a second electrode spaced from each other; a first insulating pattern on the first electrode, the first insulating pattern protruding to an outside of the first electrode while having a width greater than that of the first electrode; a second insulating pattern on the second electrode, the second insulating pattern protruding to an outside of the second electrode while having a width greater than that of the second electrode; a light emitting element arranged between the first insulating pattern and the second insulating pattern, the light emitting element including a first end and a second end; a third insulating pattern on a portion of the light emitting element to expose the first end and the second end of the light emitting element; and a first contact electrode on the light emitting element.

15 Claims, 33 Drawing Sheets

(51) Int. Cl.

| | |
|---|---|
| ***H10H 20/01*** | (2025.01) |
| ***H10H 20/80*** | (2025.01) |
| ***H10H 20/821*** | (2025.01) |
| ***H10H 20/831*** | (2025.01) |
| ***H10H 20/84*** | (2025.01) |
| ***H10H 20/851*** | (2025.01) |

(52) U.S. Cl.
CPC ............... *G09G 2300/0426* (2013.01); *G09G 2300/0819* (2013.01); *G09G 2300/0842* (2013.01); *H10H 20/032* (2025.01); *H10H 20/882* (2025.01)

(58) Field of Classification Search
CPC . H01L 25/0753; H10D 86/441; H10D 86/451
See application file for complete search history.

(56) References Cited

U.S. PATENT DOCUMENTS

| | | | | |
|---|---|---|---|---|
| 2019/0244567 | A1* | 8/2019 | Cho | H10H 20/84 |
| 2020/0005703 | A1* | 1/2020 | Kim | G09G 3/32 |
| 2020/0075667 | A1* | 3/2020 | Lee | H10H 20/83 |
| 2020/0111832 | A1* | 4/2020 | Yang | H10H 20/835 |
| 2020/0176656 | A1* | 6/2020 | Bae | H10H 20/01 |
| 2021/0272943 | A1* | 9/2021 | Lee | H10D 86/60 |
| 2021/0288217 | A1* | 9/2021 | Li | H10H 20/84 |
| 2021/0351322 | A1 | 11/2021 | Lee et al. | |
| 2022/0037299 | A1* | 2/2022 | Lee | H01L 25/0753 |
| 2022/0059739 | A1* | 2/2022 | Li | H10H 20/853 |

FOREIGN PATENT DOCUMENTS

| | | | |
|---|---|---|---|
| KR | 10-2021-0109699 | A | 9/2021 |
| KR | 10-2021-0136213 | A | 11/2021 |
| WO | WO 2020/017718 | A1 | 1/2020 |

* cited by examiner

PXL (PXA)
RTP : RTP1, RTP2
DR1, DR2
DR3
ENC
CFL
DPL
PCL
SPA
NEA
EA
CF
INS7
CF3
CF2
CF1
INS6
CDP2
INS5
INS4
INS3
INS2
INS1
BSL
II'
II
CNE2
RTP2
INP2
ELT2
BNK
CNT2
CCL
CDP1
INP3
QD/SCT
CNE1
CNT1
RTP1
INP1
ELT1
CH1
CH2
PL2
EP2
AR
LD
EP1
DE
GE
SCP
BML
SE
M1

INS5
INS4
INS3
INS2
INS1
BSL
PL2
CH2
ELT2 (AL2)
INP2
RTP1 : ELT1, INP1
RTP2 : ELT2, INP2
ELT1 (AL1)
INP1
CH1
DE
GE
SCP
BML
SE
M1
PCL
DR3
DR1, DR2

INS5
INS4
INS3
INS2
INS1
BSL
PL2
CH2
BNK
ELT2 (AL2)
INP2
EP2
LD
EP1
ELT1 (AL1)
INP1
BNK
CH1
DE
GE
SCP
BML
SE
M1
PCL
RTP1 : ELT1, INP1
RTP2 : ELT2, INP2
DR1, DR2
DR3

INS5
INS4
INS3
INS2
INS1
BSL
PL2
CH2
BNK
ELT2 (AL2)
INP2
EP2
INP3
LD
EP1
ELT1 (AL1)
INP1
BNK
CH1
DE
GE
SCP
BML
SE
M1
PCL
RTP1 : ELT1, INP1
RTP2 : ELT2, INP2
DR3
DR1, DR2

INS5 INS4 INS3 INS2 INS1 BSL

PL2 ELT2 INP2 CH2 BNK CNT2 EP2 INP3 LD EP1 ELT1 CNT1 INP1 BNK CH1

DE GE SCP BML SE M1

RTP1 : ELT1, INP1
RTP2 : ELT2, INP2

PCL

DR3 DR1, DR2

INS5
INS4
INS3
INS2
INS1
BSL
PL2
ELT2
INP2
CH2
BNK
CNT2
EP2
INP3
LD
EP1
ELT1
CNT1
INP1
BNK
CH1
DE
GE
SCP
BML
SE
M1
RTP1 : ELT1, INP1
RTP2 : ELT2, INP2
PCL
DR3
DR1, DR2

RTP1 : ELT1, INP1
RTP2 : ELT2, INP2

PXL (PXA)

ELT1
ELT2
INP1
INP2
SPA(OPA2)
CH1
CH2
LD
EA(OPA1)
EP1
EP2
CNT1
CNT2
INP3
ELT1
ELT2
INP1
INP2
BNK
SPA(OPA2)

RTP1 : ELT1, INP1
RTP2 : ELT2, INP2

RTP1 : ELT1, INP1
RTP2 : ELT2, INP2

PXL (PXA)

ELT1
ELT2
INP1/CNE1
INP2/CNE2
SPA(OPA2)
CH1
CH2
NEA
LD
EA(OPA1)
EP1
EP2
ELT1
ELT2
INP1/CNE1
INP2/CNE2
INP3/CDP1
BNK
CH3
CH4
SPA(OPA2)

RTP1 : ELT1, INP1
RTP2 : ELT2, INP2

PXL (PXA)

UPL
CF1
CF2
CF3
CF
PRL
INS6
CDP2
INS5
INS4
INS3
INS2
INS1
BSL
II'

RTP : RTP1, RTP2

SPA
RTP2
INP2
ELT2
CNE2
PL2
CH2
NEA
BNK
EA
CNT2
CCL
CDP1
INP3
QD/SCT
CNE1
CNT1
EP2
LD
EP1
DE
GE
SCP
BML
SE
M1
RTP1
INP1
ELT1
CH1
CDP2
II

ENC
CFL
DPL
PCL

DR1, DR2
DR3

PXL (PXA)
UPL
CF1
CF2
CF3
CF
BMP
PRL
INS6
CDP2
INS5
INS4
INS3
INS2
INS1
BSL
II'
II
SPA
NEA
EA
CNT1
CNT2
CNE2
RTP2
INP2
ELT2
BNK
CCL
CDP1
INP3
QD/SCT
CNE1
RTP1
INP1
ELT1
CDP2
CH1
CH2
PL2
EP2
LD
EP1
DE
GE
SCP
BML
SE
M1
RTP : RTP1, RTP2
ENC
LCL
DPL
PCL
DR3
DR1, DR2

DISPLAY DEVICE AND METHOD OF FABRICATING THE SAME

CROSS-REFERENCE TO RELATED APPLICATION

This application claims priority to and the benefit of Korean patent application No. 10-2021-0079003, filed on Jun. 17, 2021, the entire disclosure of which is incorporated by reference herein.

BACKGROUND

1. Field

Embodiments of the present disclosure relate to a display device and a method of fabricating the same.

2. Description of Related Art

Recently, interest in information display is increasing. Accordingly, research and development of a display device are continuously being conducted.

SUMMARY

Embodiments of the present disclosure are directed to a display device including a light emitting element and a method of fabricating the same.

One or more embodiments of the present disclosure may provide a display device including a pixel disposed in a display area. The pixel may include a first electrode and a second electrode spaced from each other; a first insulating pattern on the first electrode, the first insulating pattern protruding to an outside of the first electrode while having a width greater than that of the first electrode; a second insulating pattern on the second electrode, the second insulating pattern protruding to an outside of the second electrode while having a width greater than that of the second electrode; a light emitting element arranged between the first insulating pattern and the second insulating pattern, the light emitting element including a first end and a second end; a third insulating pattern on a portion of the light emitting element to expose the first end and the second end of the light emitting element; a first contact electrode on the first end of the light emitting element and the first insulating pattern, and connected to the first end of the light emitting element; and a second contact electrode on the second end of the light emitting element and the second insulating pattern, and connected to the second end of the light emitting element.

In one or more embodiments, the first insulating pattern may overlap the first electrode and protrude to the outside of the first electrode in an entire peripheral area of the first electrode, and the second insulating pattern may overlap the second electrode and protrude to the outside of the second electrode in an entire peripheral area of the second electrode.

In one or more embodiments, the first insulating pattern and the second insulating pattern may have individual patterns corresponding to the pixel.

In one or more embodiments, the first contact electrode may have an individual pattern corresponding to the first insulating pattern, and the second contact electrode may have an individual pattern corresponding to the second insulating pattern.

In one or more embodiments, the first insulating pattern and the second insulating pattern may be spaced from each other by a first distance shorter than a length of the light emitting element, and the first end and the second end of the light emitting element may be on the first insulating pattern and the second insulating pattern, respectively.

In one or more embodiments, the first electrode and the second electrode may be spaced from each other by a second distance that is longer than the first distance.

In one or more embodiments, the first contact electrode may be connected to the first electrode through a first contact portion in the first insulating pattern, and the second contact electrode may be connected to the second electrode through a second contact portion in the second insulating pattern.

In one or more embodiments, the third insulating pattern may include an upper area including an upper surface; and a middle area located between the upper area and the light emitting element, and having a width narrower than that of the upper area.

In one or more embodiments, the first contact electrode and the second contact electrode may be separated from each other with the third insulating pattern interposed therebetween.

In one or more embodiments, the pixel may include a plurality of light emitting elements arranged between the first insulating pattern and the second insulating pattern, including the light emitting element.

In one or more embodiments, the third insulating pattern may have a first height above the light emitting elements, and a second height lower than the first height in an area between the light emitting elements.

In one or more embodiments, the third insulating pattern may include a concave curved sidewall above the light emitting elements and a vertical sidewall in an area between the light emitting elements.

In one or more embodiments, the pixel may further include a conductive pattern that is on the third insulating pattern and is separated from the first contact electrode and the second contact electrode.

In one or more embodiments, the conductive pattern may include a same material as that of the first contact electrode and the second contact electrode.

In one or more embodiments, the display device may further include a plurality of pixels that are adjacent in a first direction in the display area, including the pixel. First electrodes of the plurality of pixels may be separated from each other in a separation area located between emission areas of the plurality of pixels. First insulating patterns of the plurality of pixels may be separated from each other in the separation area. First contact electrodes of the plurality of pixels may be separated from each other in the separation area. The first insulating pattern and the first contact electrode of each of the pixels may protrude to an outside of the first electrode of each of the pixels in the first direction.

One or more embodiments of the present disclosure may provide a method of fabricating a display device including successively forming a conductive layer and an insulating layer on a base layer; forming a first insulating pattern and a second insulating pattern to be separated from each other in a pixel area on the base layer, by etching the insulating layer; forming a first electrode and a second electrode under the first insulating pattern and the second insulating pattern, respectively, by etching the conductive layer using the first insulating pattern and the second insulating pattern as a mask; supplying a light emitting element to the pixel area, and aligning the light emitting element between the first insulating pattern and the second insulating pattern; forming a third insulating pattern on a portion of the light emitting element to expose a first end and a second end of the light emitting element; and forming a first contact electrode on the first end of the light emitting element and the first insulating pattern and forming a second contact electrode on the second end of the light emitting element and the second insulating pattern, by applying a conductive material on the base layer on which the third insulating pattern is formed, wherein, in the forming of the first electrode and the second electrode, the conductive layer is over-etched such that the first electrode and the second electrode are narrower in width than the first insulating pattern and the second insulating pattern, respectively.

In one or more embodiments, the third insulating pattern may include an organic photosensitive material, and a concave sidewall may be formed in the third insulating pattern above the light emitting element, by patterning the third insulating pattern by a photolithography process.

In one or more embodiments, the forming of the first contact electrode and the second contact electrode may include separating the first contact electrode and the second contact electrode from each other in applying the conductive material, using a first reverse tapered pattern formed by the first electrode and the first insulating pattern, a second reverse tapered pattern formed by the second electrode and the second insulating pattern, and the third insulating pattern.

In one or more embodiments, the method may further include, before the forming of the first contact electrode and the second contact electrode, separating the first and second insulating patterns of a pixel in the pixel area from first and second insulating patterns of a neighboring pixel; and separating the first and second electrodes of the pixel from first and second electrodes of the neighboring pixel, using the first and second insulating patterns of the pixel as a mask.

In one or more embodiments, the first and second electrodes may be over-etched such that the first and second electrodes of the pixel are positioned inside the first and second insulating patterns, respectively, in an entire peripheral area of the first and second electrodes.

Details of embodiments are included in the detailed description and drawings.

A display device and a method of fabricating the same in accordance with embodiments of the present disclosure are advantageous in that a conductive material may be applied to a display area in which light emitting elements are arranged, and simultaneously and/or automatically a conductive layer formed of the conductive material may be separated so that first and second contact electrodes may be formed on first and second ends of the light emitting elements, respectively.

Thus, a contact process for connecting the light emitting elements to first and second electrodes and/or the first and second contact electrodes may be simplified, and the number of mask processes used for manufacturing pixels may be reduced. Therefore, in accordance with an embodiment of the present disclosure, a process of fabricating a pixel and a display device including the same may be simplified. Furthermore, as the process of fabricating the display device is simplified, process variations that may occur in each process step may be reduced. Thus, the light emitting elements may be reliably connected to the first and second contact electrodes.

The effects, aspects, and features of the present disclosure are not limited by the foregoing, and other various effects, aspects, and features are anticipated herein.

DETAILED DESCRIPTION

Figure 1:
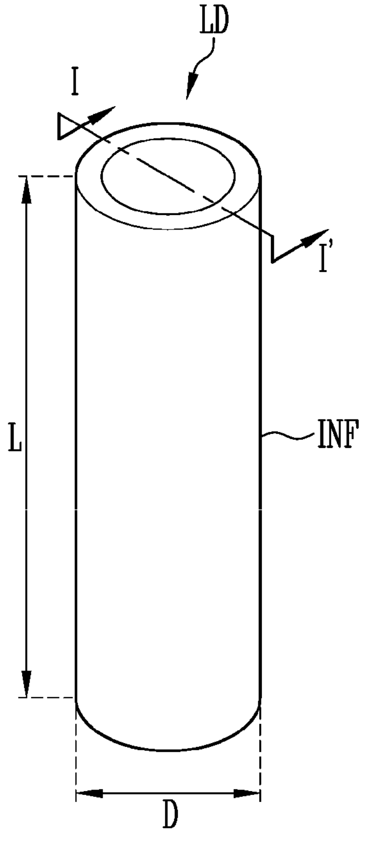
FIG. 1 is a perspective view illustrating a light emitting element in accordance with one or more embodiments of the present disclosure.

Reference will now be made in detail to various embodiments of the present disclosure, specific examples of which are illustrated in the accompanying drawings and described below, because the embodiments of the present disclosure may be variously modified in many different forms. Furthermore, a singular form may include a plural form as long as it is not specifically mentioned in a sentence.

The present disclosure is not limited to the following embodiments and may be modified into various forms. Furthermore, an embodiment described below may be implemented alone or in combination with at least one different embodiment.

Some elements that are not directly related to the features of the present disclosure in the drawings may be omitted to clearly explain the present disclosure. It should be noted that the same reference numerals are used to designate the same or similar elements throughout the drawings, and repetitive explanation will be omitted.

Figure 2:
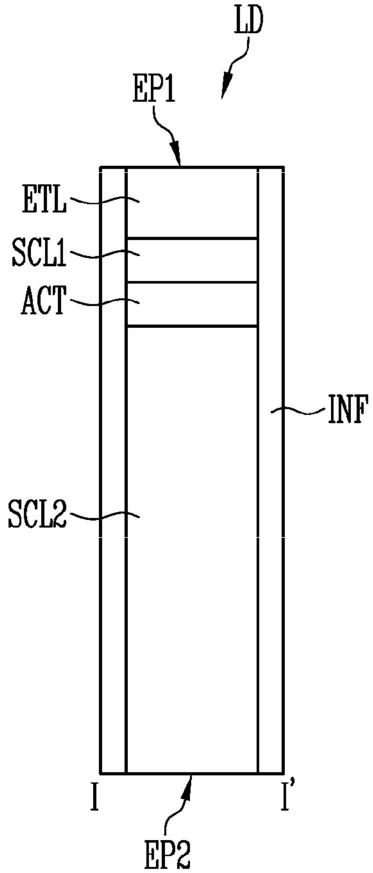
FIG. 2 is a sectional view illustrating a light emitting element in accordance with one or more embodiments of the present disclosure.

FIG. 1 is a perspective view illustrating a light emitting element LD in accordance with one or more embodiments of the present disclosure, and FIG. 2 is a sectional view illustrating the light emitting element LD in accordance with one or more embodiments of the present disclosure. For example, FIG. 1 shows an example of a light emitting element LD that may be used as a light source of a pixel in accordance with one or more embodiments of the present disclosure, and FIG. 2 shows an example of a section of the light emitting element LD taken along the line I-I' in FIG. 1.

Referring to FIGS. 1 and 2, the light emitting element LD may include an active layer ACT, a first semiconductor layer SCL1 and a second semiconductor layer SCL2 positioned on both sides of the active layer ACT, and an insulating film INF that encloses an outer surface (e.g., outer periphery/circumference or side surfaces) of the first semiconductor layer SCL1, the active layer ACT, and the second semiconductor layer SCL2. Further, the light emitting element LD may selectively include an electrode layer ETL disposed on the first semiconductor layer SCL1. In this case, the insulating film INF may at least partially enclose or may not enclose the outer surface (e.g., the outer periphery or circumference) of the electrode layer ETL. In one or more embodiments, the light emitting element LD may further include another electrode layer disposed on a surface (e.g. lower surface) of the second semiconductor layer SCL2.

In one or more embodiments, the light emitting element LD may be provided in the shape of a bar (or rod) extending in one direction, and may have a first end EP1 and a second end EP2 on both ends in a length direction (or thickness direction) of the light emitting element LD. The first end EP1 may be a first underside (or upper surface) of the light emitting element LD, and the second end EP2 may be a second underside (or lower surface) of the light emitting element LD.

In describing one or more embodiments of the present disclosure, the term "rod-like shape" embraces a rod-like shape and a bar-like shape such as a cylindrical shape and a prismatic shape extending in the length direction (i.e., to have an aspect ratio greater than 1), and the cross-sectional shape thereof is not limited to a particular shape. For example, the length L of the light emitting element LD may be greater than a diameter D thereof (or a width of the cross-section thereof).

In one or more embodiments, the electrode layer ETL, the first semiconductor layer SCL1, the active layer ACT, and the second semiconductor layer SCL2 may be successively disposed in a direction from the first end EP1 to the second end EP2 of the light emitting element LD. In other words, the electrode layer ETL may be disposed on the first end EP1 of the light emitting element LD, and the second semiconductor layer SCL2 may be disposed on the second end EP2 of the light emitting element LD. In one or more embodiments, at least one different electrode layer may be disposed on the second end EP2 of the light emitting element LD.

The first semiconductor layer SCL1 may be a first conductivity type semiconductor layer. For example, the first semiconductor layer SCL1 may include a P-type semiconductor layer including a P-type dopant. For instance, the first semiconductor layer SCL1 may be a P-type semiconductor layer which includes any one semiconductor material of InAlGaN, GaN, AlGaN, InGaN, AlN, and InN, and is doped with a dopant such as Mg. However, the material forming the first semiconductor layer SCL1 is not limited thereto, and the first semiconductor layer SCL1 may be formed of various other materials.

The second semiconductor layer SCL2 may include a second conductivity type semiconductor layer different from that of the first semiconductor layer SCL1. For example, the second semiconductor layer SCL2 may include an N-type semiconductor layer including an N-type dopant. For instance, the second semiconductor layer SCL2 may be an N-type semiconductor layer that includes any one semiconductor material of InAlGaN, GaN, AlGaN, InGaN, AlN, and InN and is doped with a dopant such as Si, Ge, or Sn. However, the material forming the second semiconductor layer SCL2 is not limited thereto, and the second semiconductor layer SCL2 may be formed of various other materials.

In one or more embodiments, the first semiconductor layer SCL1 and the second semiconductor layer SCL2 may have different lengths (or thicknesses) in the length direction of the light emitting element LD. For example, the second semiconductor layer SCL2 may have a length (or a thickness) greater than that of the first semiconductor layer SCL1 in the length direction of the light emitting element LD. Thus, the active layer ACT may be positioned closer to the first end EP1 than the second end EP2.

The active layer ACT may be positioned between the first semiconductor layer SCL1 and the second semiconductor layer SCL2, and may be formed in a single-quantum well structure or a multi-quantum well structure. In one or more embodiments, the active layer ACT may emit light having a wavelength ranging from 400 nm to 900 nm, and may use a double hetero structure.

A cladding layer doped with the conductive dopant may be selectively formed above and/or under the active layer ACT. For example, the cladding layer may be formed of an AlGaN layer or an InAlGaN layer. In one or more embodiments, a material such as AlGaN or AlInGaN may be used to form the active layer ACT, and the active layer ACT may be formed of various other materials.

If a voltage equal to or greater than a threshold voltage is applied between both ends (e.g. the first and second ends EP1 and EP2) of the light emitting element LD, the light emitting element LD emits light by recombination of electron-hole pairs in the active layer ACT. Therefore, by controlling the voltage (or the current supplied to the light emitting element LD) applied between both ends of the light emitting element LD to control the light emission of the light emitting element LD, the light emitting element LD may be used as a light source of various light emitting devices including pixels.

The electrode layer ETL may be disposed on the first semiconductor layer SCL1. The electrode layer ETL may be a contact electrode that protects the first semiconductor layer SCL1 and smoothly connects the first semiconductor layer SCL1 to an electrode or a line (e.g., a predetermined electrode or line). For instance, the electrode layer ETL may be an ohmic contact electrode or a Schottky contact electrode.

In describing embodiments of the present disclosure, the term "connection (or coupling)" may generally mean physical and/or electrical connection (or coupling). Furthermore, this may generally mean direct or indirect connection (or coupling) and integrated or non-integrated connection (or coupling).

The electrode layer ETL may be substantially transparent or translucent. Thereby, light generated from the light emitting element LD may be emitted to the outside of the light emitting element LD after passing through the electrode layer ETL. In one or more embodiments, in case that light generated by the light emitting element LD is emitted to the outside of the light emitting element LD without passing through the electrode layer ETL, the electrode layer ETL may be formed to be opaque.

In one or more embodiments, the electrode layer ETL may include metal or metal oxide. For example, the electrode layer ETL may be formed of metal such as chromium (Cr), titanium (Ti), aluminum (Al), gold (Au), nickel (Ni), or copper (Cu), oxides or alloys thereof, or transparent conductive materials such as indium tin oxide (ITO), indium zinc oxide (IZO), indium tin zinc oxide (ITZO), zinc oxide (ZnO), or indium oxide ($In_xO_y$) alone or in combination.

The insulating film INF may expose the electrode layer ETL and the second semiconductor layer SCL2 in the first and second ends EP1 and EP2 of the light emitting element LD, respectively.

In case that the insulating film INF is provided to cover the surface of the light emitting element LD, for example, the outer surface (e.g., the outer periphery or circumferences) of the first semiconductor layer SCL1, the active layer ACT, the second semiconductor layer SCL2, and/or the electrode layer ETL, a short-circuit through the light emitting element LD may be prevented. Consequently, the electrical stability of the light emitting element LD may be secured. Further, if the insulating film INF is provided on the surface of the light emitting element LD, it is possible to improve life and efficiency by reducing or minimizing surface defects of the light emitting element LD. Even when a plurality of light emitting elements LD is disposed close to each other, it is possible to prevent a short-circuit from occurring between the light emitting elements LD.

In one or more embodiments of the present disclosure, a surface treatment process may be performed to fabricate the light emitting element LD. For example, the light emitting element LD may be surface-treated so that, in case that a plurality of light emitting elements LD are mixed with a fluidic solution (or solvent) and then supplied to each emission area (e.g., an emission area of each pixel), the light emitting elements LD may be evenly distributed rather than unevenly aggregating in the solution. According to non-limiting embodiments, the insulating film INF itself may be formed of a hydrophobic film using hydrophobic material, or the hydrophobic film of the hydrophobic material may be further formed on the insulating film INF.

The insulating film INF may include transparent insulating material. Thereby, light generated from the active layer ACT may be emitted to the outside of the light emitting element LD after passing through the insulating film INF. For example, the insulating film INF may include at least one insulating material of $SiO_2$ or silicon oxide ($SiO_x$), $Si_3N_4$ or silicon nitride ($SiN_x$), $Al_2O_3$ or aluminum oxide ($Al_xO_y$), and $TiO_2$ or titanium oxide ($Ti_xO_y$) not determined therein.

The insulating film INF may be formed of a single layer or a multiple layer. For example, the insulating film INF may be formed of a double layer.

In one or more embodiments, the insulating film INF may be partially etched in at least one area, e.g., an area positioned at the first end EP1 and/or the second end EP2 of the light emitting element LD. For instance, the insulating film INF may be etched to have a rounded shape in at least one area. Thus, the first semiconductor layer SCL1, the second semiconductor layer SCL2, the electrode layer ETL, and/or another electrode layer (e.g., another electrode layer disposed on the second end EP2 of the light emitting element LD) may be partially exposed.

In one or more embodiments, the light emitting element LD may have a small size corresponding to a range from a nanometer scale to a micrometer scale. For instance, the light emitting element LD may have a diameter D (or width of a cross-section) and/or a length L ranging from the nanometer scale to the micrometer scale. For example, the light emitting element LD may have a diameter D in a range of several hundred nanometers and a length L in a range of several micrometers. However, in the present disclosure, the size of the light emitting element LD is not limited thereto. For example, the size of the light emitting element LD may be variously changed depending on design conditions of various light emitting devices, e.g., a pixel, using the light emitting element LD as a light source.

Further, the structure, shape, and/or type of the light emitting element LD may be changed according to embodiments. For example, the light emitting element LD may not include the electrode layer ETL. Further, the light emitting element LD may have a core-shell structure.

The light emitting device including the light emitting element LD may be used in various devices requiring the light source. For instance, a plurality of light emitting elements LD may be arranged in each pixel of a display device, and the light emitting elements LD may be used as a light source of the pixel. However, the application field of the light emitting element LD is not limited to the above-mentioned examples. For example, the light emitting element LD may also be used in various devices, such as a lighting device, which require the light source.

Figure 3:
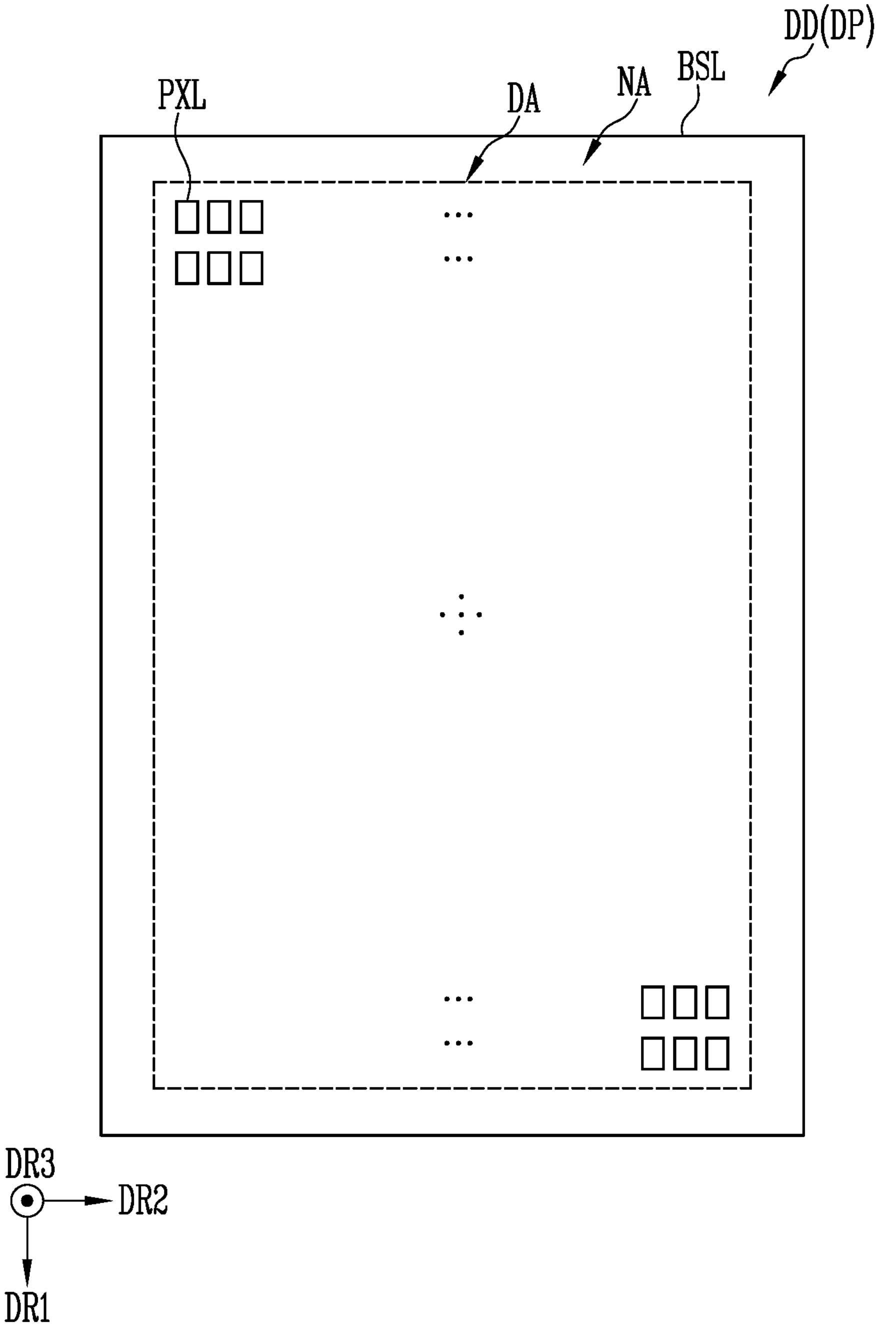
FIG. 3 is a plan view illustrating a display device in accordance with one or more embodiments of the present disclosure.

FIG. 3 is a plan view illustrating a display device DD in accordance with one or more embodiments of the present disclosure. For instance, FIG. 3 shows the display device DD as an example of a device that may use the light emitting element LD described in the embodiment of FIGS. 1 and 2 as the light source, and particularly shows a display panel DP provided in the display device DD. FIG. 3 simply illustrates the structure of the display panel DP, focused on a display area DA.

Referring to FIG. 3, the display panel DP may include a base layer BSL and pixels PXL provided on the base layer BSL.

The display panel DP and the base layer BSL for forming the display panel may include the display area DA for displaying an image, and a non-display area NA other than the display area DA. For instance, the non-display area NA may be an area other than the display area DA.

The display panel DP may be formed in various shapes. For instance, the display panel DP may be provided in the shape of a rectangular plate, but is not limited thereto. For example, the display panel DP may have a shape such as a circular shape or an elliptical shape. In addition, the display panel DP may include angled corners and/or curved corners.

For convenience, FIG. 3 illustrates that the display panel DP has the shape of a rectangular plate including a pair of long sides and a pair of short sides. The extending direction (e.g., the vertical direction of the display panel DP) of the long side is indicated as a first direction DR1, the extending direction (e.g. the horizontal direction of the display panel DP) of the short side is indicated as a second direction DR2, and the direction perpendicular to the extending direction of each of the long and short sides (e.g., the thickness or height direction of the display panel DP) is indicated as a third direction DR3. However, they may be changed according to the shape of the display panel DP.

The display area DA may have various shapes. For example, the display area DA may have various shapes including a rectangle, a circle, an ellipse, and the like. In one or more embodiments, the display area DA may have a shape that conforms to the shape of the display panel DP, but is not limited thereto.

The pixels PXL may be arranged in the display area DA on the base layer BSL. For instance, the display area DA may include a plurality of pixel areas in which each pixel PXL is disposed.

A non-display area NA may be provided around the display area DA along the edge or periphery of the display area DA. Various lines, pads, and/or internal circuit components that are connected to the pixels PXL of the display area DA may be disposed in the non-display area NA.

In one or more embodiments, at least two types of pixels PXL emitting light of different colors may be disposed in the display area DA. Further, the pixels PXL of different colors arranged adjacent to each other may form one pixel unit that may emit light of various colors.

In one or more embodiments, each pixel PXL may be set as a pixel (or sub-pixel) of a desired color (e.g., a predetermined color), and may include the light emitting element LD that generates light of the desired color (e.g., the predetermined color). Alternatively, at least some of the pixels PXL arranged in the display area DA include light emitting elements LD that generate light of a first color, and a photo conversion layer may be disposed over the pixels PXL to convert light of the first color into light of a second color. Accordingly, the light of the second color may be generated using the at least some of the pixels PXL.

The pixel PXL may include at least one light source that is driven by a control signal (e.g., a predetermined control signal, e.g., a scan signal and a data signal) and/or a power source (e.g., a predetermined power source, e.g., a first power source and a second power source). In one or more embodiments, the light source may be the light emitting element LD according to the embodiments of FIGS. 1 and 2, e.g., a rod-type light emitting element LD having a small size corresponding to a range from a nanometer scale to a micrometer scale. In addition, light emitting elements of different types, sizes, and/or shapes may be used as the light source of the pixel PXL. For example, in one or more embodiments, the light source of each pixel PXL may be formed using a light emitting element having a core-shell structure.

Furthermore, the pixel PXL may have a structure according to at least one of embodiments that will be described below. For example, each pixel PXL may have a structure to which any one of the following embodiments is applied, or may have a structure to which at least two embodiments are applied in combination.

The pixel PXL may be an active pixel, but is not limited thereto. For example, the pixel PXL may be a passive pixel.

Figure 4:
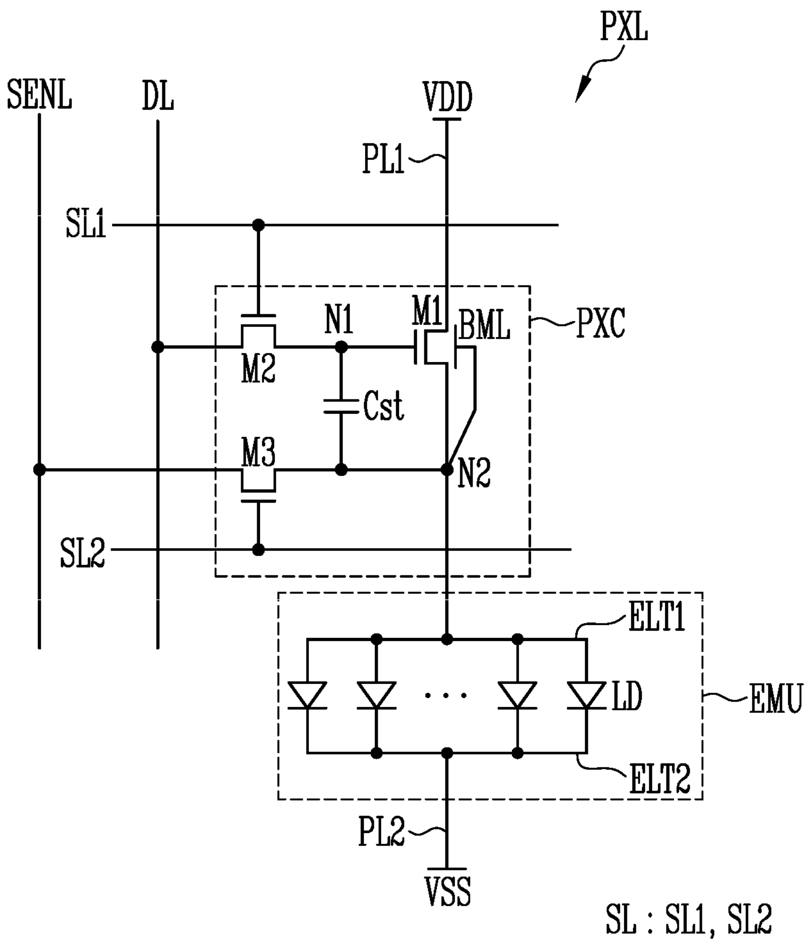
FIG. 4 is a circuit diagram illustrating a pixel in accordance with one or more embodiments of the present disclosure.

FIG. 4 is a circuit diagram illustrating a pixel PXL in accordance with one or more embodiments of the present disclosure. Each pixel PXL illustrated in FIG. 4 may be any one of the pixels PXL arranged in the display area DA of FIG. 3. Also, the pixels PXL of the display area DA may be configured to be substantially identical or similar to each other.

Referring to FIG. 4, the pixel PXL may be connected to at least one scan line SL, a data line DL, a first power line PL1, and a second power line PL2. Also, the pixel PXL may be further selectively connected to at least one different power line and/or a signal line.

The pixel PXL may include a light emitting unit EMU (also referred to as "light emitting part" or "light emitting component") for generating light having luminance corresponding to a data signal. Furthermore, the pixel PXL may further selectively include a pixel circuit PXC configured to drive the light emitting unit EMU.

The pixel circuit PXC may be connected to the at least one scan line SL and the data line DL, and may be connected between the first power line PL1 and the light emitting unit EMU. For example, the pixel circuit PXC may be connected to a first scan line SL1 to which a first scan signal is supplied, a data line DL to which a data signal is supplied, a first power line PL1 to which a first power voltage is supplied from a first power source VDD, and a first electrode ELT1 of the light emitting unit EMU. The pixel circuit PXC may be further selectively connected to a second scan line SL2 to which a second scan signal is supplied, and a reference power source (or initialization power source) or a sensing line SENL connected to a sensing circuit in response to a display period or a sensing period.

The pixel circuit PXC may include at least one transistor and capacitor. For example, the pixel circuit PXC may include a first transistor M1, a second transistor M2, a third transistor M3, and a capacitor Cst.

The first transistor M1 may be connected between the first power line PL1 and a second node N2. The second node N2 may be a node to which the pixel circuit PXC and the light emitting unit EMU are connected. For example, the second node N2 may be a node in which a first electrode (e.g., a source electrode) of the first transistor M1 and a first electrode ELT1 (e.g., an anode electrode) of the light emitting unit EMU are connected. A gate electrode of the first transistor M1 may be connected to a first node N1. The first transistor M1 may control a driving current supplied to the light emitting unit EMU in response to the voltage of the first node N1. In other words, the first transistor M1 may be a drive transistor of the pixel PXL.

In one or more embodiments, the first transistor M1 may selectively include a bottom metal layer BML (or back gate electrode). The gate electrode and the bottom metal layer BML of the first transistor M1 may overlap each other with at least one insulating layer interposed therebetween. In one or more embodiments, the bottom metal layer BML may be connected to one electrode of the first transistor M1, e.g. the source electrode.

In one or more embodiments where the first transistor M1 includes the bottom metal layer BML, it is possible to apply a back-biasing technique (or sync technique) in which a back-biasing voltage is applied to the bottom metal layer BML of the first transistor M1 to move the threshold voltage of the first transistor M1 in a negative or positive direction. Further, in case that the bottom metal layer BML is disposed under the semiconductor pattern forming a channel of the first transistor M1, the operation characteristics of the first transistor M1 may be stabilized by blocking the light incident on the semiconductor pattern.

The second transistor M2 may be connected between the data line DL and the first node N1. Further, a gate electrode of the second transistor M2 may be connected to the first scan line SL1. When a first scan signal of a gate-on voltage (e.g., a high level voltage) is supplied from the first scan line SL1, the second transistor M2 is turned on to connect the first node N1 to the data line DL.

For each frame period, the data signal of the corresponding frame is supplied to the data line DL. The data signal is transmitted through the second transistor M2, which is turned on during a period when the first scan signal of the gate-on voltage is supplied, to the first node N1. In other words, the second transistor M2 may be a switching transistor configured to transmit each data signal into the pixel PXL.

The capacitor Cst may include a first electrode connected to the first node N1, and a second electrode connected to the second node N2. The capacitor Cst charges a voltage corresponding to the data signal supplied to the first node N1 during each frame period.

The third transistor M3 may be connected between the second node N2 and the sensing line SENL. Further, a gate electrode of the third transistor M3 may be connected to the second scan line SL2. The third transistor M3 may be turned on when the second scan signal of the gate-on voltage (e.g. high level voltage) is supplied from the second scan line SL2, thus transmitting a reference voltage (or initialization voltage), supplied to the sensing line SENL, to the second node N2, or transmitting the voltage of the second node N2 to the sensing line SENL. The voltage of the second node N2 transmitted to the sensing circuit through the sensing line SENL may be provided to an external circuit (e.g., a timing controller), and then may be used to compensate for characteristic deviation of the pixels PXL.

Although FIG. 4 illustrates that all of the transistors included in the pixel circuit PXC are N-type transistors, the present disclosure is not limited thereto. For example, at least one of the first, second, and third transistors M1, M2, and M3 may be changed to a P-type transistor. Furthermore, the structure and driving method of the pixel PXL may be changed in various ways according to one or more embodiments.

The light emitting unit EMU may include a first electrode ELT1, a second electrode ELT2, and at least one light emitting element LD, which are connected between the first power line PL1 and the second power line PL2. For example, the light emitting unit EMU may include the first electrode ELT1 connected through the first transistor M1 to the first power line PL1, the second electrode ELT2 connected to the second power line PL2, and at least one light emitting element LD connected between the first electrode ELT1 and the second electrode ELT2. In one or more embodiments, the light emitting unit EMU may include a plurality of light emitting elements LD that are connected in parallel between the first electrode ELT1 and the second electrode ELT2.

A first power voltage of the first power source VDD supplied to the first power line PL1 and a second power voltage of a second power source VSS supplied to the second power line PL2 may have different potentials. For example, the first power source VDD may be a high-potential power source, and the second power source VSS may be a low-potential power source. A potential difference between the first power VDD and the second power VSS may be set to be equal to or greater than the threshold voltage of the light emitting elements LD.

Each light emitting element LD may be connected in a forward direction between the first power source VDD and the second power source VSS to form a valid light source. The valid light sources may be collected to form the light emitting unit EMU of the pixel PXL.

The light emitting elements LD may emit light having a luminance corresponding to driving current supplied through the pixel circuit PXC. During each frame period, the pixel circuit PXC may supply driving current corresponding to the data signal to the light emitting unit EMU. The driving current supplied to the light emitting unit EMU may separately flow into the light emitting elements LD. Hence, each of the light emitting elements LD may emit light having a luminance corresponding to current applied thereto, so the light emitting unit EMU may emit light having a luminance corresponding to the driving current.

In one or more embodiments, the light emitting unit EMU may further include at least one invalid light source. For example, the light emitting unit EMU may further include an invalid light emitting element which is arranged in a reverse direction between the first and second electrodes ELT1 and ELT2 or is not completely connected between the first and second electrodes ELT1 and ELT2.

Although FIG. 4 illustrates an embodiment in which the pixel PXL includes the light emitting unit EMU of a parallel structure, the present disclosure is not limited thereto. For example, the pixel PXL may include the light emitting unit EMU having a series structure or a series-parallel structure. In this case, the light emitting unit EMU may include a plurality of light emitting elements LD that are connected in series or in series-parallel between the first electrode ELT1 and the second electrode ELT2. Further, the pixel PXL may include only a single light emitting element LD connected between the first electrode ELT1 and the second electrode ELT2.

Figure 5:
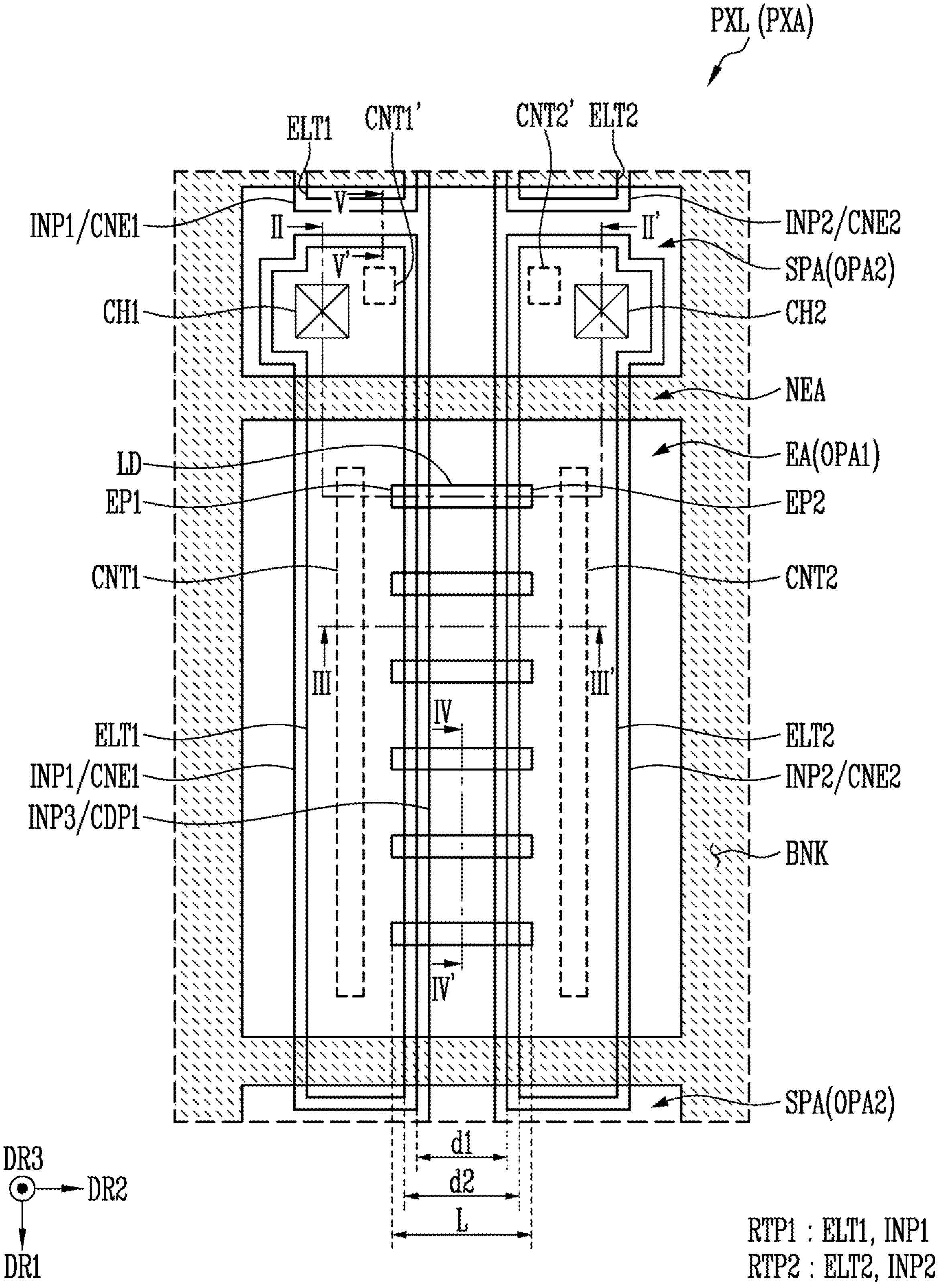
FIG. 5 is a plan view illustrating a pixel in accordance with one or more embodiments of the present disclosure.

FIG. 5 is a plan view illustrating the pixel PXL in accordance with one or more embodiments of the present disclosure. FIG. 5 illustrates the structure of the pixel PXL, focused on the light emitting unit EMU. For instance, FIG. 5 illustrate an example of the light emitting unit EMU including the first electrode ELT1, the second electrode ELT2, and the plurality of light emitting elements LD connected in parallel between the first and second electrodes ELT1 and ELT2, as in the embodiment of FIG. 4.

Further, FIG. 5 illustrates an embodiment in which each light emitting unit EMU is connected through the first and second contact holes CH1 and CH2 to a signal line or a power line (e.g., a predetermined signal line or power line, e.g., the first and/or second power lines PL1 and PL2) and/or a circuit element (e.g., at least one circuit element forming the pixel circuit PXC). However, the present disclosure is not limited thereto. For example, in one or more embodiments, at least one of the first and second electrodes ELT1 and ELT2 of each pixel PXL may be directly connected to a power line and/or signal line (e.g., a predetermined power line and/or signal line) without passing through the contact hole and/or an intermediate line.

Referring to FIGS. 1 to 5, the pixel PXL is provided in each pixel area PXA. The pixel area PXA may be an area including a pixel circuit area in which the circuit elements for forming a corresponding pixel PXL are disposed and an emission area EA in which the light emitting unit EMU of the pixel PXL is disposed. The pixel area PXA may further include a peripheral area of the emission area EA. For example, the pixel area PXA may further include a non-emission area NEA around (or surrounding) the emission area EA, and/or at least one separation area SPA spaced from the emission area EA with the non-emission area NEA interposed therebetween. The separation area SPA may be included in the pixel area PXA or may be included in a non-pixel area between adjacent pixel areas PXA. Hereinafter, it is assumed that the separation area SPA is included in the pixel area PXA.

A bank BNK may be provided in the non-emission area NEA, and the bank BNK may not be provided in the emission area EA and/or the separation area SPA. For example, the bank BNK may include a first opening OPA1 corresponding to each emission area EA and a second opening OPA2 corresponding to each separation area SPA.

The emission area EA may be an area in which at least one light emitting element LD forming the light emitting unit EMU of each pixel PXL is arranged. Hereinafter, a configuration of each embodiment will be described on the assumption that a plurality of light emitting elements LD is provided in each emission area EA. Further, electrodes (e.g., predetermined electrodes) connected to the light emitting elements LD (e.g., the first and second electrodes ELT1 and ELT2 and the first and second contact electrodes CNE1 and CNE2) or portions of the electrodes may be disposed in the emission area EA.

For example, the pixel PXL may include the first electrode ELT1 and the second electrode ELT2 disposed in each pixel area PXA to be spaced from each other, and the light emitting elements LD disposed and/or arranged between the first and second electrodes ELT1 and ELT2. Here, the expression "the light emitting elements LD are disposed and/or arranged between the first and second electrodes ELT1 and ELT2" may mean that at least an area of each of the light emitting elements LD is located in an area between the first and second electrodes ELT1 and ELT2 in a plan view.

Further, the pixel PXL may include a first insulating pattern INP1 and a first contact electrode CNE1 that are successively disposed on the first electrode ELT1, and a second insulating pattern INP2 and a second contact electrode CNE2 that are successively disposed on the second electrode ELT2. In one or more embodiments, the first insulating pattern INP1 and the first contact electrode CNE1 may be formed in individual patterns disposed over the first electrode ELT1, while each having a shape and a size corresponding to the first electrode ELT1. Similarly, the second insulating pattern INP2 and the second contact electrode CNE2 may be formed in individual patterns disposed over the second electrode ELT2, while each having a shape and a size corresponding to the second electrode ELT2. In this case, the light emitting elements LD may be disposed and/or arranged between the first and second patterns INP1 and INP2 and between the first and second contact electrodes CNE1 and CNE2.

For instance, the first insulating pattern INP1 and the first contact electrode CNE1 may completely overlap the first electrode ELT1, and may protrude to the outside of the first electrode ELT1 while having a width and a length greater than those of the first electrode ELT1 in the first and second directions DR1 and DR2. Similarly, the second insulating pattern INP2 and the second contact electrode CNE2 may completely overlap the second electrode ELT2, and may protrude to the outside of the second electrode ELT2 while having a width and a length greater than those of the second electrode ELT2 in the first and second directions DR1 and DR2.

In one or more embodiments, the first insulating pattern INP1 and the first contact electrode CNE1 may have substantially the same or similar shape and size in a plan view, and may completely overlap each other. Similarly, the second insulating pattern INP2 and the second contact electrode CNE2 may have substantially the same or similar shape and size in a plan view, and may completely overlap each other.

The pixel PXL may selectively further include a third insulating pattern INP3 disposed on a portion of the light emitting elements LD to expose first and second ends EP1 and EP2 of the light emitting elements LD, and/or a first conductive pattern CDP1 disposed on the third insulating pattern INP3. In addition, the pixel PXL may selectively further include the first and second contact electrodes CNE1 and CNE2 and/or at least one conductive pattern (e.g. second conductive pattern CDP2 of FIG. 6) that are formed around the first conductive pattern CDP1 to be separated from the first and second contact electrodes CNE1 and CNE2 and the first conductive pattern CDP1.

The first electrode ELT1 and the second electrode ELT2 each may extend in the first direction DR1, and may be spaced from each other in the second direction DR2. The first direction DR1 and the second direction DR2 may be directions intersecting with (e.g. orthogonal to) each other. In one or more embodiments, the first direction DR1 may be a vertical direction (or a column direction) of the display area DA, and the second direction DR2 may be a horizontal direction (or a row direction) of the display area DA. The present disclosure is not limited thereto. However, the shape, size, position, and/or mutual arrangement structure of the first electrode ELT1 and the second electrode ELT2 may be variously changed according to embodiments. Further, each of the first electrode ELT1 and the second electrode ELT2 may or may not include a bent portion, and may have a uniform width or a different width for each portion in the pixel area PXA.

Although FIG. 5 illustrates an embodiment in which the light emitting unit EMU include one first electrode ELT1 and one second electrode ELT2, the present disclosure is not limited thereto. In other words, the number of the first and/or second electrodes ELT1 and ELT2 disposed in each pixel PXL may be changed. In case that the plurality of first electrodes ELT1 is disposed in one pixel PXL, the first electrodes ELT1 may be integrally or non-integrally connected to each other. Similarly, in case that the plurality of second electrodes ELT2 is disposed in one pixel PXL, the second electrodes ELT2 may be integrally or non-integrally connected to each other.

The first electrode ELT1 may be electrically connected to at least one circuit element, power line, and/or signal line through the first contact hole CH1. Alternatively, the first electrode ELT1 may be directly connected to a power line or signal line (e.g., a predetermined power line or signal line).

In one or more embodiments, the first electrode ELT1 may be electrically connected through the first contact hole CH1 to at least one circuit element (e.g. the first transistor M1 of FIG. 4) disposed thereunder, and may be electrically connected through the circuit element to a first line. The first line may be the first power line PL1 for supplying the first power voltage from the first power source VDD.

The second electrode ELT2 may be electrically connected to at least one circuit element, power line, and/or signal line through the second contact hole CH2. Alternatively, the second electrode ELT2 may be directly connected to a power line or signal line (e.g., a predetermined power line or signal line).

In one or more embodiments, the second electrode ELT2 may be electrically connected through the second contact hole CH2 to a second line disposed thereunder The second line may be the second power line PL2 for supplying the second power voltage from the second power source VSS.

Each of the first and second contact holes CH1 and CH2 may or may not overlap the bank BNK. For instance, the first and second contact holes CH1 and CH2 may be disposed in the separation area SPA or the emission area EA, and may not overlap the bank BNK. Alternatively, at least one of the first and second contact holes CH1 and CH2 may be disposed in the non-emission area NEA between the emission area EA and the separation area SPA, and may overlap the bank BNK. In other words, the position of each of the first and second contact holes CH1 and CH2 may be variously changed according to embodiments.

Each of the first and second electrodes ELT1 and ELT2 may have a single-layer structure or a multi-layer structure. For instance, each of the first and second electrodes ELT1 and ELT2 may selectively further include at least one reflective electrode layer including a reflective conductive material, at least one transparent electrode layer and/or a conductive capping layer. The reflective conductive material may be metal having a high reflectivity in a visible-light wavelength band, for example, one of metal materials such as aluminum (Al), gold (Au), and silver (Ag), but is not limited thereto.

Each of the first electrode ELT1 and the second electrode ELT2 may have a separated pattern for each pixel PXL, or may have a pattern which is connected in common in the plurality of pixels PXL. For instance, the first electrode ELT1 may have an independent pattern for each pixel PXL, and may be separated from the first electrode ELT1 of the adjacent pixel PXL. The second electrode ELT2 may have an independent pattern for each pixel PXL, and may be integrally connected to the second electrode ELT2 of the adjacent pixel PXL.

The first insulating pattern INP1 and the second insulating pattern INP2 may have shapes and sizes corresponding to those of the first electrode ELT1 and the second electrode ELT2, respectively. Further, each of the first insulating pattern INP1 and the second insulating pattern INP2 may have a separated pattern for each pixel PXL, or may have a pattern which is connected in common in the plurality of pixels PXL. For instance, the first insulating pattern INP1 may have an independent pattern for each pixel PXL, and may be separated from the first insulating pattern INP1 of the adjacent pixel PXL. The second insulating pattern INP2 may have an independent pattern for each pixel PXL, and may be integrally connected to the second insulating pattern INP2 of the adjacent pixel PXL.

Before the process of forming the pixel PXL, for example, the alignment of the light emitting elements LD is completed, the first electrodes ELT1 of the pixels PXL may be connected to each other, and the second electrode ELT2 of the pixels PXL may be connected to each other. For example, before the alignment of the light emitting elements LD is completed, the first electrodes ELT1 of the pixels PXL may be integrally or non-integrally connected to each other to form a first alignment line, and the second electrodes ELT2 of the pixels PXL may be integrally or non-integrally connected to each other to form a second alignment line In this case, the first insulating pattern INP1 and the second insulating pattern INP2 may overlap the first alignment line and the second alignment line, respectively, while having shapes and sizes corresponding to those of the first alignment line and the second alignment line, respectively.

The first alignment line and the second alignment line may receive the first alignment signal and the second alignment signal, respectively, in the step of aligning the light emitting elements LD. The first and second alignment signals may have different waveforms, potentials, and/or phases. Thus, an electric field may be formed between the first and second alignment lines to align the light emitting elements LD between the first and second alignment lines. After the alignment of the light emitting elements LD is completed, the first alignment line and the first insulating pattern INP1 provided thereabove may be cut off in each separation area SPA to separate the first electrodes ELT1 and the first insulating patterns INP1 of the pixels PXL from each other. For instance, by disconnecting the first alignment line and the first insulating pattern INP1 over the first alignment line in an outer area of each pixel PXL or each separation area SPA located between adjacent pixels PXL, the first electrodes ELT1 of adjacent pixels PXL in the first direction DR1 may be separated from each other; and the first insulating patterns INP1 of adjacent pixels PXL in the first direction DR1 may be separated from each other. Accordingly, the pixels PXL may be individually driven.

For instance, in the display area DA of FIG. 3, a plurality of pixels PXL having the same structure as the embodiment of FIG. 5 may be repeatedly arranged along the first direction DR1 and the second direction DR2. Therefore, at least one separation area SPA may be disposed between the emission areas EA of the adjacent pixels PXL in the first direction DR1. Further, in each separation area SPA, the first electrodes ELT1 of the adjacent pixels PXL in the first direction DR1 may be separated from each other. Similarly, in each separation area SPA, the first insulating patterns INP1 of the adjacent pixels PXL in the first direction DR1 may be separated from each other. In one or more embodiments, the first electrodes ELT1 and the first insulating patterns INP1 of the pixels PXL may be separated, and concurrently (or simultaneously) the second electrodes ELT2 and the second insulating patterns INP2 of the pixels PXL may be separated. For instance, after the alignment of the light emitting elements LD is completed, the first alignment line, the second alignment line, the first insulating pattern INP1, and the second insulating pattern INP2 may be cut off in each separation area SPA. Accordingly, the first electrodes ELT1, the first insulating patterns INP1, the second electrodes ELT2, and the second insulating patterns INP2 of the pixels PXL may be formed as individual patterns.

For instance, the first electrodes ELT1 and the first insulating patterns INP1 of the adjacent pixels PXL in the first direction DR1 may be separated from each other in each separation area SPA positioned between the emission areas EA of the adjacent pixels PXL in the first direction DR1. Further, the first insulating pattern INP1 of each pixel PXL may protrude to the outside of the first electrode ELT1 in the first direction DR1 (see, for example, FIG. 6). Similarly, the second electrodes ELT2 and the second insulating patterns INP2 of the adjacent pixels PXL in the first direction DR1 may be separated from each other in each separation area SPA positioned between the emission areas EA of the adjacent pixels PXL in the first direction DR1. Further, the second insulating pattern INP2 of each pixel PXL may protrude to the outside of the second electrode ELT2 in the first direction DR1 (see, for example, FIG. 6).

The first insulating pattern INP1 may overlap (e.g., completely overlap) each of the first electrodes ELT1 except for at the first contact portion CNT1, and may protrude to the outside of the first electrode ELT1 in an entire peripheral area, e.g., in an entire perimeter area of the first electrode ELT1. Similarly, the second insulating pattern INP2 may overlap (e.g., completely overlap) each of the second electrodes ELT2 except for at the second contact portion CNT2, and may protrude to the outside of the second electrode ELT2 in an entire peripheral area, e.g., in an entire perimeter area of the second electrode ELT2. For example, the first and second insulating patterns INP1 and INP2 may be formed in individual patterns (each separate pattern) corresponding to each pixel PXL, and each have an area larger than that of the first electrode ELT1 and the second electrode ELT2 while covering (e.g., completely covering other than at the first and second contact portions CNT1 and CNT2) the upper surfaces of the first electrode ELT1 and the second electrode ELT2. Accordingly, the first electrode ELT1 and the first insulating pattern INP1 may form a first reverse tapered pattern RTP1, while the second electrode ELT2 and the second insulating pattern INP2 may form a second reverse tapered pattern RTP2.

In one or more embodiments, the first insulating pattern INP1 and the second insulating pattern INP2 may be spaced from each other by a first distance d1 shorter than the length L of each of the light emitting elements LD. In this case, at least one of the first insulating pattern INP1 and the second insulating pattern INP2 may overlap the light emitting elements LD in a third direction DR3, which is a thickness direction of the base layer BSL. For instance, the first ends EP1 of the light emitting elements LD may be positioned on the first insulating pattern INP1, and the second ends EP2 of the light emitting elements LD may be positioned on the second insulating pattern INP2.

The first electrode ELT1 and the second electrode ELT2 may be positioned inside the first insulating pattern INP1 and the second insulating pattern INP2, respectively, in a plan view, and may be spaced from each other by a second distance d2 that is longer than the first distance d1. Each of the first electrode ELT1 and the second electrode ELT2 may or may not overlap at least one light emitting element LD.

The light emitting elements LD may be aligned between the first electrode ELT1 and the second electrode ELT2 and between the first insulating pattern INP1 and the second insulating pattern INP2 corresponding thereto. Further, the light emitting elements LD may be arranged along the first direction DR1 in an area between the first electrode ELT1 and the second electrode ELT2, and may be aligned and/or connected in parallel to each other. In one or more embodiments, each light emitting element LD is aligned in the second direction DR2 (e.g., the horizontal direction) between the first electrode ELT1 and the second electrode ELT2 to be electrically connected to the first and second electrodes ELT1 and ELT2. For example, the light emitting elements LD may be connected to the first electrode ELT1 by the first contact electrode CNE1, and may be connected to the second electrode ELT2 by the second contact electrode CNE2.

Although FIG. 4 illustrates that the light emitting elements LD are uniformly aligned in the second direction DR2, the present disclosure is not limited thereto. For example, the pixel PXL may include the light emitting elements LD arranged along a diagonal direction inclined in the first and second directions DR1 and DR2 in an area between the first and second electrodes ELT1 and ELT2.

In one or more embodiments, each of the light emitting elements LD may be an inorganic light emitting element (e.g. inorganic light emitting diode) which is made of material having an inorganic crystal structure and has a subminiature size (e.g., ranging from a nanometer scale to a micrometer scale). For example, each light emitting element LD may be a subminiature inorganic light emitting element (e.g. the light emitting element LD according to the embodiment of FIGS. 1 and 2) manufactured by growing a nitride-based semiconductor and etching it in a rod shape. However, the type, size, shape, structure, and/or number of the light emitting element(s) LD forming each light emitting unit EMU may be changed.

Each light emitting element LD may have the first end EP1 and the second end EP2. The first end EP1 may be disposed adjacent to the first electrode ELT1, and the second end EP2 may be disposed adjacent to the second electrode ELT2. For instance, the first ends EP1 of the light emitting elements LD may be positioned on the first insulating pattern INP1, and the second ends EP2 of the light emitting elements LD may be positioned on the second insulating pattern INP2.

In one or more embodiments, the first ends EP1 of the light emitting elements LD are positioned on the first insulating pattern INP1 to be electrically connected through the first contact electrode CNE1 and a first contact portion CNT1 and/or CNT1' to the first electrode ELT1. Further, the second ends EP2 of the light emitting elements LD are positioned on the second insulating pattern INP2 to be electrically connected through the second contact electrode CNE2 and a second contact portion CNT2 and/or CNT2' to the second electrode ELT2.

The first contact portion CNT1 and/or CNT1' may be an area (or portion) in which the first insulating pattern INP1 is partially opened to connect the first electrode ELT1 and the first contact electrode CNE1. For example, the first contact portion CNT1 and/or CNT1' may be an opening or a contact hole formed in the first insulating pattern INP1. In one or more embodiments, the first contact portion CNT1 and/or CNT1' may be formed in at least one of the emission area EA and the separation area SPA.

Similarly, the second contact portion CNT2 and/or CNT2' may be an area (or portion) in which the second insulating pattern INP2 is partially opened to connect the second electrode ELT2 and the second contact electrode CNE2. For example, the second contact portion CNT2 and/or CNT2' may be an opening or a contact hole formed in the second insulating pattern INP2. In one or more embodiments, the second contact portion CNT2 and/or CNT2' may be formed in at least one of the emission area EA and the separation area SPA.

In one or more embodiments, the first ends EP1 of the light emitting elements LD may be electrically connected to only the first contact electrode CNE1, and may not be connected to the first electrode ELT1. Further, the second ends EP2 of the light emitting elements LD may be electrically connected to only the second contact electrode CNE2, and may not be connected to the second electrode ELT2. In this case, the first contact portion CNT1 and/or CNT1' and the second contact portion CNT2 and/or CNT2' may not be formed in the first insulation pattern INP1 and the second insulation pattern INP2, respectively, and the first contact electrode CNE1 and the second contact electrode CNE2 may form an anode electrode and a cathode electrode of the light emitting unit EMU. Further, the first contact electrode CNE1 may be connected to the pixel circuit PXC and/or the first power line PL1 of the corresponding pixel PXL, and the second contact electrode CNE2 may be connected to the second power line PL2, thus driving the light emitting elements LD.

The light emitting elements LD may be prepared in a form dispersed in a solution, and then be supplied to each emission area EMA through an inkjet method, a slit coating method or the like. If the first and second alignment signals are applied to the first and second electrodes ELT1 and ELT2 (or the first and second alignment lines) of the pixels PXL concurrently (or simultaneously) with or after the supply of the light emitting elements LD, an electric field is formed between the first and second electrodes ELT1 and ELT2 to align the light emitting elements LD. After the light emitting elements LD are aligned, a solvent may be removed through a drying process or the like.

The first contact electrode CNE1 and the second contact electrode CNE2 may be respectively formed on the first and second ends EP1 and EP2 of the light emitting elements LD.

The first contact electrode CNE1 may be disposed on the first ends EP1 and the first insulating pattern INP1 of the light emitting elements LD, and may be connected to the first ends EP1 of the light emitting elements LD. For instance, the first contact electrode CNE1 may be directly formed on the first ends EP1 to contact the first ends EP1 of the light emitting elements LD and thereby may be electrically connected to the first ends EP1. Furthermore, the first contact electrode CNE1 may be connected to the first electrode ELT1. For example, the first contact electrode CNE1 may be electrically connected to the first electrode ELT1 through the first contact portion CNT1 and/or CNT1' formed in the first insulating pattern INP1.

In one or more embodiments, the first contact electrode CNE1 may have a shape and/or a size corresponding to that of the first insulating pattern INP1, and may completely overlap the first insulating pattern INP1. Further, the first contact electrode CNE1 may be formed in an individual pattern corresponding to the first insulating pattern INP1.

For example, the first contact electrode CNE1 may have a shape and/or a size that is substantially equal to that of the first insulating pattern INP1, in a plan view, and may completely overlap the first insulating pattern INP1. Further, the first contact electrodes CNE1 of the adjacent pixels PXL in the first direction DR1 may be separated from each other in each separation area SPA positioned between the emission areas EA of the adjacent pixels PXL in the first direction DR1. The first contact electrode CNE1 of each pixel PXL may protrude to the outside of the first electrode ELT1 in the first direction DR1, as in each first insulating pattern INP1.

The second contact electrode CNE2 may be disposed on the second ends EP2 and the second insulating pattern INP2 of the light emitting elements LD, and may be connected to the second ends EP2 of the light emitting elements LD. For instance, the second contact electrode CNE2 may be directly formed on the second ends EP2 to contact the second ends EP2 of the light emitting elements LD and thereby may be electrically connected to the second ends EP2. Furthermore, the second contact electrode CNE2 may be connected to the second electrode ELT2. For example, the second contact electrode CNE2 may be electrically connected to the second electrode ELT2 through the second contact portion CNT2 and/or CNT2' formed in the second insulating pattern INP2.

In one or more embodiments, the second contact electrode CNE2 may have a shape and/or a size corresponding to that of the second insulating pattern INP2, and may completely overlap the second insulating pattern INP2. Further, the second contact electrode CNE2 may be formed in an individual pattern corresponding to the second insulating pattern INP2.

For example, the second contact electrode CNE2 may have a shape and/or a size (area) that is substantially equal to that of the second insulating pattern INP2, in a plan view, and may completely overlap the second insulating pattern INP2. Further, the second contact electrodes CNE2 of the adjacent pixels PXL in the first direction DR1 may be separated from each other in each separation area SPA positioned between the emission areas EA of the adjacent pixels PXL. The second contact electrode CNE2 of each pixel PXL may protrude to the outside of the second electrode ELT2 in the first direction DR1, as in each second insulating pattern INP2.

The third insulating pattern INP3 may be disposed on a portion of each of the light emitting elements LD excluding the first and second ends EP1 and EP2 of the light emitting elements LD. For instance, the third insulating pattern INP3 may extend along the first direction DR1 in each pixel area PXA to overlap a portion including the central area of each of the light emitting elements LD, and may expose the first and second ends EP1 and EP2 of the light emitting elements LD. In one or more embodiments, the third insulating pattern INP3 may extend in the first direction DR1 in the display area DA without being cut between adjacent pixels PXL in the first direction DR1. Alternatively, the third insulating pattern INP3 may be formed as an individual pattern in each pixel area PXA, or may be formed as an integrally connected pattern in the plurality of pixel areas PXA.

The first conductive pattern CDP1 may be disposed on the third insulating pattern INP3, and may be separated from the first and second contact electrodes CNE1 and CNE2. In one or more embodiments, the first conductive pattern CDP1 may be formed concurrently (or simultaneously) with the first and second contact electrodes CNE1 and CNE2. In this case, the first conductive pattern CDP1 may be formed of the same conductive material as the first and second contact electrodes CNE1 and CNE2. For instance, the first conductive pattern CDP1 and the first and second contact electrodes CNE1 and CNE2 may include the same transparent conductive material.

In one or more embodiments, the first conductive pattern CDP1 may have a shape and/or a size corresponding to that of the third insulating pattern INP3, and may completely overlap the third insulating pattern INP3. For example, the first conductive pattern CDP1 may have a shape and/or a size that is substantially equal to that of the third insulating pattern INP3, in a plan view, and may completely overlap the third insulating pattern INP3.

The third insulating pattern INP3 and the first conductive pattern CDP1 may be positioned between the first and second insulating patterns INP1 and INP2 (and/or the first and second contact electrodes CNE1 and CNE2) in a plan view. Further, the third insulating pattern INP3 and the first conductive pattern CDP1 may overlap or contact the first insulating pattern INP1, the first contact electrode CNE1, the second insulating pattern INP2, and/or the second contact electrode CNE2, in a plan view. Alternatively, the third insulating pattern INP3 and the first conductive pattern CDP1 may be spaced from the first insulating pattern INP1, the first contact electrode CNE1, the second insulating pattern INP2, and/or the second contact electrode CNE2, in a plan view. For instance, although FIG. 5 illustrates an embodiment in which the third insulating pattern INP3 and the first conductive pattern CDP1 are disposed between the first and second insulating patterns INP1 and INP2 not to overlap or contact the first and second insulating patterns INP1 and INP2, the present disclosure is not limited thereto. For example, the third insulating pattern INP3 and the first conductive pattern CDP1 may partially overlap or contact the first insulating pattern INP1, the first contact electrode CNE1, the second insulating pattern INP2, and/or the second contact electrode CNE2, in a plan view.

However, the third insulating pattern INP3 and the first conductive pattern CDP1 may be substantially separated from the first insulating pattern INP1, the first contact electrode CNE1, the second insulating pattern INP2, and/or the second contact electrode CNE2. For example, in a sectional view (e.g., FIG. 6), the third insulating pattern INP3 and the first conductive pattern CDP1 may be separated from the first insulating pattern INP1, the first contact electrode CNE1, the second insulating pattern INP2, and/or the second contact electrode CNE2. For instance, the first conductive pattern CDP1 may be separated from the first and second contact electrodes CNE1 and CNE2. Further, the first contact electrode CNE1 and the second contact electrode CNE2 may be separated from each other with the third insulating pattern INP3 and the first conductive pattern CDP1 interposed therebetween.

According to one or more embodiments, the first conductive pattern CDP1 or a portion of the first conductive pattern CDP1 may be removed during the process of forming the pixel PXL. In this case, the pixel PXL may not include the first conductive pattern CDP1 or may include the first conductive pattern CDP1 that is locally disposed on only a portion of the third insulating pattern INP3.

The bank BNK may be disposed around the emission area EMA to enclose the emission area EMA of each pixel PXL.

For instance, the bank BNK may be disposed in the outer area of each pixel area PXA and/or in an area between adjacent pixel areas PXA to enclose each emission area EA.

The bank BNK may include a plurality of first openings OPA1 corresponding to the emission areas EA of the pixels PXL. The bank BNK may further include a plurality of second openings OPA2 corresponding to the separation areas SPA. For example, the bank BNK may have the shape of a mesh including a plurality of first openings OPA1 corresponding to the emission areas EA and a plurality of second openings OPA2 corresponding to the separation areas SPA, in the entire display area DA. As the bank BNK includes the second openings OPA2, the first and second alignment lines may be easily disconnected in the separation areas SPA.

The bank BNK may partially overlap or not overlap the first and/or second electrodes ELT1 and ELT2 in the third direction DR3. For example, the first and/or second electrodes ELT1 and ELT2 may extend to the non-emission area NEA in which the bank BNK is formed or may be cut off in the emission area EA. In case that the first and/or second electrodes ELT1 and ELT2 are cut off in the emission area EA, the first and/or second insulating patterns INP1 and INP2 may also be cut off in the emission area EA. Conversely, in case that the first and/or second electrodes ELT1 and ELT2 extend to the non-emission area NEA and/or the separation area SPA, the first and/or second insulating patterns INP1 and INP2 may also extend to the non-emission area NEA and/or the separation area SPA.

The bank BNK may include at least one light shielding and/or reflective material to prevent light from leaking between adjacent pixels PXL. For example, the bank BNK may include at least one black matrix material and/or a color filter material of a desired color.

Further, the bank BNK may define each emission area EA to which the light emitting elements LD are to be supplied, in the step of supplying the light emitting elements LD to each pixel PXL. For example, as the emission areas EA of the pixels PXL are separated and partitioned by the bank BNK, a desired type and/or amount of light emitting diode ink (e.g., a solution including at least one type of light emitting elements LD) may be supplied to each emission area EA.

Figure 6:
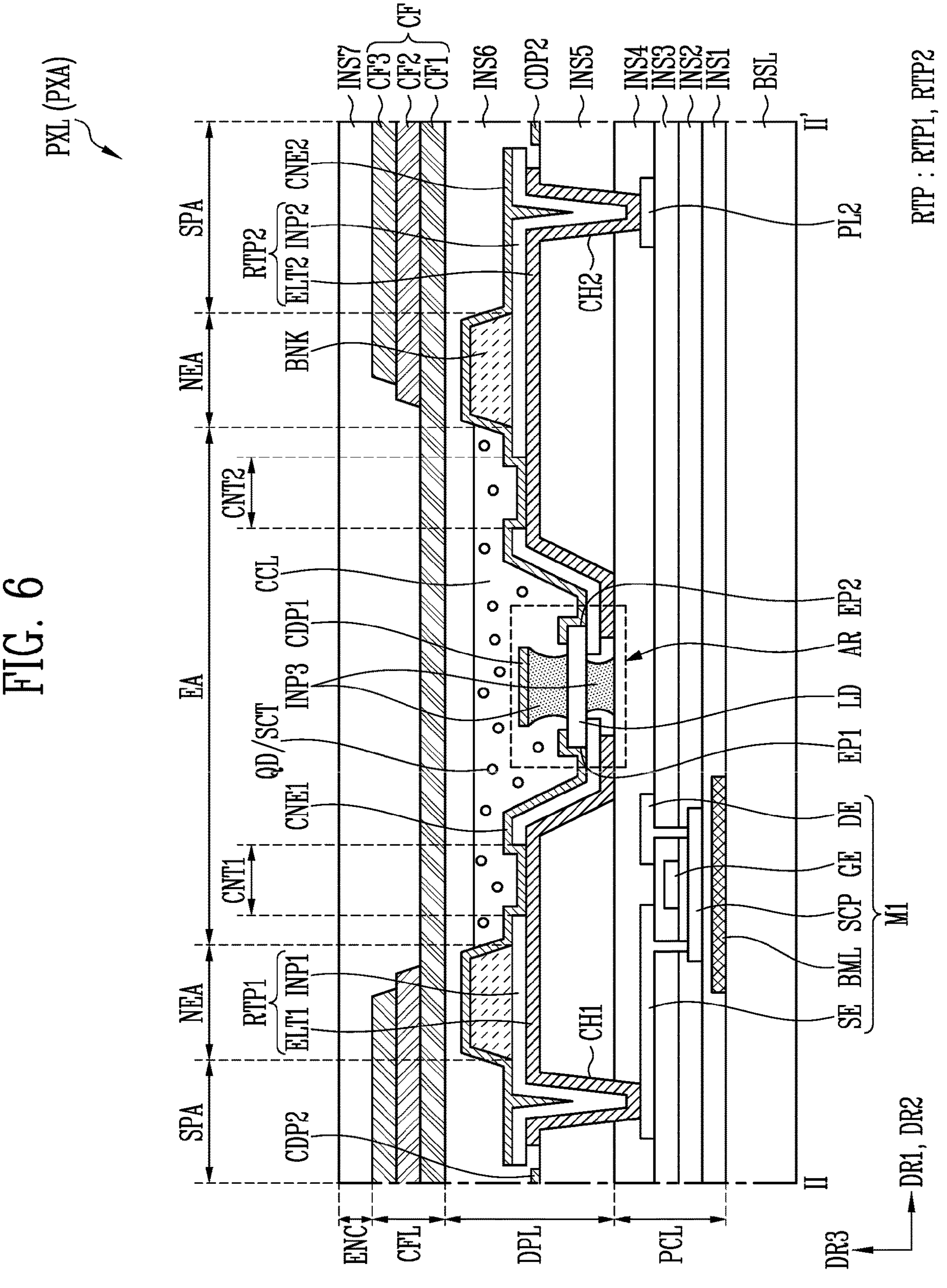
FIGS. 6 to 10 are sectional views illustrating a pixel in accordance with one or more embodiments of the present disclosure.
Figure 7:
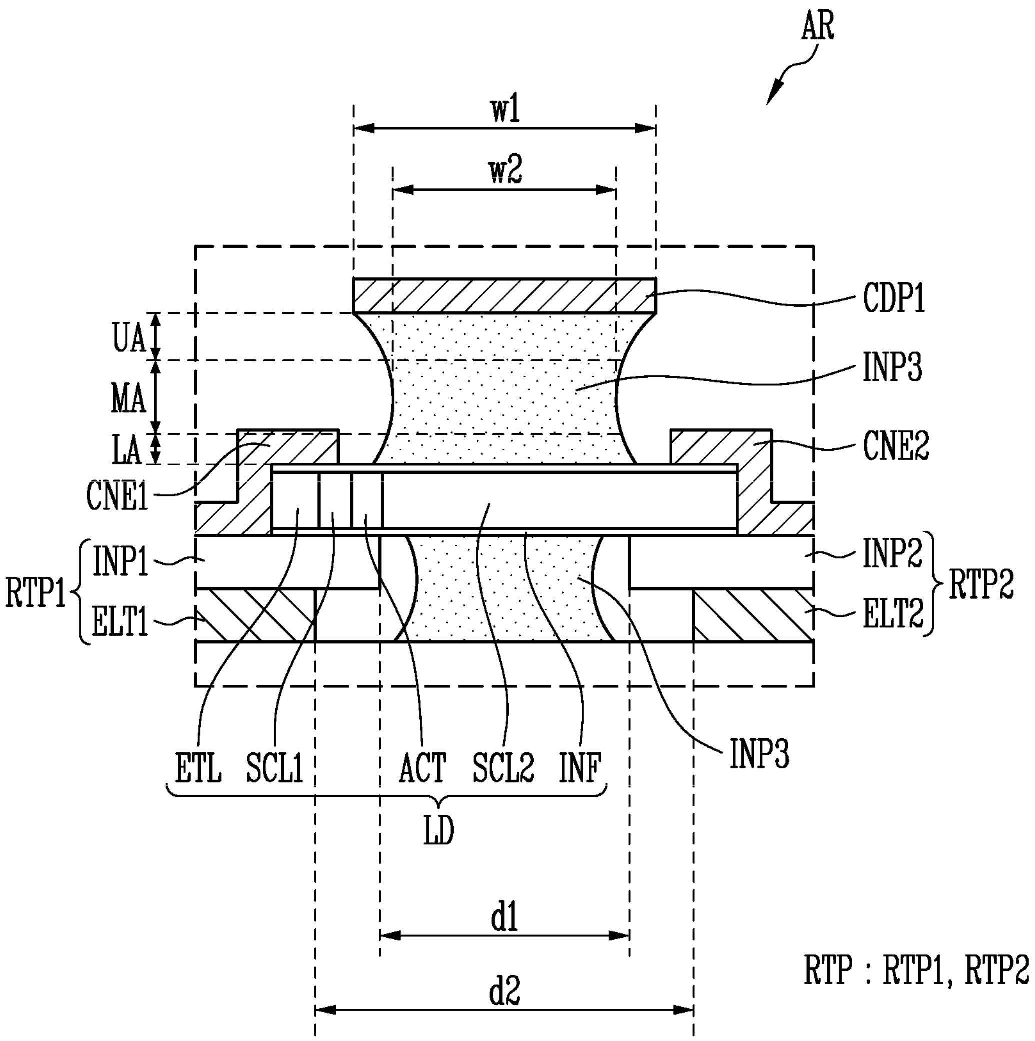
Figure 8:
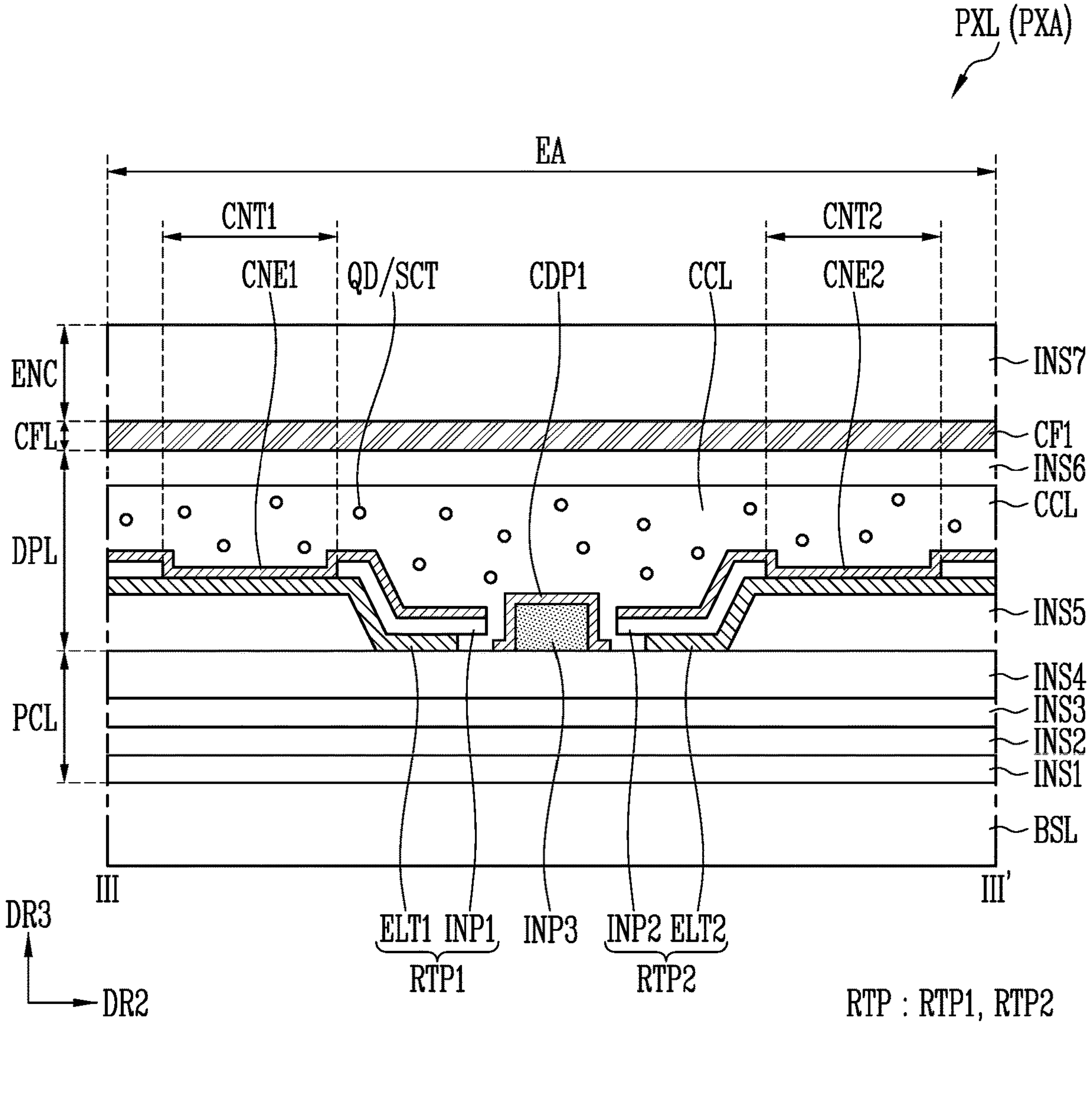
Figure 9:
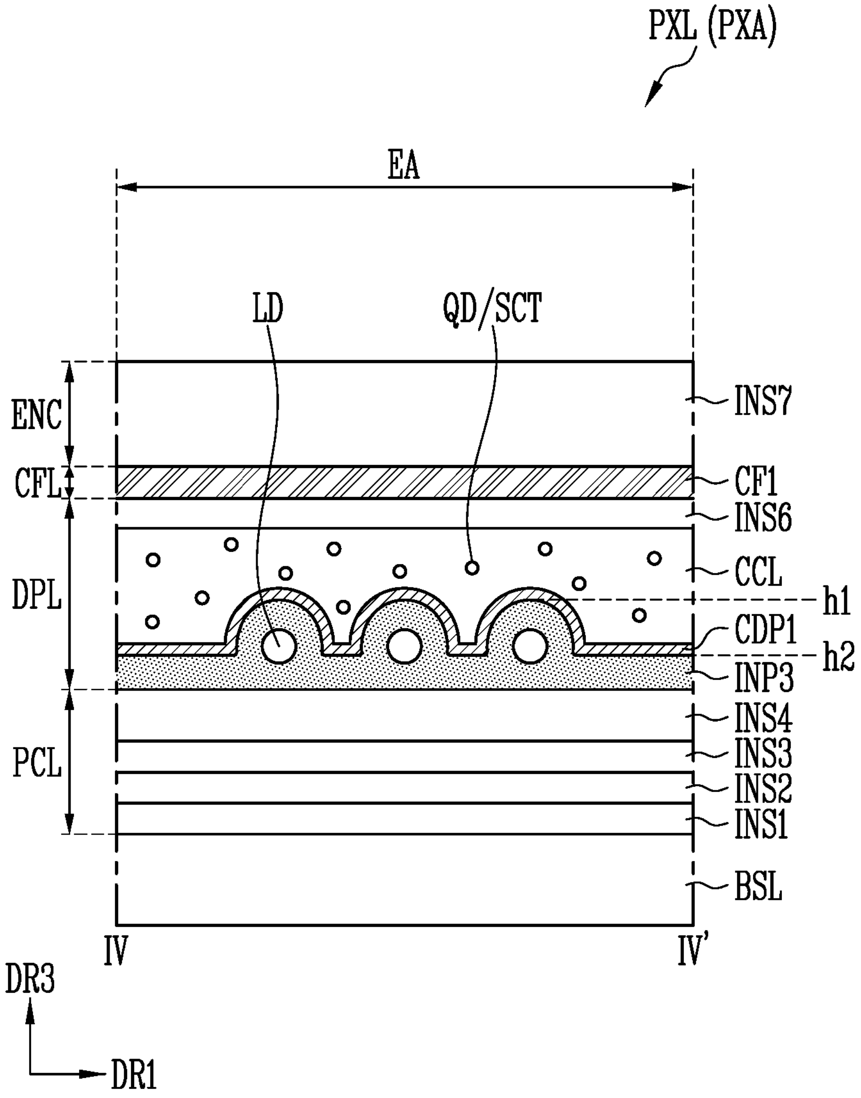
Figure 10:
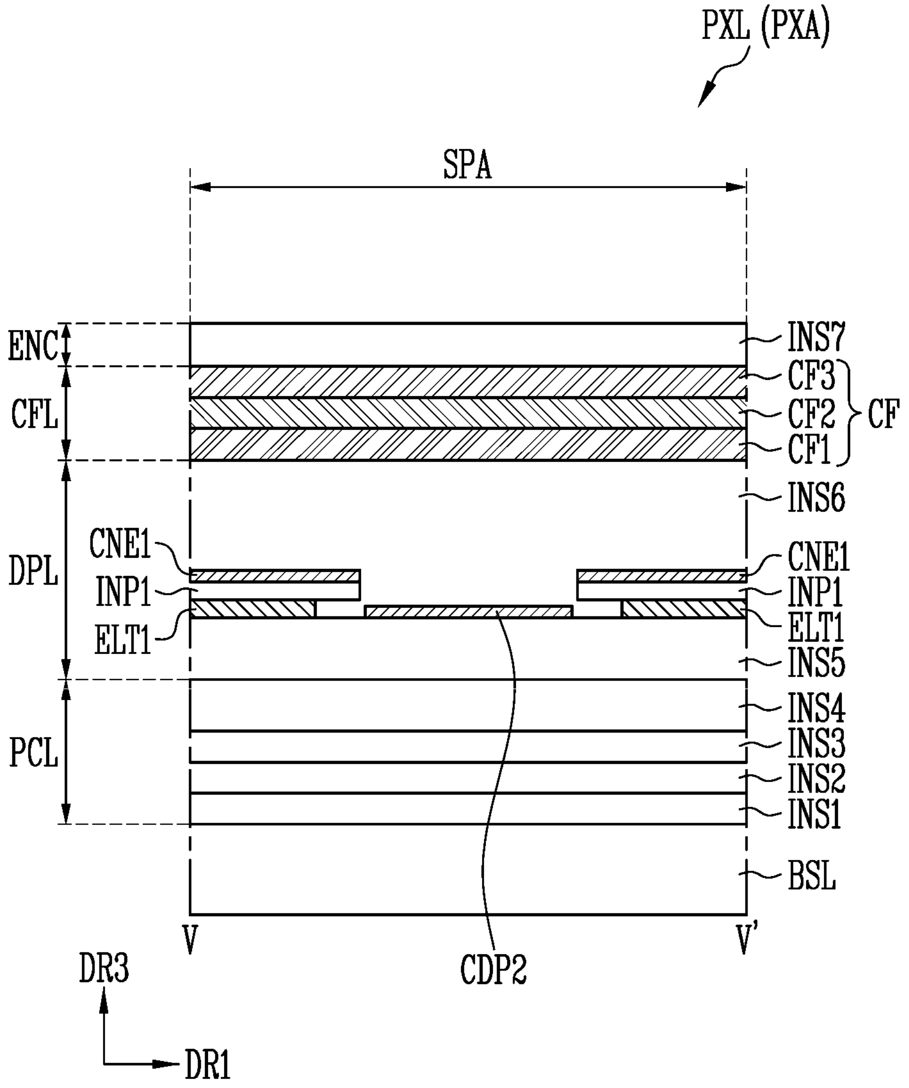

FIGS. 6 to 10 are sectional views illustrating a pixel PXL in accordance with one or more embodiments of the present disclosure. For example, FIG. 6 illustrates an embodiment of a section of the pixel PXL taken along the line II-II' of FIG. 5, and FIG. 7 illustrates an enlarged section of an area AR of FIG. 6. FIGS. 8 to 10 illustrate embodiments of sections of the pixel PXL taken along the lines III-III', IV-IV', and V-V' of FIG. 5, respectively.

FIGS. 6 to 10 show the first transistor M1 connected through the first contact hole CH1 to the first electrode ELT1 and including the bottom metal layer BML, as an example of the circuit elements that may be disposed in the circuit layer PCL, and show the second power line PL2 connected through the second contact hole CH2 to the second electrode ELT2, as an example of the line that may be disposed in the circuit layer PCL. A plurality of transistors forming each pixel circuit PXC may have similar or different sections. Each of the lines disposed in the circuit layer PCL may be configured in a single layer structure or a multi-layer structure, and may be disposed on the same or different layers.

Further, FIGS. 6 to 10 illustrate an embodiment in which a light conversion layer CCL and a color filter CF are formed on a surface of a base layer BSL on which the pixels PXL are formed. However, the present disclosure is not limited thereto. For example, the light conversion layer CCL and/or the color filter CF may not be provided on the light emitting units EMU of the pixels PXL, or an upper substrate (or passivation layer) separate from the base layer BSL may be provided and the light conversion layer CCL and/or the color filter CF may be disposed on the upper substrate.

First, referring to FIGS. 1 to 6, the pixels PXL and the display panel DP including the pixels may include a circuit layer PCL and a display layer DPL provided on a surface of the base layer BSL, and a color filter layer CFL and an encapsulation layer ENC disposed on the display layer DPL. For example, the display area DA may include the circuit layer PCL, the display layer DPL, the color filter layer CFL, and the encapsulation layer ENC, which are successively disposed on the surface of base layer BSL.

The base layer BSL may be a rigid or flexible substrate or film. Further, the base layer BSL may be a substrate or film of a single layer structure or a multi-layer structure.

The circuit elements forming the pixel circuit PXC of the corresponding pixel PXL and lines connected thereto may be disposed in each pixel area PXA of the circuit layer PCL. The first and second electrodes ELT1 and ELT2, the light emitting elements LD, and the first and second contact electrodes CNE1 and CNE2 forming the light emitting unit EMU of the corresponding pixel PXL may be disposed in each pixel area PXA of the display layer DPL, e.g., each emission area EA. Further, the light conversion layer CCL may be selectively provided in each emission area EA of the display layer DPL. The color filter CF corresponding to the color of the corresponding pixel PXL may be disposed in each emission area EA of the color filter layer CFL. The encapsulation layer ENC may be entirely formed in the display area DA in which the circuit layer PCL, the display layer DPL, and/or the color filter layer CFL are provided.

The circuit layer PCL may include a plurality of insulating layers as well as the circuit elements and the lines. For instance, the circuit layer PCL may include a first insulating layer INS1, a second insulating layer INS2, a third insulating layer INS3, and/or a fourth insulating layer INS4 that are successively disposed on a surface of the base layer BSL.

The circuit layer PCL may selectively include a first conductive layer including the bottom metal layer BML of the first transistor M1. The first conductive layer may be disposed between the base layer BSL and the first insulating layer INS1, and may include the bottom metal layer BML overlapping the gate electrode GE and/or the semiconductor pattern SCP of the first transistor M1 in the third direction DR3. In one or more embodiments, the bottom metal layer BML may be connected to one electrode (e.g., the source electrode or the drain electrode) of the first transistor M1.

The first insulating layer INS1 may be disposed on a surface of the base layer BSL including the first conductive layer. The first insulating layer INS1 may prevent impurities from diffusing into each circuit element.

A semiconductor layer may be disposed on the first insulating layer INS1. The semiconductor layer may include semiconductor patterns SCP of transistors including the first transistor M1. Each semiconductor pattern SCP may include a channel area overlapping the gate electrode GE of the corresponding transistor in the third direction DR3, and first and second conductive areas (e.g. source and drain areas) disposed on opposite sides of the channel area.

The semiconductor pattern SCP may be a semiconductor pattern formed of polysilicon, amorphous silicon, an oxide semiconductor, or the like. The first and second conductive areas of the semiconductor pattern SCP may be doped with dopants of different conductivity types.

In one or more embodiments, the first transistor M1 may include the semiconductor pattern SCP formed of an oxide semiconductor. The oxide semiconductor may include a metal oxide such as zinc (Zn), indium (In), gallium (Ga), tin (Sn), or titanium (Ti), or a combination of a metal such as zinc (Zn), indium (In), gallium (Ga), tin (Sn), or titanium (Ti) and an oxide thereof. For instance, the oxide semiconductor may include at least one of zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO). When the semiconductor pattern SCP of the first transistor M1 is formed of the oxide semiconductor, the mobility characteristic of the first transistor M1 may be improved.

The second insulating layer INS2 may be disposed on the semiconductor layer and the first insulating layer INS1. Further, a second conductive layer may be disposed on the second insulating layer INS2.

The second conductive layer may include gate electrodes GE of transistors including the first transistor M1. Furthermore, the second conductive layer may further include a first electrode of the capacitor Cst, lines (e.g., predetermined lines), and/or bridge patterns, which are provided in each pixel circuit PXC.

The third insulating layer INS3 may be disposed on the second conductive layer and the second insulating layer INS2. Further, the third conductive layer may be disposed on the third insulating layer INS3.

The third conductive layer may include the second power line PL2 and source and drain electrodes SE and DE of transistors including the first transistor M1. Furthermore, the third conductive layer may further include a first electrode of the capacitor Cst, lines (e.g., predetermined lines), and/or bridge patterns, which are provided in each pixel circuit PXC.

Each conductive pattern, electrode, and/or line forming the first to third conductive layers may include at least one conductive material to have conductivity. For instance, each conductive pattern, electrode, and/or line forming the first to third conductive layers may include one or more metals selected from among molybdenum (Mo), aluminum (Al), platinum (Pt), palladium (Pd), silver (Ag), magnesium (Mg), gold (Au), nickel (Ni), neodymium (Nd), iridium (Ir), chrome (Cr), titanium (Ti), tantalum (Ta), tungsten (W), and copper (Cu), and may include various types of conductive materials.

The fourth insulating layer INS4 may be disposed on the third conductive layer and the third insulating layer INS3. In one or more embodiments, the fourth insulating layer INS4 may be a first planarization layer that planarizes the surface of the circuit layer PCL. For instance, the fourth insulating layer INS4 may include at least an organic insulating layer, and may substantially planarize the surface of the circuit layer PCL.

Each of the first insulating layer INS1, the second insulating layer INS2, the third insulating layer INS3, and the fourth insulating layer INS4 may be formed of a single layer structure or a multi-layer structure, and may include at least one inorganic insulating material and/or organic insulating material. For instance, each of the first insulating layer INS1, the second insulating layer INS2, the third insulating layer INS3, and the fourth insulating layer INS4 may include various types of organic/inorganic insulating materials including silicon nitride ($SiN_x$), silicon oxide ($SiO_x$), silicon oxynitride ($SiO_xN_y$), or the like.

The display layer DPL may be disposed on the fourth insulating layer INS4.

The display layer DPL may include the light emitting unit EMU of each pixel PXL. For instance, the display layer DPL may include first and second electrodes ELT1 and ELT2, light emitting elements LD, and first and second contact electrodes CNE1 and CNE2, which are disposed in the emission area EA of each pixel PXL.

Further, the display layer DPL may further include first, second, and third insulating patterns INP1, INP2, and INP3, a bank BNK, and fifth and sixth insulating layers INS5 and INS6. The display layer DPL may further selectively include a first conductive pattern CDP1, a second conductive pattern CDP2, and/or a light conversion layer CCL.

The fifth insulating layer INS5 may be provided and/or formed on the fourth insulating layer INS4. In one or more embodiments, the fifth insulating layer INS5 may have an opening or a recess corresponding to the emission area EA of each pixel PXL. For instance, the fifth insulating layer INS5 may have an opening or a recess corresponding to an area in which the light emitting elements LD are arranged to enclose the light emitting elements LD provided in each emission area EA. In one or more embodiments, the fifth insulating layer INS5 may be formed of separate patterns that are separately disposed under each of the first electrode ELT1 and the second electrode ELT2.

The first and second electrodes ELT1 and ELT2 may protrude upwards (e.g., in the third direction DR3) around the light emitting elements LD by the fifth insulating layer INS5. The fifth insulating layer INS5 and the first and second electrodes ELT1 and ELT2 provided thereabove may form a reflective protrusion pattern around the light emitting elements LD. Thus, as light emitted from the light emitting elements LD is directed towards the upper side of the pixel PXL, the light efficiency of the pixels PXL may be improved.

The fifth insulating layer INS5 may include an inorganic insulating layer made of inorganic material or an organic insulating layer made of organic material. Further, the fifth insulating layer INS5 may have a single layer structure or a multi-layer structure, and a sectional structure thereof is not particularly limited.

The first electrode ELT1 and the second electrode ELT2 may be disposed on the fifth insulating layer INS5. The first electrode ELT1 and the second electrode ELT2 each may have a non-planar surface to correspond to the shape of the fifth insulating layer INS5. For instance, the first electrode ELT1 and the second electrode ELT2 may protrude in the height (or thickness) direction of the base layer BSL, e.g., in the third direction DR3 in an area overlapping the fifth insulating layer INS5.

The first electrode ELT1 may be connected to the first transistor M1 of the corresponding pixel PXL through the first contact hole CH1. The second electrode ELT2 may be connected to the second power line PL2 through the second contact hole CH2.

Each of the first and second electrodes ELT1 and ELT2 may include at least one conductive material. For instance, each of the first and second electrodes ELT1 and ELT2 may include at least one conductive material from among at least one of various metals including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), copper (Cu), etc. or an alloy including the same, a conductive oxide such as ITO (Indium Tin Oxide), IZO (Indium Zinc Oxide), ITZO (Indium Tin Zinc Oxide), ZnO (Zinc Oxide), AZO (Aluminum doped Zinc Oxide), GZO (Gallium doped Zinc Oxide), ZTO (Zinc Tin Oxide), GTO (Gallium Tin Oxide) and FTO (Fluorine doped Tin Oxide), and a conductive polymer such as PEDOT. Further, the first electrode ELT1 and the second electrode ELT2 may include other conductive materials such as carbon nanotubes or graphene. In other words, each of the first and second electrodes ELT1 and ELT2 may include at least one of various conductive materials to have conductivity. Further, the first and second electrodes ELT1 and ELT2 may include the same or different conductive materials.

Each of the first and second electrodes ELT1 and ELT2 may have a single-layer structure or a multi-layer structure. For instance, each of the first and second electrodes ELT1 and ELT2 may selectively further include at least one reflective electrode layer including a reflective conductive material, at least one transparent electrode layer and/or a conductive capping layer. The reflective conductive material may be metal having a high reflectivity in a visible-light wavelength band, for example, one of metal materials such as aluminum (Al), gold (Au), and silver (Ag), but is not limited thereto.

The first insulating pattern INP1 and the second insulating pattern INP2 may be disposed on the first electrode ELT1 and the second electrode ELT2, respectively.

The first insulating pattern INP1 may protrude to the outside of the first electrode ELT1 in the first and second directions DR1 and DR2. Thus, the first insulating pattern INP1 may form the first reverse tapered pattern RTP1 together with the first electrode ELT1. The first insulating pattern INP1 may be opened in an area corresponding to the first contact portion CNT1 and/or CNT1'.

The second insulating pattern INP2 may protrude to the outside of the second electrode ELT2 in the first and second directions DR1 and DR2. Thus, the second insulating pattern INP2 may form the second reverse tapered pattern RTP2 together with the second electrode ELT2. The second insulating pattern INP2 may be opened in an area corresponding to the second contact portion CNT2 and/or CNT2'.

As the reverse tapered patterns RTP are formed by the first electrode ELT1 and the first insulating pattern INP1, and the second electrode ELT2 and the second insulating pattern INP2, the first contact electrode CNE1 and the second contact electrode CNE2 may be formed separately from each other in individual patterns while the conductive material is applied (e.g., deposited) in a subsequent process. In the reverse tapered patterns RTP, the conductive layer formed of the conductive material while the conductive material is applied in the subsequent process, may be formed in a size and/or shape sufficient to be separated into the first contact electrode CNE1, the second contact electrode CNE2, the first conductive pattern CDP1 and the second conductive pattern CDP2.

Each of the first insulating pattern INP1 and the second insulating pattern INP2 may be formed of a single layer structure or a multi-layer structure, and may include at least one inorganic insulating material and/or organic insulating material. In one or more embodiments, each of the first insulating pattern INP1 and the second insulating pattern INP2 may include at least one type of inorganic insulating material including silicon nitride ($SiN_x$), silicon oxide ($SiO_x$), or silicon oxynitride ($SiO_xN_y$). The first insulating pattern INP1 and the second insulating pattern INP2 may be concurrently (or simultaneously) formed, and may include the same insulating material.

The light emitting elements LD may be aligned in the emission area EA in which the first insulating pattern INP1 and the second insulating pattern INP2 are formed. Each of the light emitting elements LD may be aligned between the first electrode ELT1 and the second electrode ELT2, and between the first insulating pattern INP1 and the second insulating pattern INP2 corresponding thereto. For instance, each of the light emitting elements LD may be aligned between the first insulating pattern INP1 and the second insulating pattern INP2 such that the first end EP1 and the second end EP2 are positioned, respectively, on the first insulating pattern INP1 and the second insulating pattern INP2.

Before the supply of the light emitting elements LD, the bank BNK may be formed around the emission area EA. For example, the bank BNK may be formed in the display area DA to enclose each emission area EA. Thus, each emission area EA to which the light emitting elements LD are to be supplied may be defined.

The bank BNK may be a pixel defining layer including first openings OPA1 corresponding to the emission areas EA of the pixels PXL, and may be formed to cover outer areas of the pixels PXL and/or non-pixel areas between the pixels PXL. The bank BNK may include various light blocking and/or reflective materials including a black matrix material.

The third insulating pattern INP3 may be disposed on a portion of the light emitting elements LD. For example, the third insulating pattern INP3 may be locally disposed on a portion including the central portion of each of the light emitting elements LD to expose the first and second ends EP1 and EP2 of the light emitting elements LD aligned in each emission area EA. When the third insulating pattern INP3 is formed over the light emitting elements LD, the light emitting elements LD may be reliably fixed.

In one or more embodiments, in case that a separation space is present between the fourth insulating layer INS4 and the light emitting elements LD due to a step formed by the first and second electrodes ELT1 and ELT2 and the first and second insulating patterns INP1 and INP2, an insulating material may be introduced into the separation space in the process of forming the third insulating pattern INP3. In this case, the third insulating pattern INP3 may be provided under the light emitting elements LD.

The third insulating pattern INP3 may be formed of a single layer structure or a multi-layer structure, and may include at least one inorganic insulating material and/or organic insulating material. In one or more embodiments, the third insulating pattern INP3 may include various types of organic insulating materials including an organic photosensitive material, and may be formed to be thicker than the first and second electrodes ELT1 and ELT2, the first and second insulating patterns INP1 and INP2, and/or the first and second contact electrodes CNE1 and CNE2. For instance, the third insulating pattern INP3 is formed with a sufficient thickness, such that the conductive layer formed by conductive material concurrently (e.g., simultaneously) with the application of the conductive material in a subsequent process may be automatically separated into the first and second contact electrodes CNE1 and CNE2 and the first conductive pattern CDP 1. For instance, the third insulating pattern INP3 may be at least twice as thick as each of the first and second contact electrodes CNE1 and CNE2.

In one or more embodiments, the third insulating pattern INP3 may be formed to include the reverse tapered pattern over the light emitting elements LD through a photolithography process. For example, a photosensitive insulating layer (e.g., at least one organic insulating layer including an organic photosensitive material) may be formed throughout the display area DA in which the light emitting elements LD are arranged in each emission area EA, and the photosensitive insulating layer may be patterned through the photolithography process, so that the third insulating pattern INP3 may be formed over the light emitting elements LD. In this case, as shown in FIGS. 6 and 7, the third insulating pattern INP3 may include an upper area UA including an upper surface, a lower area LA contacting the light emitting elements LD, and a middle area MA positioned between the upper area UA and the lower area LA, and the middle area MA may be narrower in width than the upper area UA. For instance, the third insulating pattern INP3 may have a first width w1 which is the maximum width in the upper surface, which is the uppermost layer of the upper area UA, may be gradually reduced in width from the upper area UA to the middle area MA, and may have a second width w2 which is the minimum width in the middle area MA.

As the third insulating pattern INP3 is formed through the photolithography process, an exposure deviation may be caused in the photosensitive insulating layer of a portion where the third insulating pattern INP3 is to be formed in the exposure process. For instance, because the exposure deviation is caused for each position with respect to the photosensitive insulating layer of a portion where the third insulating pattern INP3 is to be formed by light reflected from the light emitting elements LD in the exposure process, the middle area MA of the third insulating pattern INP3 may be formed to be narrower in width than the upper area UA. For example, the third insulating pattern INP3 may include a dented sidewall to include a curved surface such as a cave shape. Thus, the third insulating pattern INP3 may be formed in a reverse tapered pattern.

The lower area LA of the third insulating pattern INP3 may be a portion contacting the light emitting elements LD or a peripheral portion thereof above the light emitting elements LD, and the width of the third insulating pattern INP3 may be increased again in the lower area LA of the third insulating pattern INP3 by bonding force between the light emitting elements LD and the photosensitive insulating layer. Thus, the third insulating pattern INP3 may include a sidewall having a concave curved shape over the light emitting elements LD. Similarly, the third insulating pattern INP3 positioned under the light emitting elements LD may also include a concave curved sidewall having a shape similar to that of the third insulating pattern INP3 positioned above the light emitting elements LD. When the third insulating pattern INP3 is formed in a reverse tapered pattern as described above, the first and second contact electrodes CNE1 and CNE2 may be stably and separately formed in a subsequent process.

The photosensitive insulating layer may be relatively uniformly exposed in a remaining area where the light emitting elements LD are not aligned, for example, in an area between the light emitting elements LD. Thus, as shown in FIG. 8, the third insulating pattern INP3 may include a vertical sidewall that is substantially perpendicular to the base layer BSL and/or the circuit layer PCL in the area between the light emitting elements LD.

As shown in FIG. 9, the third insulating pattern INP3 may have a non-planar surface due to a step between areas in which the light emitting elements LD are substantially aligned and areas in which the light emitting elements LD are not aligned. For instance, the third insulating pattern INP3 may have a first height h1 based on a surface of a lower layer such as the base layer BSL or the fourth insulating layer INS4 above the light emitting elements LD, and may have a second height h2 that is lower than the first height h1 based on a surface of the lower layer in an area between the light emitting elements LD.

Even in the area where the light emitting elements LD are not aligned, due to a step between the third insulating pattern INP3 and/or the first and second reverse tapered patterns RTP1 and RTP2, the first contact electrode CNE1, the second contact electrode CNE2, the first conductive pattern CDP1, and the second conductive pattern CDP2 may be formed to be separated from each other.

For instance, as shown in FIG. 8, the first and second contact electrodes CNE1 and CNE2 and the first conductive pattern CDP1 may be formed to be separated from each other by the third insulating pattern INP3 and/or the first and second reverse tapered patterns RTP1 and RTP2 in the area between the light emitting elements LD.

Furthermore, as shown in FIG. 10, in the area between the first electrodes ELT1 (or the second electrodes ELT2) of two adjacent pixels PXL, the first contact electrodes CNE1 (or the second contact electrodes CNE2) of the two adjacent pixels PXL and the second conductive pattern CDP2 may be formed to be separated from each other by the first reverse tapered pattern RTP1 (or the second reverse tapered pattern RTP2).

The first contact electrode CNE1 and the second contact electrode CNE2 may be formed on the first and second ends EP1 and EP2 and the first and second insulating patterns INP1 and INP2 of the light emitting elements LD. The first contact electrode CNE1 and the second contact electrode CNE2 may be separated from each other with the third insulating pattern INP3 interposed therebetween.

The first contact electrode CNE1 may be formed on the first ends EP1 of the light emitting elements LD to be connected to the first ends EP1. Furthermore, the first contact electrode CNE1 may be connected to the first electrode ELT1 through the first contact portion CNT1 and/or CNT1'.

The second contact electrode CNE2 may be formed on the second ends EP2 of the light emitting elements LD to be connected to the second ends EP2. Furthermore, the second contact electrode CNE2 may be connected to the second electrode ELT2 through the second contact portion CNT2 and/or CNT2'.

The first conductive pattern CDP1 may be formed on the third insulating pattern INP3, and may be separated from the first and second contact electrodes CNE1 and CNE2 by the third insulating pattern INP3. For instance, the first conductive pattern CDP1 may be formed concurrently (or simultaneously) with the first and second contact electrodes CNE1 and CNE2 in a process of applying the conductive material to form the first and second contact electrodes CNE1 and CNE2. Further, the first conductive pattern CDP1 may be formed on the third insulating pattern INP3, and may be separated from the first and second contact electrodes CNE1 and CNE2 by the step formed by the third insulating pattern INP3 and an undercut formed under the third insulating pattern INP3.

The pixel PXL may further include at least one second conductive pattern CDP2. For instance, at least one second conductive pattern CDP2 may be disposed around the first contact electrode CNE1 and/or the second contact electrode CNE2.

The second conductive pattern CDP2 may be formed concurrently (or simultaneously) with the first and second contact electrodes CNE1 and CNE2 in the process of applying the conductive material for forming the first and second contact electrodes CNE1 and CNE2, and may be separated from the first and second contact electrodes CNE1 and CNE2 and/or the first conductive pattern CDP1 by the first and second reverse tapered patterns RTP1 and RTP2 and/or the third insulating pattern INP3.

In the case of concurrently forming (e.g., simultaneously forming) the first and second contact electrodes CNE1 and CNE2 and the first and second conductive patterns CDP1 and CDP2, the first and second contact electrodes CNE1 and CNE2 and the first and second conductive patterns CDP1 and CDP2 may include the same conductive material.

In one or more embodiments, the first and second contact electrodes CNE1 and CNE2 and the first and second conductive patterns CDP1 and CDP2 may include a transparent conductive material to allow light emitted from the light emitting elements LD to pass therethrough. For instance, the first and second contact electrodes CNE1 and CNE2 and the first and second conductive patterns CDP1 and CDP2 may include at least one of various transparent conductive materials including ITO, IZO, ITZO, ZnO, AZO, GZO, ZTO, GTO, and FTO. Thus, light emitted from the light emitting elements LD through each of the first and second ends EP1 and EP2 of the light emitting elements LD may pass through the first and second contact electrodes CNE1 and CNE2 and then may be emitted to the outside of the pixel PXL.

In one or more embodiments, the pixel PXL and the display panel DP including the pixel PXL may further include the light conversion layer CCL provided in each emission area EA. For instance, the light conversion layer CCL may be selectively disposed on each light emitting unit EMU in which the light emitting elements LD are arranged.

The light conversion layer CCL may include light scattering particles SCT which scatter light emitted from wavelength conversion particles (or color conversion particles) that convert the wavelength and/or color of light emitted from the light emitting elements LD, and/or the light emitting elements LD to increase light output efficiency. For instance, each light conversion layer CCL including wavelength conversion particles containing at least one type of quantum dots QD (e.g., red, green, and/or blue quantum dots), and/or light scattering particles SCT may be provided on each light emitting unit EMU. For example, in case that any one pixel PXL is set as a red (or green) pixel and blue light emitting elements LD are provided on the light emitting unit EMU of the pixel PXL, the light conversion layer CCL including red (or green) quantum dots QD for converting blue light into red (or green) light may be disposed on the light emitting unit EMU of the pixel PXL. The light conversion layer CCL may further include light scattering particles SCT. In case that any one pixel PXL is set as a blue pixel and blue light emitting elements LD are provided on the light emitting unit EMU of the pixel PXL, the light conversion layer CCL may not be provided or the light conversion layer CCL including the light scattering particles SCT may be provided on the light emitting unit EMU of the pixel PXL.

A sixth insulating layer INS6 may be formed on a surface of the base layer BSL on which the light emitting units EMU of the pixels PXL and/or the light conversion layers CCL are formed.

The sixth insulating layer INS6 may be formed of a single layer structure or a multi-layer structure, and may include at least one inorganic insulating material and/or organic insulating material. In one or more embodiments, the sixth insulating layer INS6 may protect the light emitting units EMU and/or the light conversion layers CCL. The sixth insulating layer INS6 may be a planarization layer that substantially planarizes the surface of the display layer DPL. For example, the sixth insulating layer INS6 may include at least one organic insulating layer. Also, the sixth insulating layer INS6 may include a filler layer.

A color filter layer CFL may be disposed on the sixth insulating layer INS6.

The color filter layer CFL may include color filters CF corresponding to the colors of the pixels PXL. For example, a first color filter CF1 of a first color may be disposed in the emission area EA of the pixel PXL corresponding to the first color, a second color filter CF2 of a second color may be disposed in the emission area EA of the pixel PXL corresponding to the second color, and a third color filter CF3 of a third color may be disposed in the emission area EA of the pixel PXL corresponding to the third color.

In one or more embodiments, the first, second, and third color filters CF1, CF2, and CF3 may be disposed to overlap each other in each of the non-emission area NEA and the separation area SPA and thereby block the transmission of light. Alternatively, the first, second, and third color filters CF1, CF2, and CF3 may be individually formed in the emission areas EA of the pixels having the first, second, and third pixels, respectively, and a separate light blocking pattern may be disposed in each of the non-emission area NEA and the separation area SPA.

The encapsulation layer ENC may be disposed on the color filter layer CFL. The encapsulation layer ENC may include at least one insulating layer including a seventh insulating layer INS7. The seventh insulating layer INS7 may be completely formed on the display area DA to cover the circuit layer PCL, the display layer DPL, and/or the color filter layer CFL.

The seventh insulating layer INS7 may include at least one inorganic layer and/or organic layer. For example, the seventh insulating layer INS7 may be formed of a single layer structure or a multi-layer structure, and may include at least one inorganic insulating material and/or organic insulating material. For instance, the seventh insulating layer INS7 may include various types of organic/inorganic insulating materials including silicon nitride ($SiN_x$), silicon oxide ($SiO_x$), silicon oxynitride ($SiO_xN_y$), or aluminum oxide ($Al_xO_y$).

In one or more embodiments, the seventh insulating layer INS7 may be formed in a multi-layer structure. For example, the seventh insulating layer INS7 may be formed in a thin encapsulation layer of the multi-layer structure including at least two inorganic insulating layers and at least one organic insulating layer interposed between the at least two inorganic insulating layers.

FIGS. 11A to 11I are sectional views successively illustrating a method of fabricating a display device DD in accordance with one or more embodiments of the present disclosure. For example, FIGS. 11A to 11I illustrate an embodiment of the method of fabricating the display device DD including the pixel PXL according to the embodiment of FIGS. 5 to 10. FIGS. 12, 13, 14, 15, 16, and 17 are plan views of pixels corresponding to the manufacturing process of FIGS. 11B, 11C, 11E, 11F, 11G, and 11H, respectively.

Referring to FIGS. 1 to 11A, the circuit layer PCL and the fifth insulating layer INS5 may be formed on the base layer BSL, and the conductive layer CDL and the insulating layer INL may be successively formed on the base layer BSL including the circuit layer PCL and the fifth insulating layer INS5. The conductive layer CDL may include a conductive material for forming the first and second electrodes ELT1 and ELT2, and may be formed in a single layer structure or a multi-layer structure. The insulating layer INL may include an insulating material for forming the first and second insulating patterns INP1 and INP2, and may be formed in a single layer structure or a multi-layer structure.

Referring to FIGS. 1 to 11B and 12, by etching the insulating layer INL, the first insulating pattern INP1 and the second insulating pattern INP2 may be formed in each pixel area PXA on the base layer BSL to be separated from each other. In one or more embodiments, the first insulating pattern INP1 and the second insulating pattern INP2 may be formed by etching the insulating layer INL through dry etching using a mask.

Figure 12:
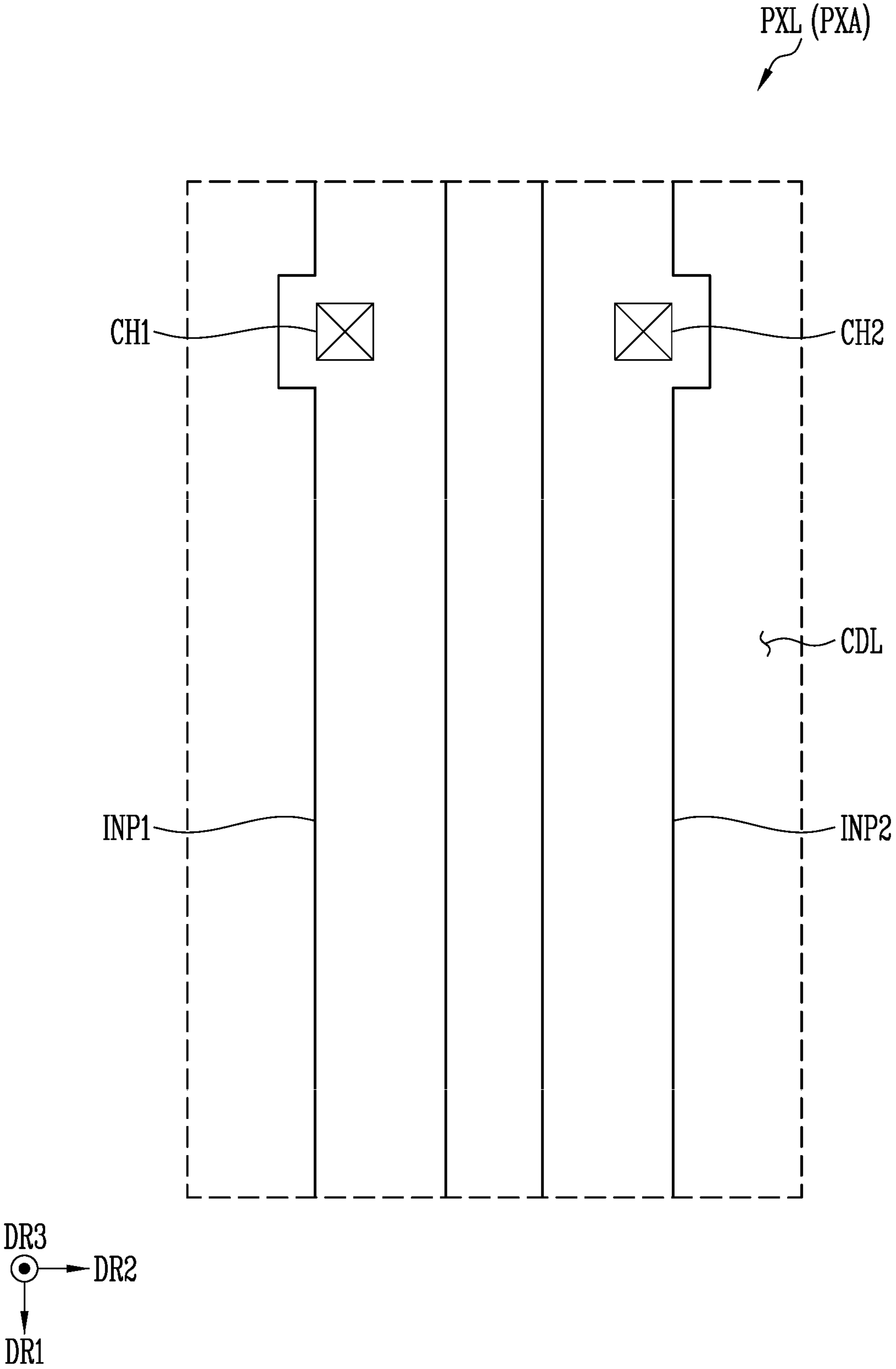
FIG. 12 is a plan view of a pixel corresponding to a manufacturing process of FIG. 11B.
Figure 13:
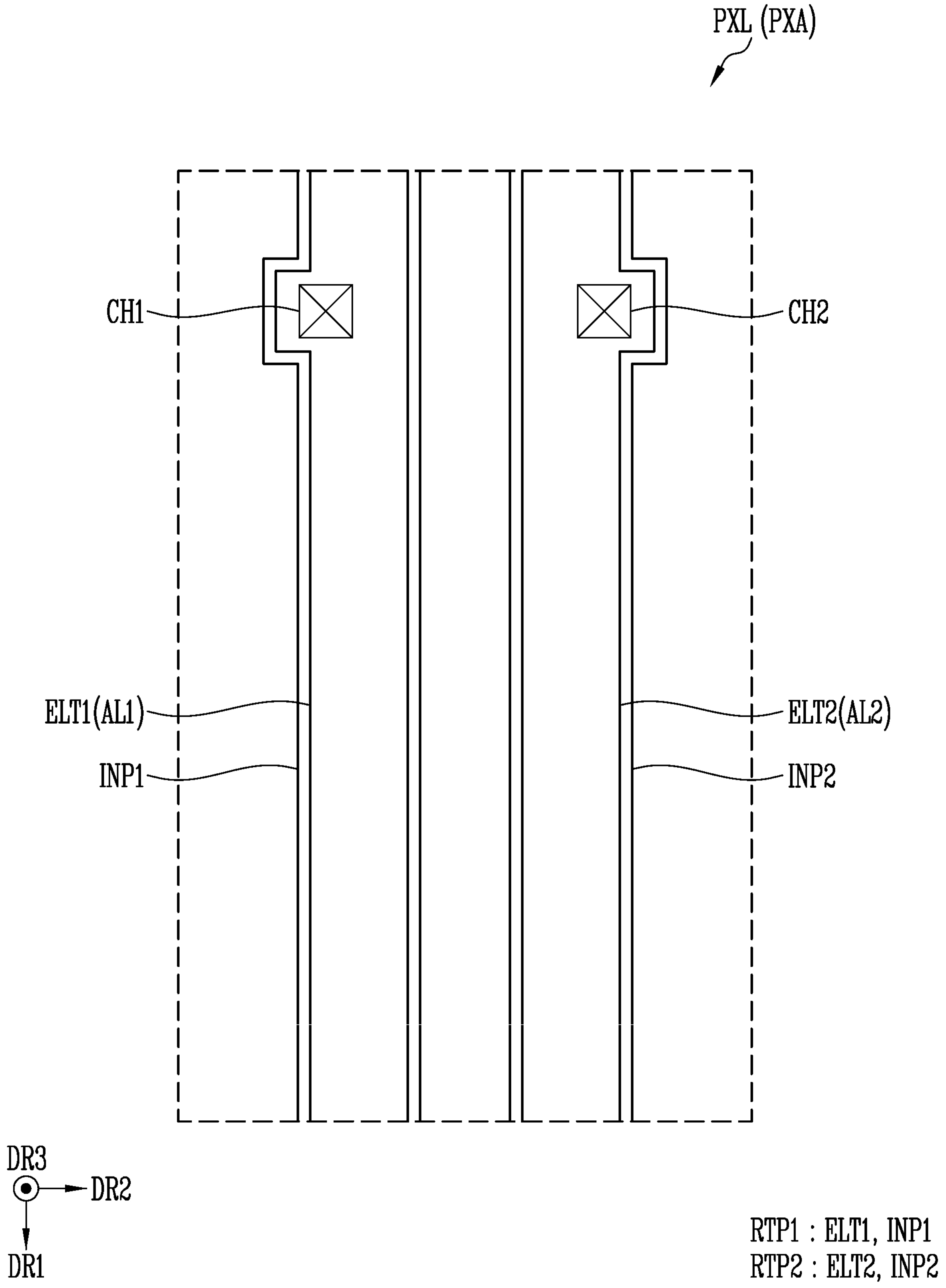
FIG. 13 is a plan view of a pixel corresponding to a manufacturing process of FIG. 11C.
Figure 14:
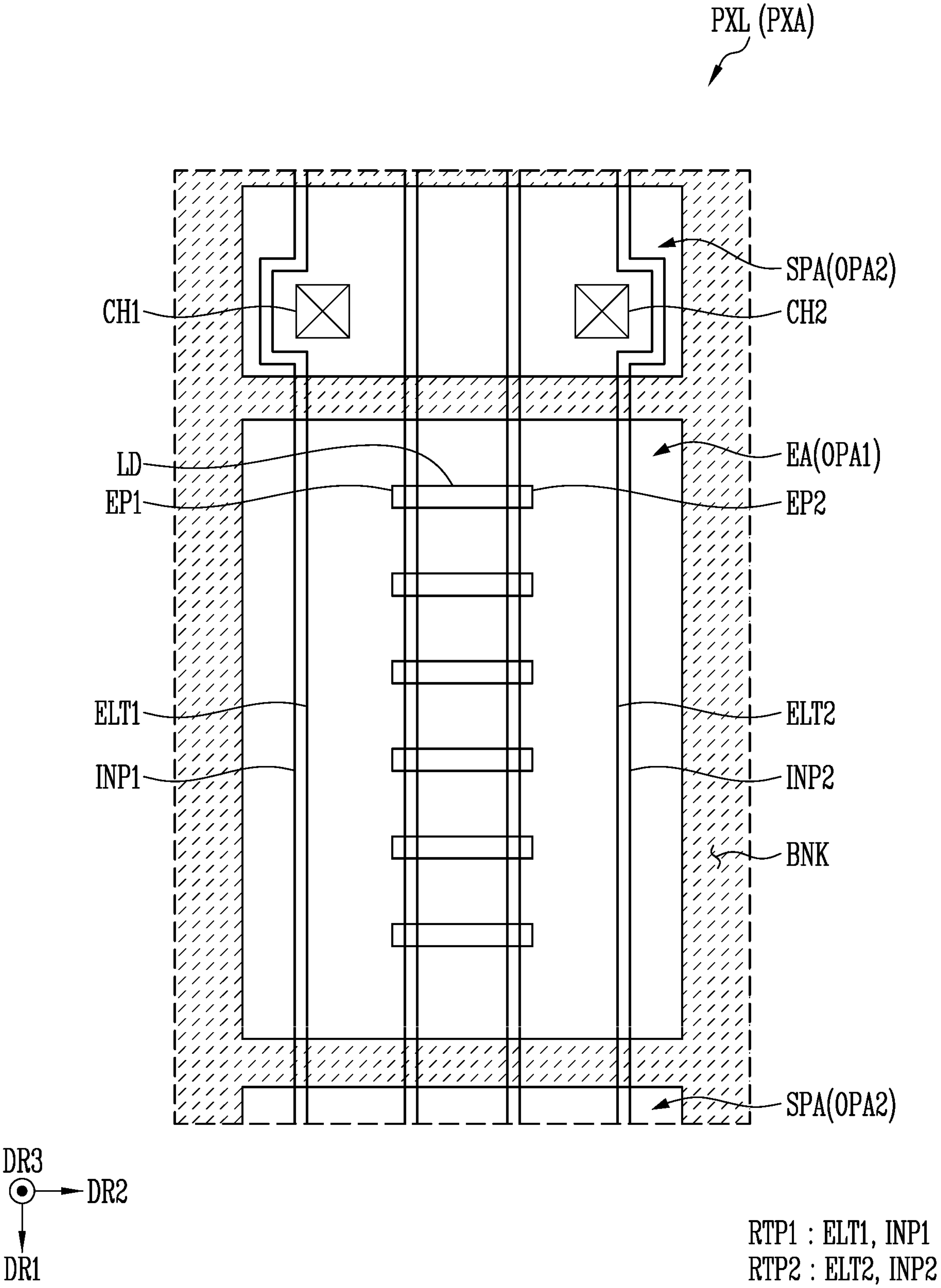
FIG. 14 is a plan view of a pixel corresponding to a manufacturing process of FIG. 11E.
Figure 15:
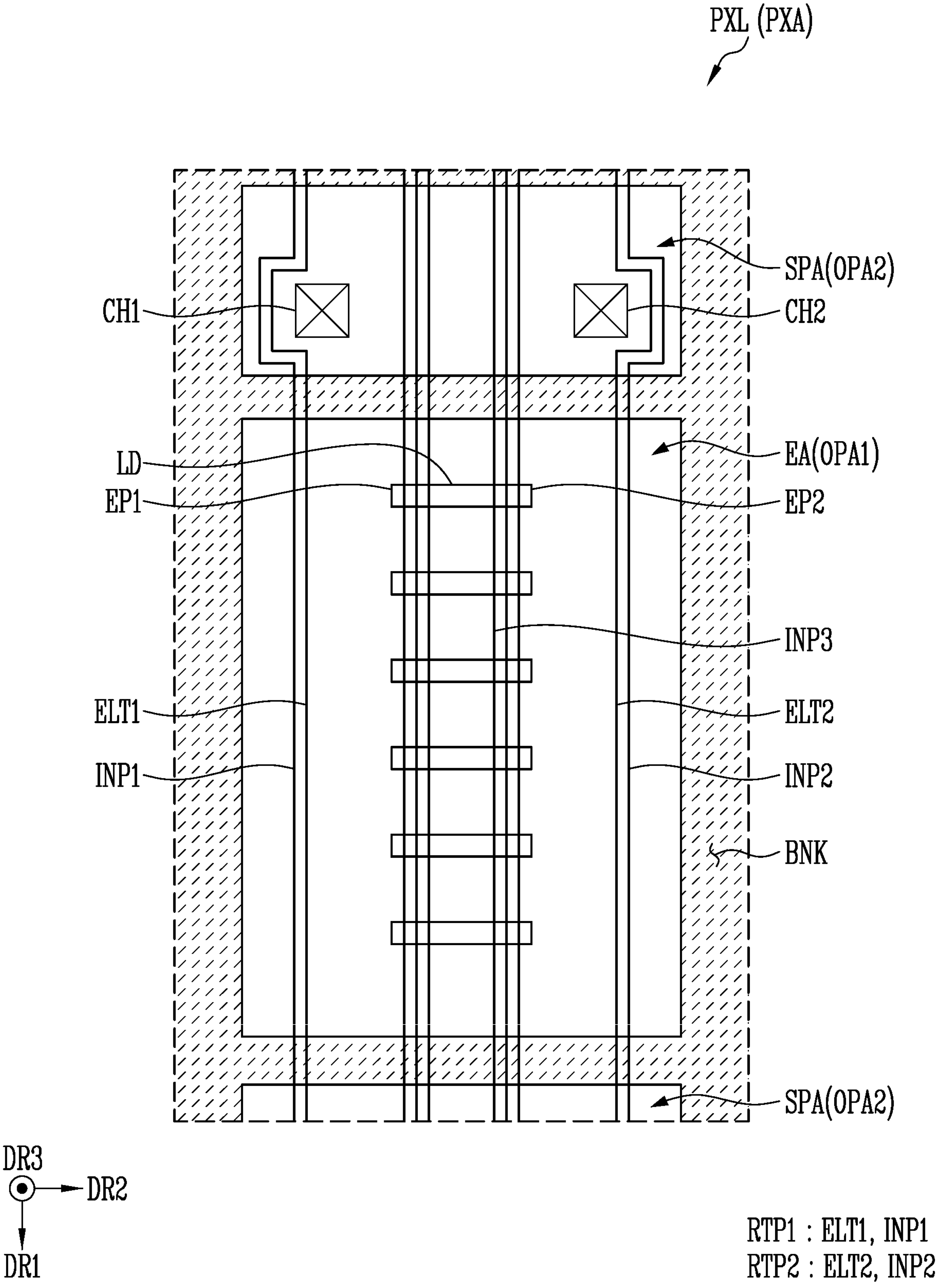
FIG. 15 is a plan view of a pixel corresponding to a manufacturing process of FIG. 11F.

First, the first insulating pattern INP1 and the second insulating pattern INP2 may be formed to extend along the first direction DR1 in the display area DA. For instance, the first insulating pattern INP1 may extend in the first direction DR1 in the display area DA to be integrally connected to the first insulating pattern INP1 of an adjacent pixel PXL in the first direction DR1. Similarly, the second insulating pattern INP2 may extend in the first direction DR1 in the display area DA to be integrally connected to the second insulating pattern INP2 of an adjacent pixel PXL in the first direction DR1. For instance, each of the first insulating pattern INP1 and the second insulating pattern INP2 may be formed to extend in the first direction DR1, as shown in FIG. 12, without being cut in an area corresponding to the separation area SPA of FIG. 5. Further, the first insulating pattern INP1 and the second insulating pattern INP2 may be formed to be spaced from each other in the second direction DR2.

Referring to FIGS. 1 to 11C and 13, by etching the conductive layer CDL using the first insulating pattern INP1 and the second insulating pattern INP2 as a mask, the first electrode ELT1 and the second electrode ELT2 may be formed under the first insulating pattern INP1 and the second insulating pattern INP2, respectively. In one or more embodiments, by etching the conductive layer CDL through wet etching using the first insulating pattern INP1 and the second insulating pattern INP2 as a mask, the first electrode ELT1 and the second electrode ELT2 may be formed.

Furthermore, the conductive layer CDL may be over-etched by controlling selectivity in the etching process of the conductive layer CDL, so that the first electrode ELT1 and the second electrode ELT2 may be formed to be narrower in width than the first insulating pattern INP1 and the second insulating pattern INP2, respectively. In this case, the first electrode ELT1 and the second electrode ELT2 may be positioned inside the first insulating pattern INP1 and the second insulating pattern INP2, respectively, in a plan view, and may have a shape and a size corresponding to those of the first insulating pattern INP1 and the second insulating pattern INP2, respectively.

For example, an undercut of a sufficient size may be formed under the first insulating pattern INP1 and the second insulating pattern INP2, such that the first and second contact electrodes CNE1 and CNE2 and the first and second conductive patterns CDP1 and CDP2 may be separated from each other in a subsequent process of applying the conductive material (or, the process of forming the conductive layer) so as to form the first and second contact electrodes CNE1 and CNE2. The first reverse tapered pattern RTP1 may be formed by the first electrode ELT1 and the first insulating pattern INP1, while the second reverse tapered pattern RTP2 may be formed by the second electrode ELT2 and the second insulating pattern INP2.

In case that the first insulating pattern INP1 and the second insulating pattern INP2 extend in the first direction DR1 in the display area DA, respectively, to be integrally connected to the first insulating pattern INP1 and the second insulating pattern INP2 of the adjacent pixel PXL in the first direction DR1, the first electrode ELT1 and the second electrode ELT2 may also be formed to extend in the first direction DR1 in the display area DA. For instance, the first electrode ELT1 and the second electrode ELT2 may be integrally connected to the first electrode ELT1 and the second electrode ELT2 of the adjacent pixel PXL in the first direction DR1, respectively, to form a first alignment line AL1 and a second alignment line AL2, respectively.

Referring to FIGS. 1 to 11D, the bank BNK may be formed on the base layer BSL in which the first and second electrodes ELT1 and ELT2 (or the first and second alignment lines AL1 and AL2) are formed. Accordingly, the emission area EA of each pixel PXL may be partitioned.

Referring to FIGS. 1 to 11E and 14, the light emitting elements LD may be supplied to the emission area EA of each pixel PXL, and the light emitting elements LD may be disposed between the first electrode ELT1 and the second electrode ELT2 and between the first insulating pattern INP1 and the second insulating pattern INP2 corresponding thereto. For example, the light emitting elements LD may be supplied to each emission area EA through an inkjet method or a slit coating method. Furthermore, by supplying the first alignment signal and the second alignment signal to the first electrode ELT1 (or the first alignment line AL1) and the second electrode ELT2 (or the second alignment line AL2), respectively, the light emitting elements LD may be aligned between the first electrode ELT1 and the second electrode ELT2. For instance, each of the light emitting elements LD may be aligned between the first electrode ELT1 and the second electrode ELT2 of the each pixel PXL such that the first end EP1 and the second end EP2 are positioned, respectively, on the first insulating pattern INP1 and the second insulating pattern INP2.

Referring to FIGS. 1 to 11F and 15, the third insulating pattern INP3 may be formed on a portion of the light emitting elements LD so that the first and second ends EP1 and EP2 of the light emitting elements LD are exposed. In one or more embodiments, by forming the third insulating pattern INP3 using an organic photosensitive material, and forming the third insulating pattern INP3 through the photolithography process, a concave sidewall may be formed in the third insulating pattern INP3 above the light emitting elements LD. For instance, the organic insulating layer may be formed by applying the organic photosensitive material to the entire surface of the display area DA in which the light emitting elements LD are aligned, and the third insulating pattern INP3 may be formed by etching the organic insulating layer through the photolithography process. The third insulating pattern INP3 formed in this way may include the organic photosensitive material, and may include a concave sidewall (e.g., sidewall dented in a cave shape) above and under the light emitting elements LD.

In an area where the light emitting elements LD are not aligned, for example, in an area between the light emitting elements LD and/or in the separation area SPA, the third insulating pattern INP3 may include a vertical sidewall as shown in FIG. 8. Further, the third insulating pattern INP3 may be formed to have different heights in the area above the light emitting elements LD and the remaining areas, and thus may have a non-planar surface as shown in FIG. 9.

Figure 11A:
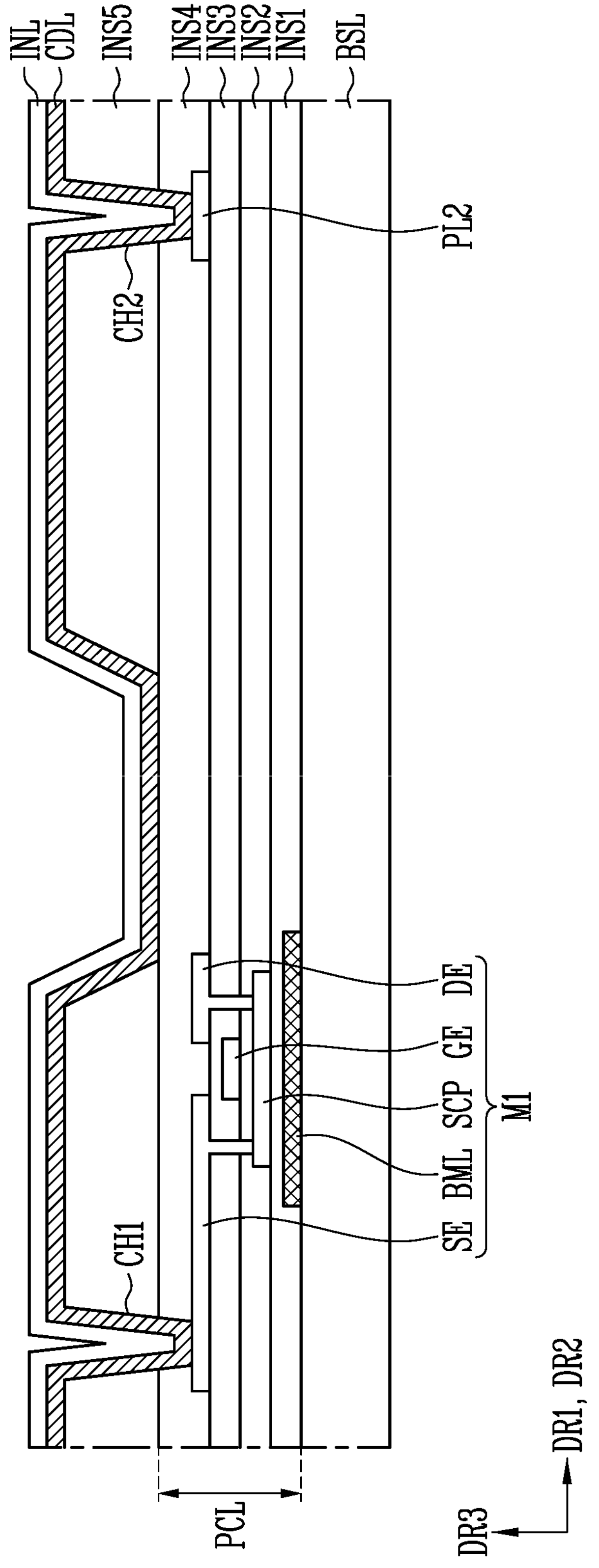
FIGS. 11A to 11I are sectional views successively illustrating a method of fabricating a display device in accordance with one or more embodiments of the present disclosure.
Figure 11B:
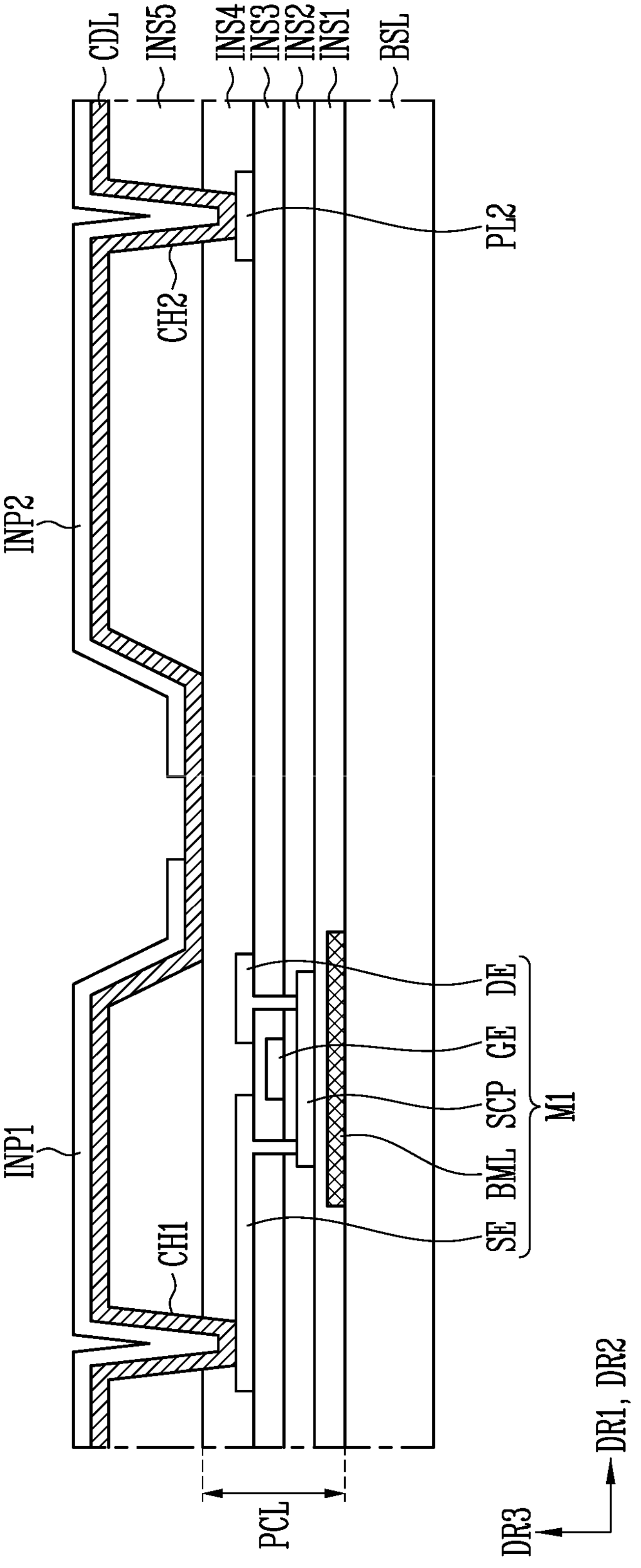
Figure 11C:
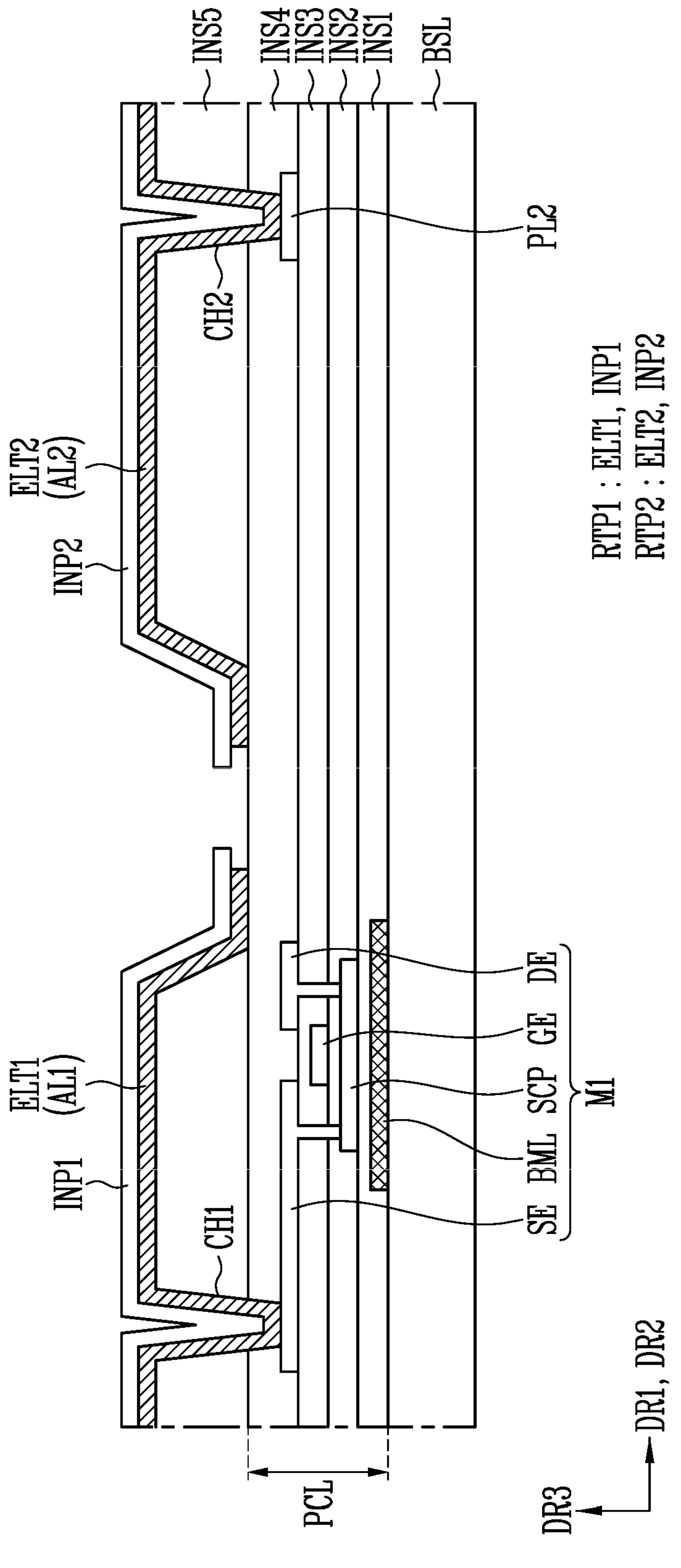
Figure 11D:
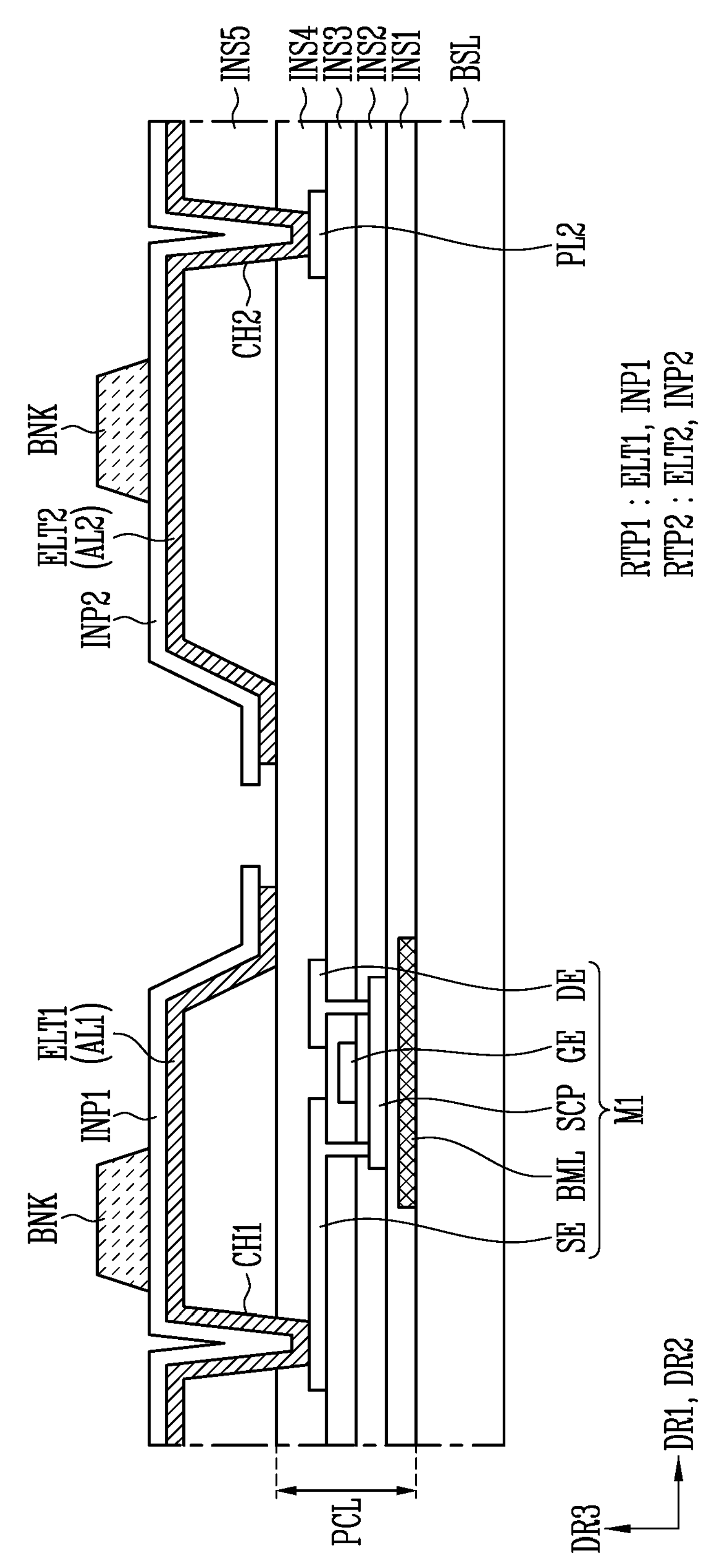
Figure 11E:
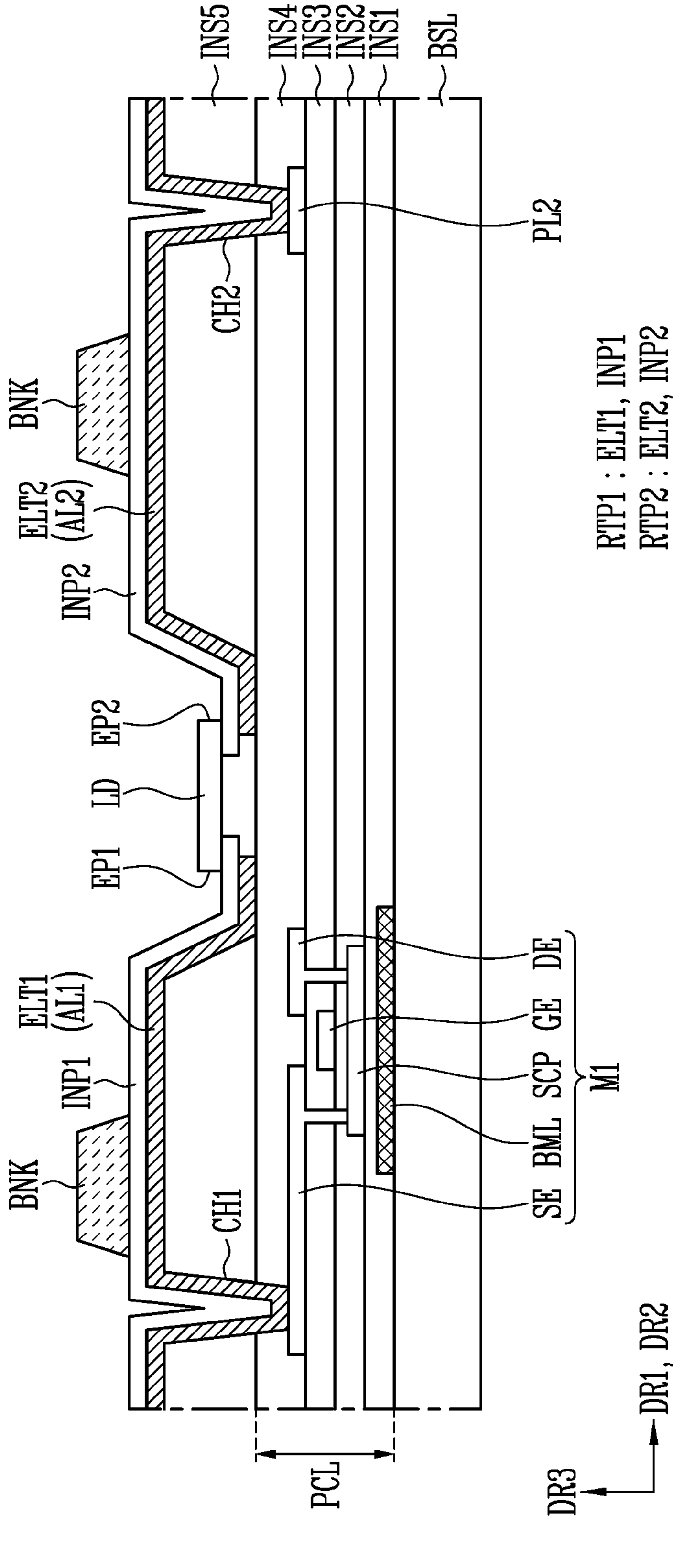
Figure 11F:
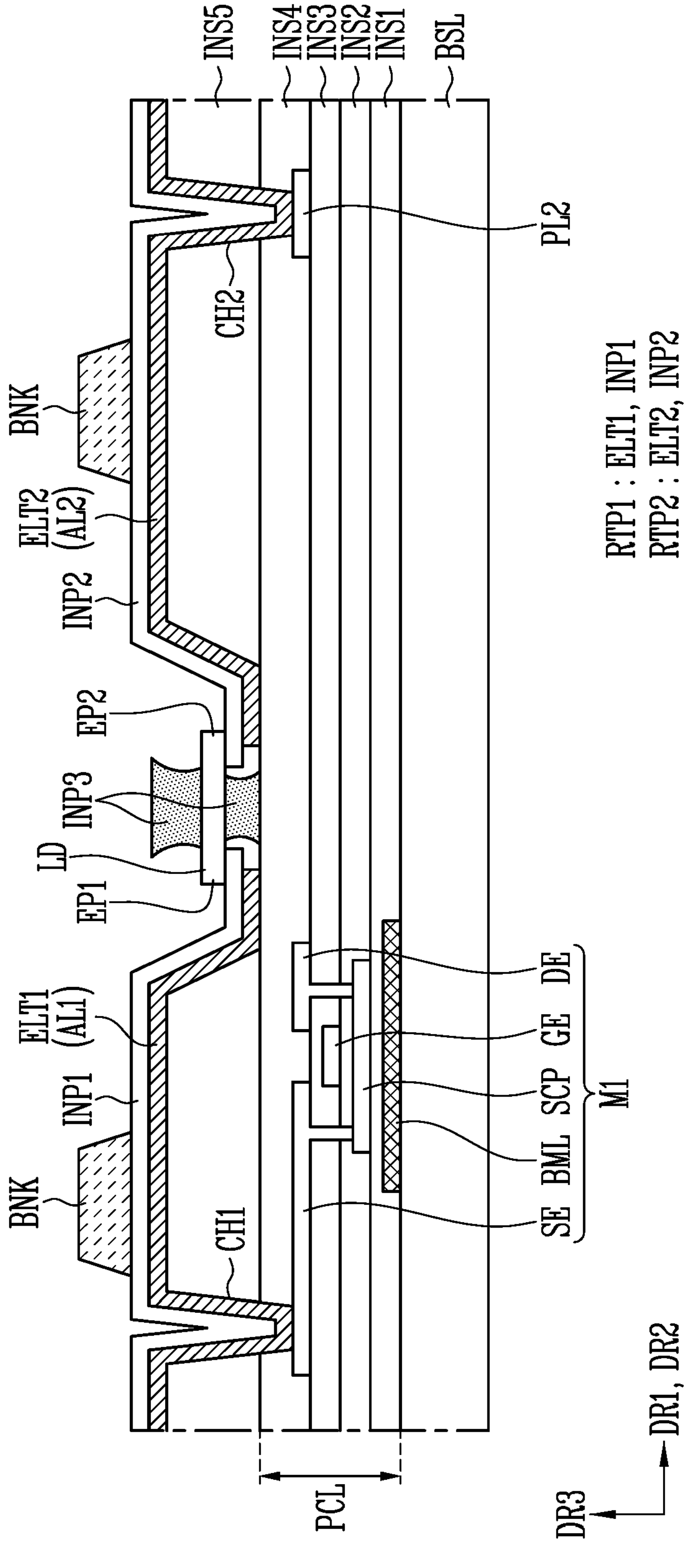
Figure 11G:
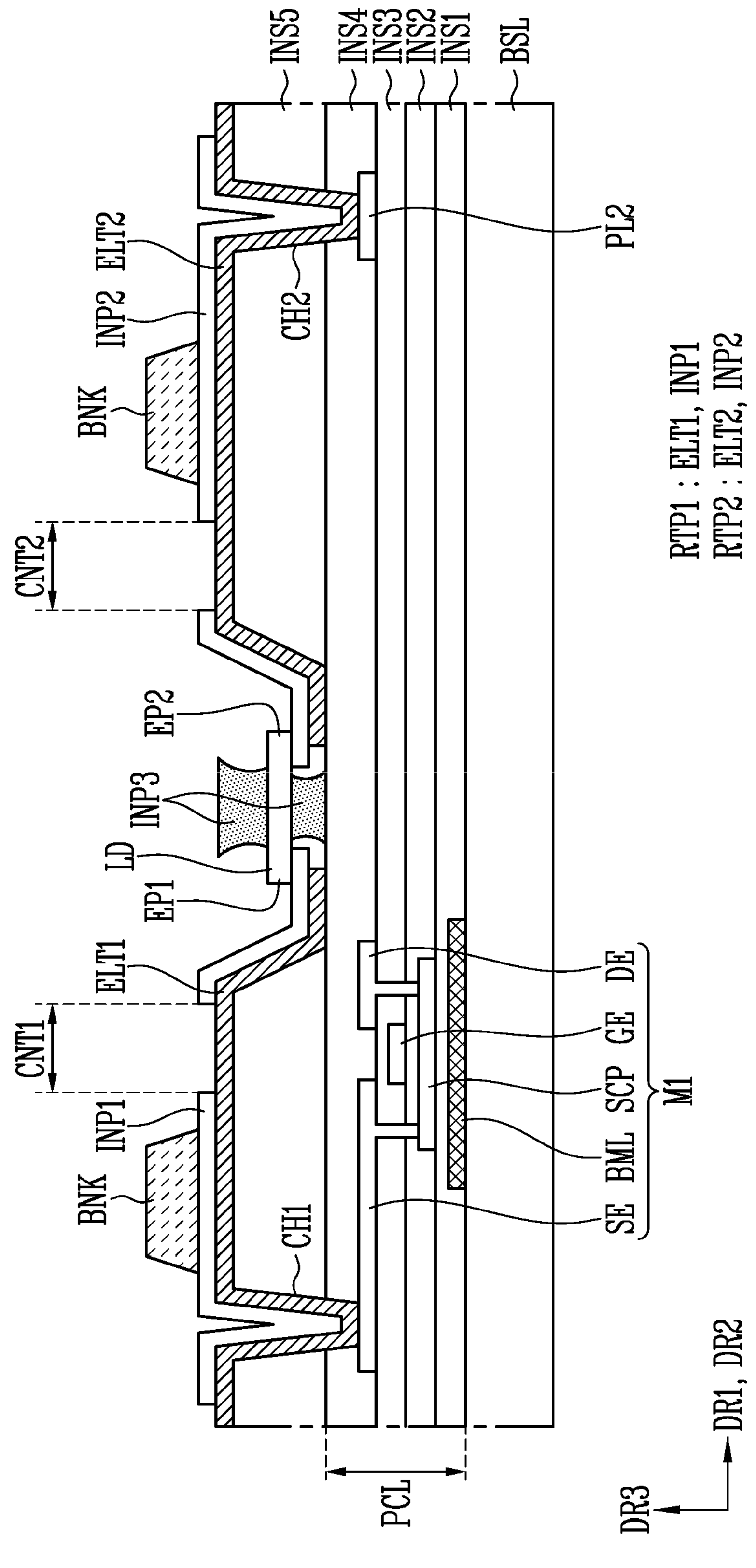
Figure 11H:
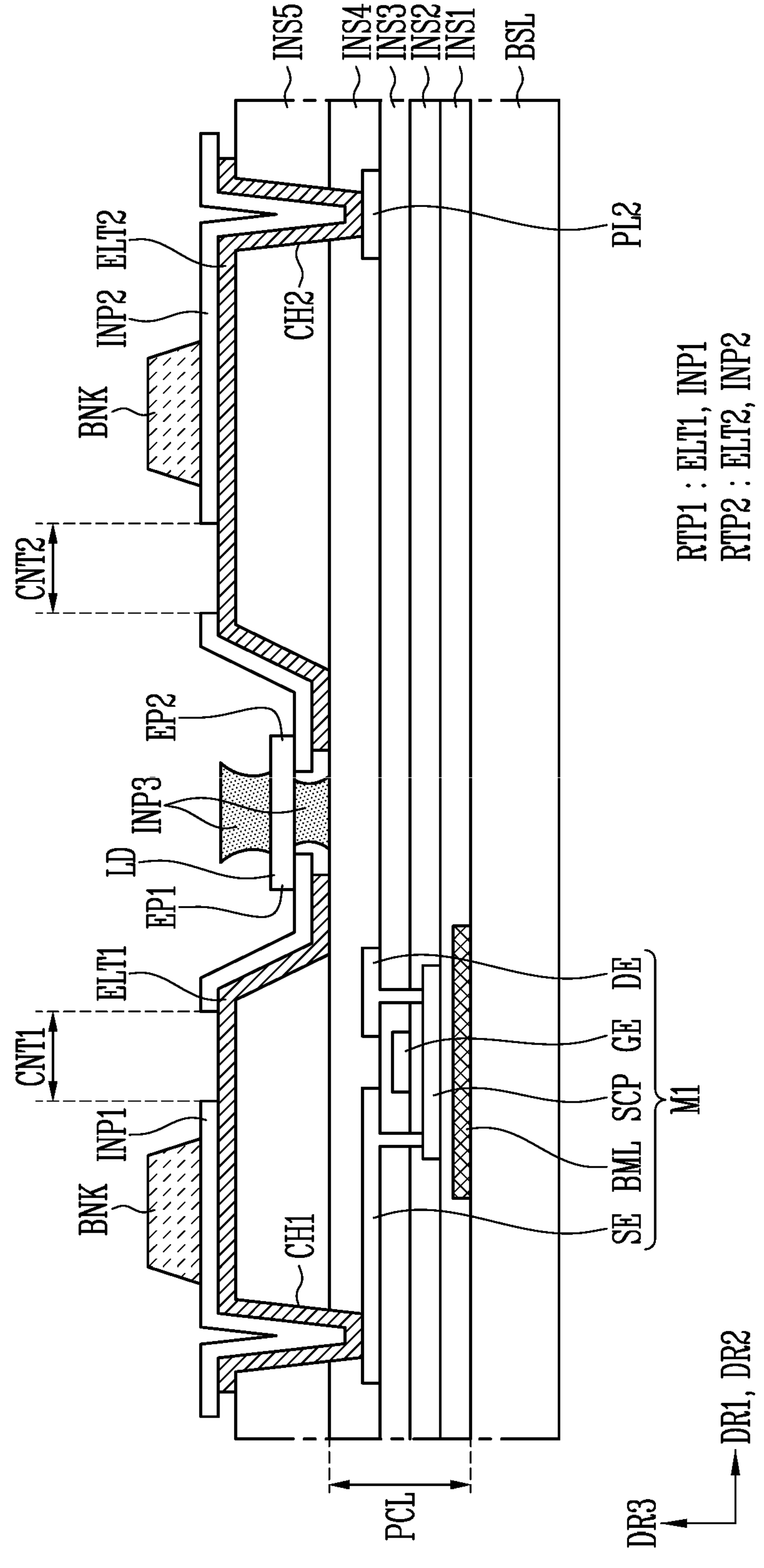
Figure 11I:
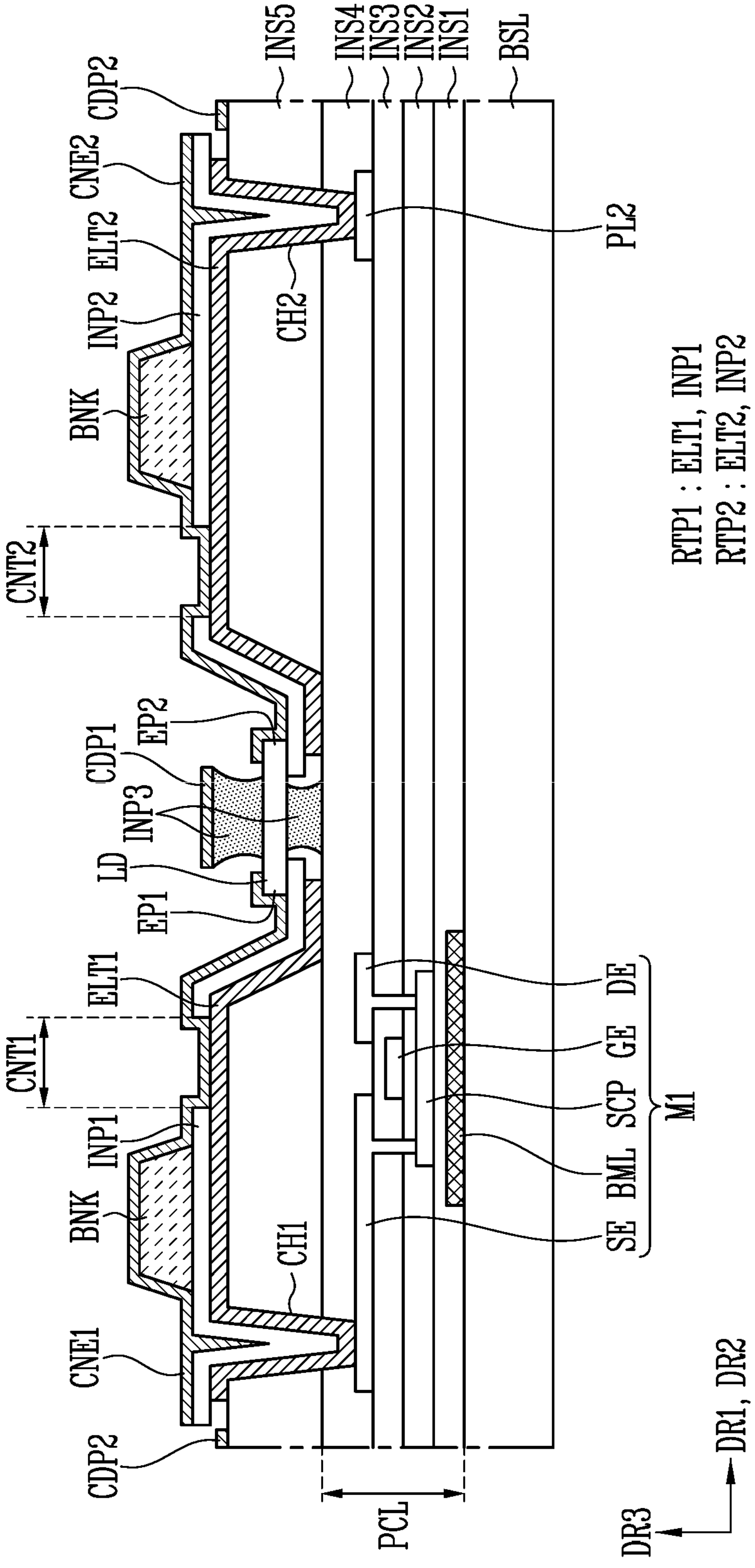
Figure 16:
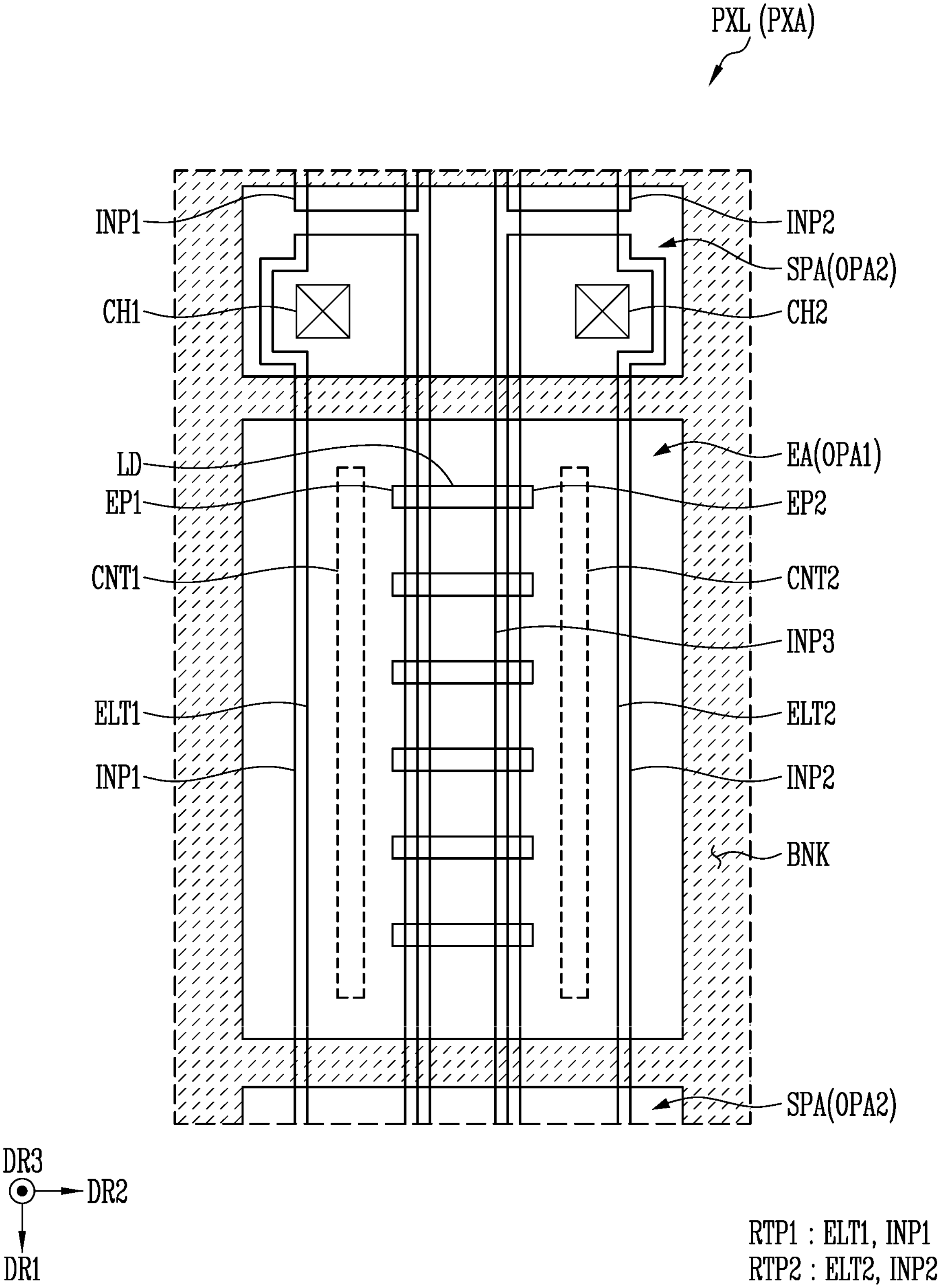
FIG. 16 is a plan view of a pixel corresponding to a manufacturing process of FIG. 11G.
Figure 17:
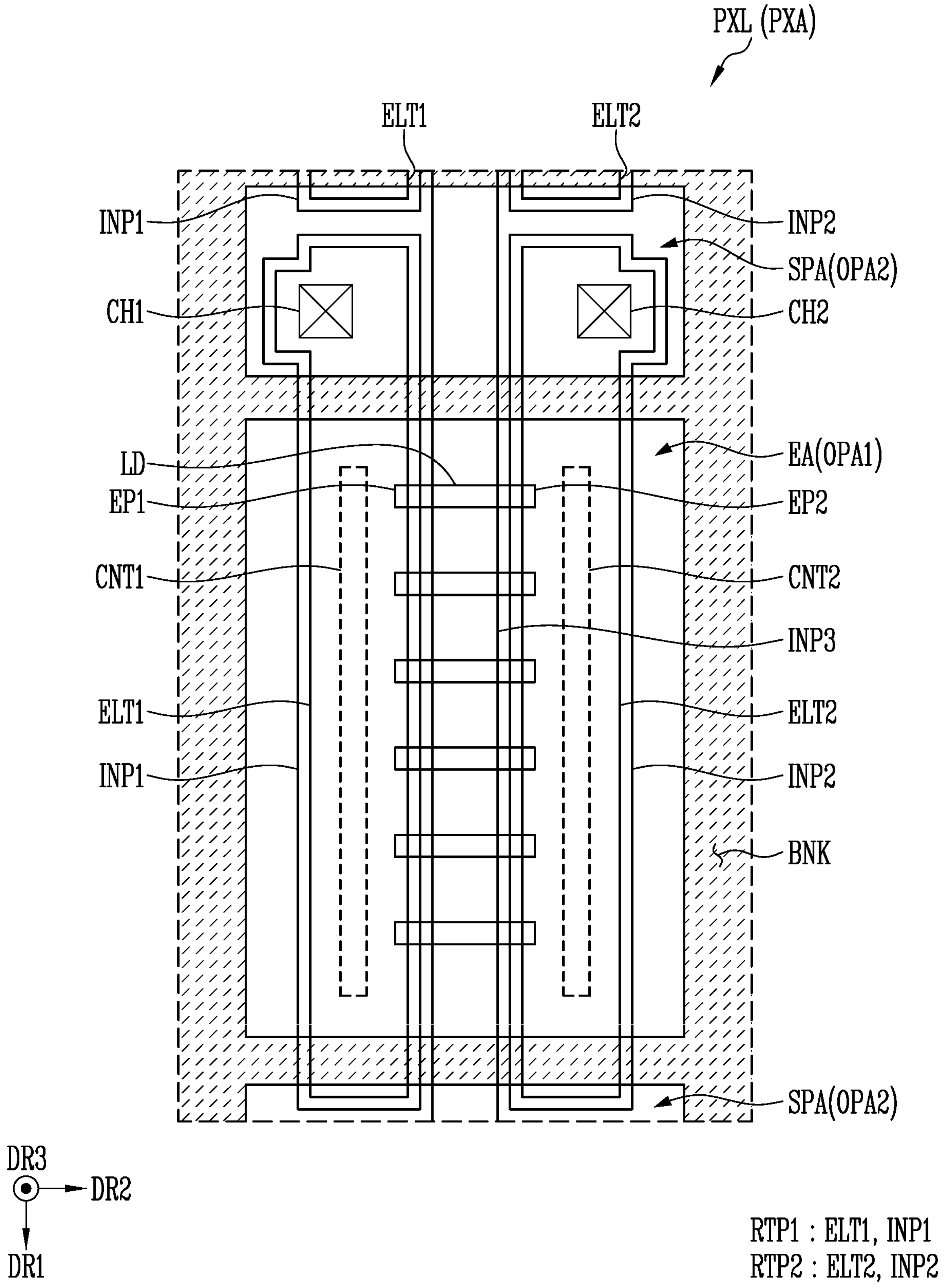
FIG. 17 is a plan view of a pixel corresponding to a manufacturing process of FIG. 11H.

Referring to FIGS. 1 to 11G and 16, in each separation area SPA, the first insulating pattern INP1 and the second insulating pattern INP2 may be etched to cut off. Thus, the first insulating pattern INP1 and the second insulating pattern INP2 of each pixel PXL may be separated from the first insulating pattern INP1 and the second insulating pattern INP2 of the neighboring pixel PXL, respectively. Further, by partially opening the first insulating pattern INP1 and the second insulating pattern INP2, the first contact portion CNT1 and the second contact portion CNT2 may be formed. Although FIGS. 11G and 16 illustrate an embodiment in which the first and second contact portions CNT1 and CNT2 are formed in the emission area EA, the position, size and/or number of the first and second contact portions CNT1 and CNT2 may be varied. For example, as shown in FIG. 5, the first and second contact portions CNT1' and CNT2' may be formed in the separation area SPA, or the first and second contact portions CNT1, CNT1', CNT2 and CNT2' may be formed in the emission area EA and the separation area SPA.

Referring to FIGS. 1 to 11H and 17, in each separation area SPA, the first electrode ELT1 and the second electrode ELT2 may be etched to cut off using the first insulating pattern INP1 and the second insulating pattern INP2 as a mask. Thus, the first electrode ELT1 and the second electrode ELT2 of each pixel PXL may be separated from the first electrode ELT1 and the second electrode ELT2 of the neighboring pixel PXL, respectively. In one or more embodiments, by etching the first electrode ELT1 and the second electrode ELT2 in the separation area SPA through wet etching using the first insulating pattern INP1 and the second insulating pattern INP2 as a mask, the first electrode ELT1 and the second electrode ELT2 of each pixel PXL may be formed as individual patterns.

Furthermore, the first electrode ELT1 and the second electrode ELT2 may be over-etched such that the first electrode ELT1 and the second electrode ELT2 form the first reverse tapered pattern RTP1 and the second reverse tapered pattern RTP2, respectively, even in the first direction DR1. For instance, the first electrode ELT1 and the second electrode ELT2 may be formed to be shorter than the first insulating pattern INP1 and the second insulating pattern INP2, respectively, in a plan view (or a sectional view), and may be etched to be positioned inside the first insulating pattern INP1 and the second insulating pattern INP2, respectively, in the entire peripheral area, when seen in the plan view (or the sectional view).

Referring to FIGS. 1 to 11I, by applying the conductive material (e.g., the transparent conductive material) on the base layer BSL in which the first reverse tapered pattern RTP1 formed by the first electrode ELT1 and the first insulating pattern INP1, the second reverse tapered pattern RTP2 formed by the second electrode ELT2 and the second insulating pattern INP2, the light emitting elements LD, and the third insulating pattern INP3 are formed, the first and second contact electrodes CNE1 and CNE2 may be formed. Further, in the process of forming the first and second contact electrodes CNE1 and CNE2, the first and/or second conductive patterns CDP1 and CDP2 may be formed. The first and/or second conductive patterns CDP1 and CDP2 may be removed in a subsequent process or may remain in the pixel PXL without being removed.

For instance, in a step of applying the conductive material for forming the first and second contact electrodes CNE1 and CNE2, the conductive layer formed of the conductive material may be separated (or disconnected) using the first reverse tapered pattern RTP1, the second reverse tapered pattern RTP2, and the third insulating pattern INP3, so the first and second contact electrodes CNE1 and CNE2 and the first and second conductive patterns CDP1 and CDP2 may be formed to be separated into individual patterns. Thus, without performing a separate mask process, the first contact electrode CNE1 may be formed on the first ends EP1 of the light emitting elements LD and the first insulating pattern INP1, and the second contact electrode CNE2 may be formed on the second ends EP2 of the light emitting elements LD and the second insulating pattern INP2.

Thereafter, the light conversion layer CCL, the sixth insulating layer INS6, the color filter layer CFL, and/or the encapsulation layer ENC shown in FIG. 6 may be further formed on the base layer BSL on which the first and second contact electrodes CNE1 and CNE2 are formed.

Figure 18:
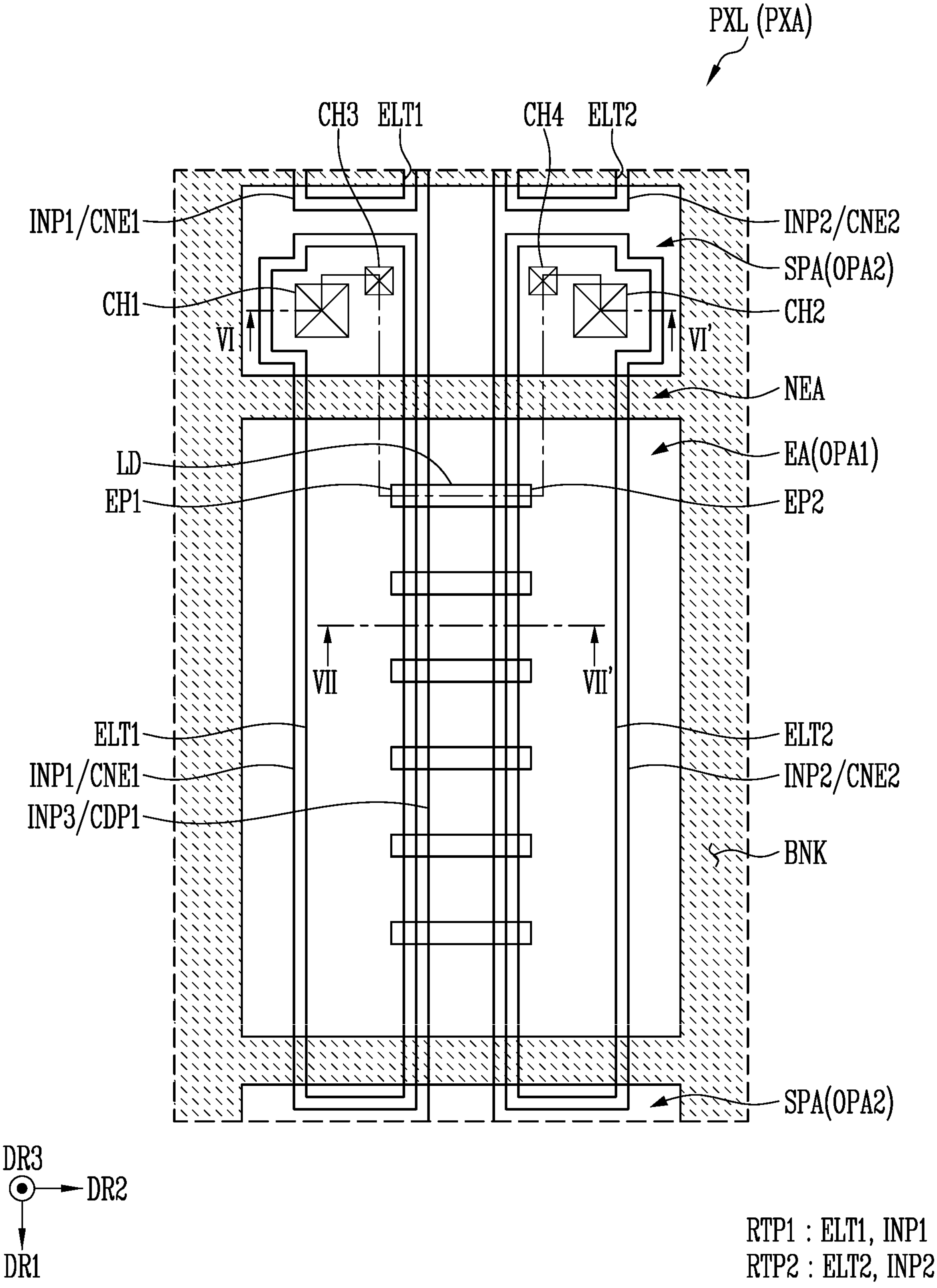
FIG. 18 is a plan view illustrating a pixel in accordance with one or more embodiments of the present disclosure.
Figure 19:
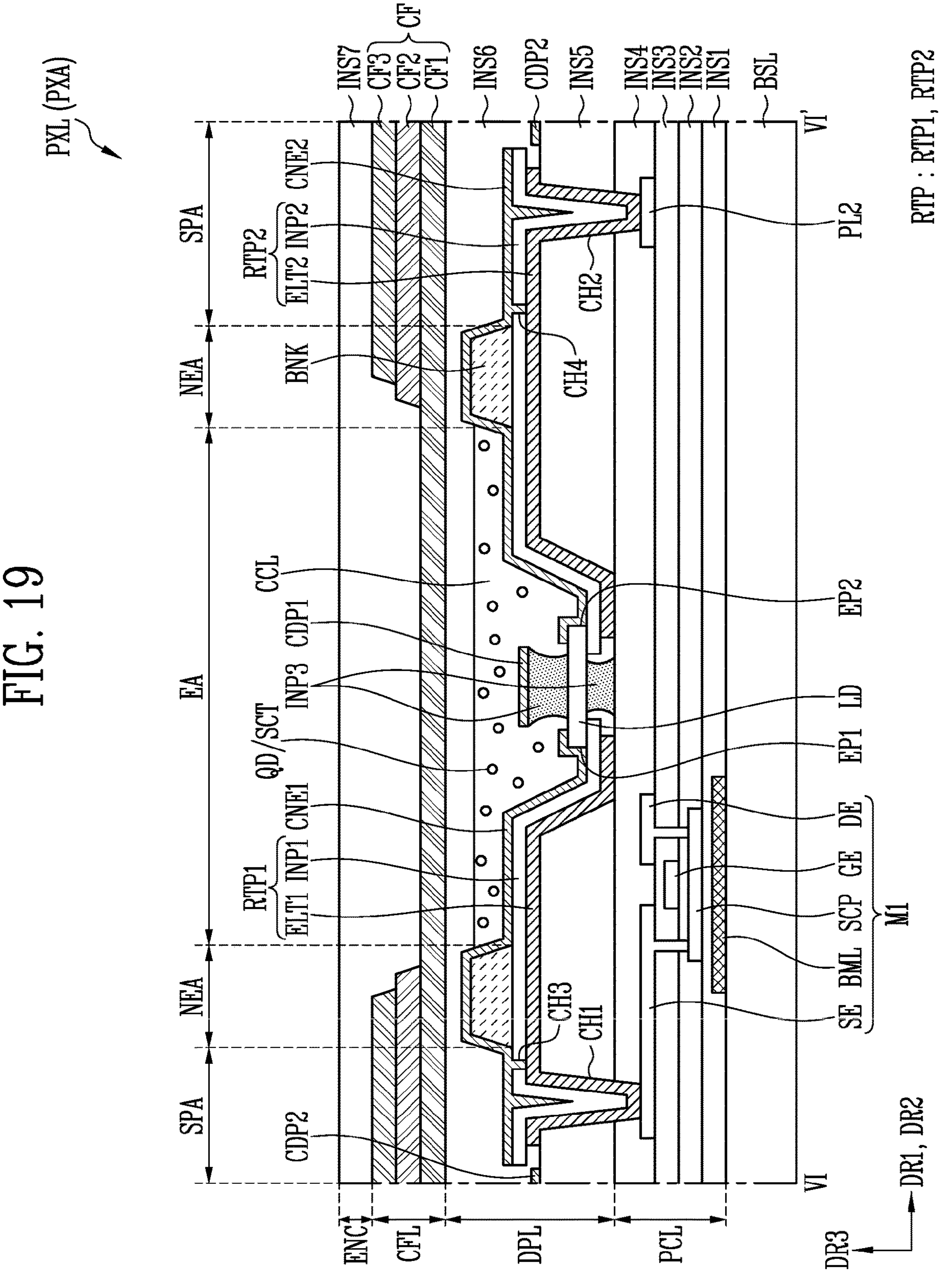
FIGS. 19 to 20 are sectional views illustrating a pixel in accordance with one or more embodiments of the present disclosure.
Figure 20:
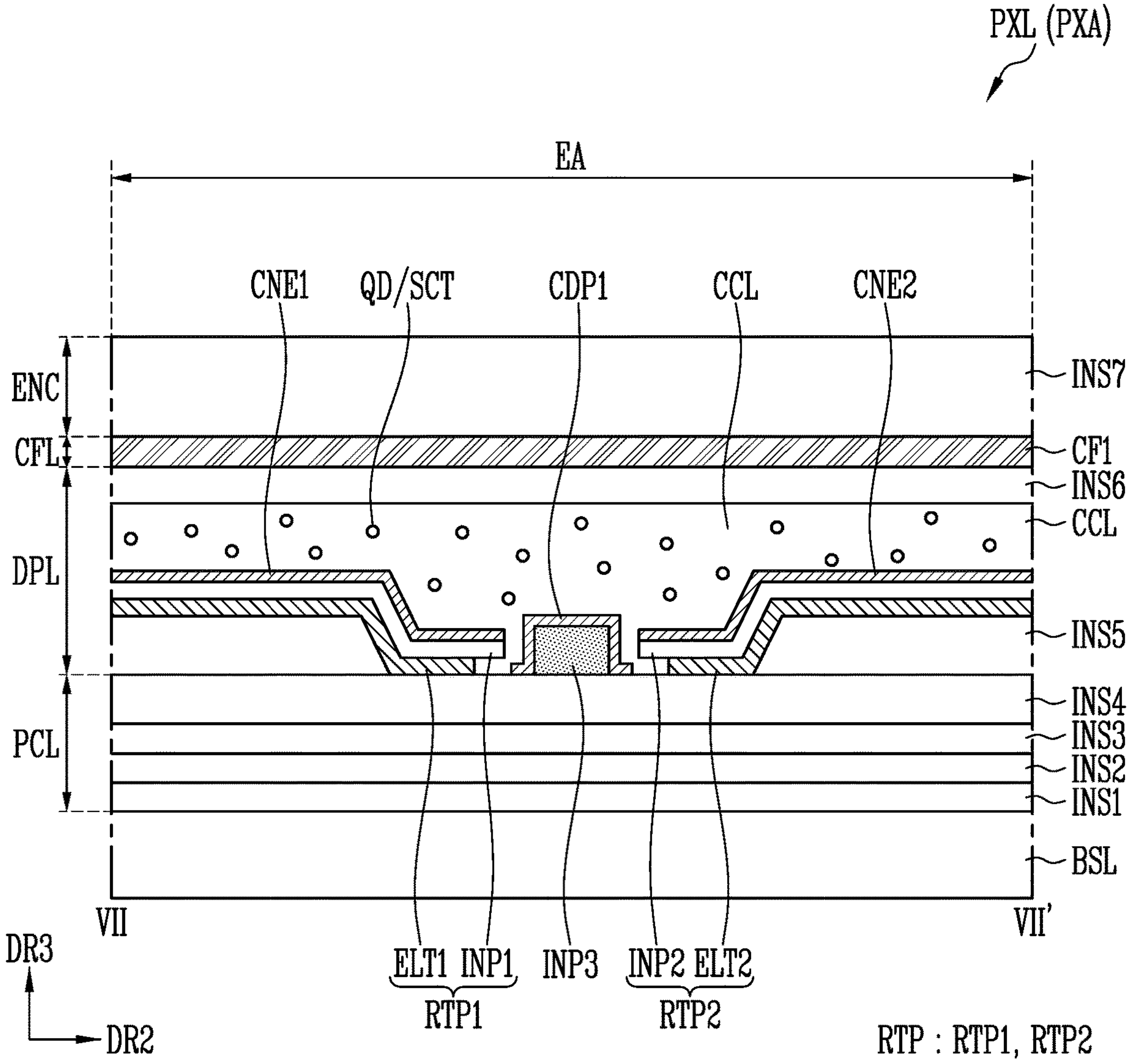

FIG. 18 is a plan view illustrating the pixel PXL in accordance with one or more embodiments of the present disclosure. For example, FIG. 18 is a plan view illustrating a modification of the pixel PXL according to the embodiment of FIG. 5. FIGS. 19 and 20 are sectional views illustrating a pixel PXL in accordance with one or more embodiments of the present disclosure. For example, FIG. 19 shows an embodiment of a section of the pixel PXL taken along the line VI to VI' of FIG. 18, and FIG. 20 shows a section of the pixel PXL taken along the line VII to VII' of FIG. 18. In the following description of the embodiment of FIGS. 18 to 20, components similar or equal to those of the previously described embodiments, e.g., the embodiment shown in FIGS. 5 and 10, will be designated by like reference numerals, and detailed descriptions thereof will be omitted.

Referring to FIGS. 18 to 20, the first electrode ELT1 and the first contact electrode CNE1 may be electrically connected to each other through the third contact hole CH3. Furthermore, the second electrode ELT2 and the second contact electrode CNE2 may be electrically connected to each other through the fourth contact hole CH4.

The third contact hole CH3 may be a contact hole which is formed in the first insulating pattern INP1 to connect the first electrode ELT1 and the first contact electrode CNE1. In one or more embodiments, the third contact hole CH3 may be formed in the separation area SPA, but the present disclosure is not limited thereto.

The fourth contact hole CH4 may be a contact hole which is formed in the second insulating pattern INP2 to connect the second electrode ELT2 and the second contact electrode CNE2. In one or more embodiments, the fourth contact hole CH4 may be formed in the separation area SPA, but the present disclosure is not limited thereto.

Figure 21:
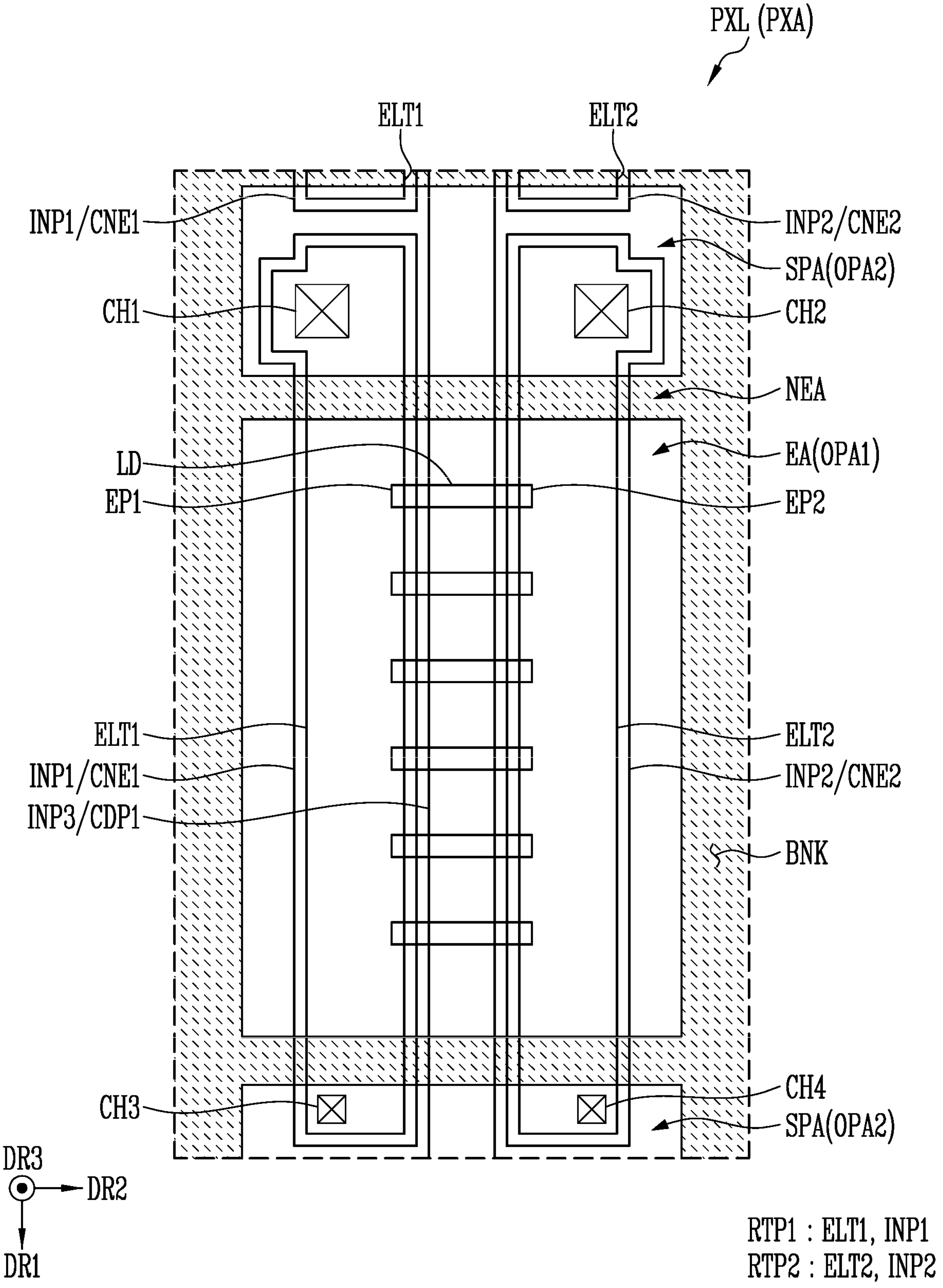
FIGS. 21 to 23 are plan views each illustrating a pixel in accordance with one or more embodiments of the present disclosure.
Figure 22:
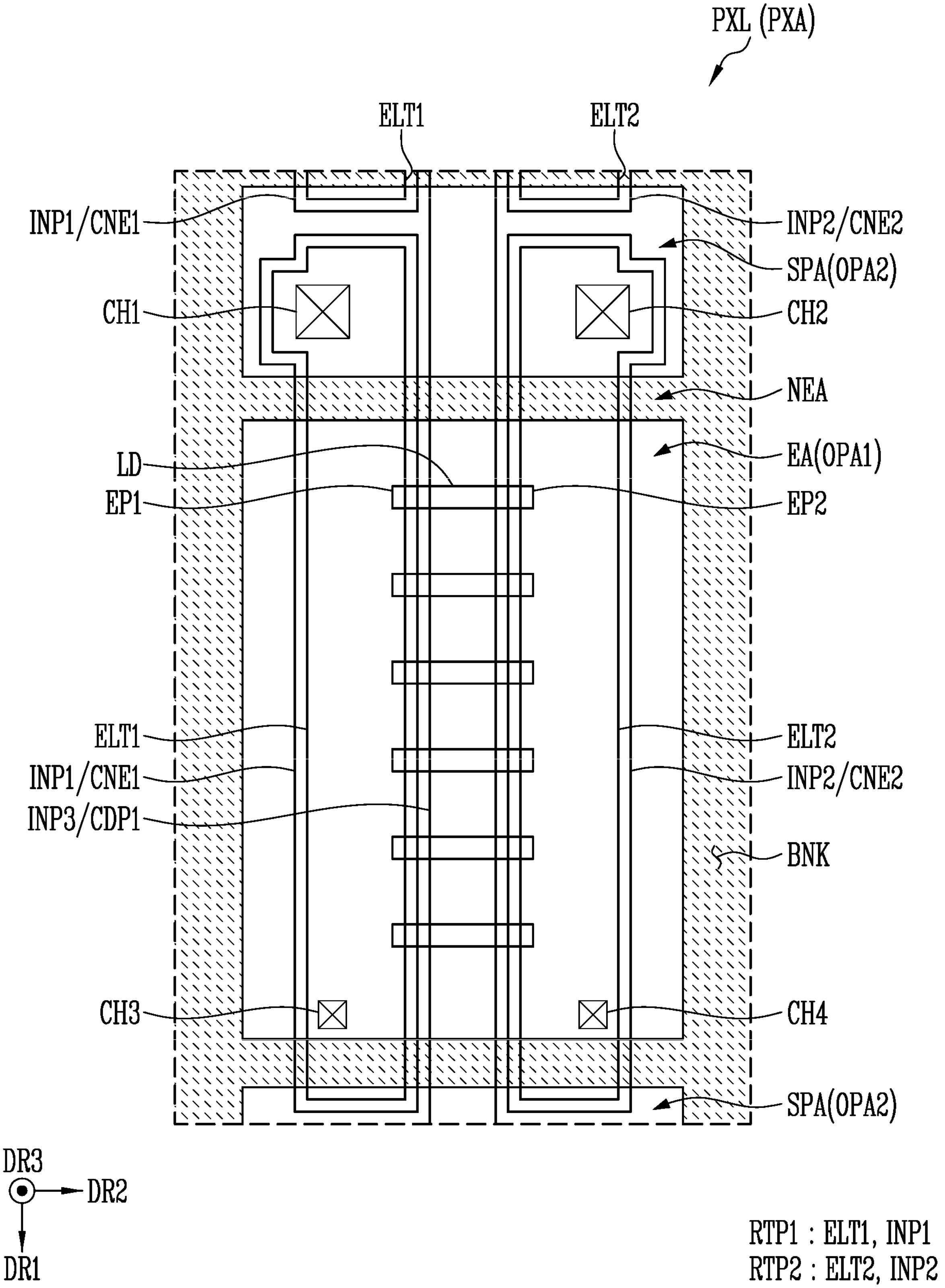
Figure 23:
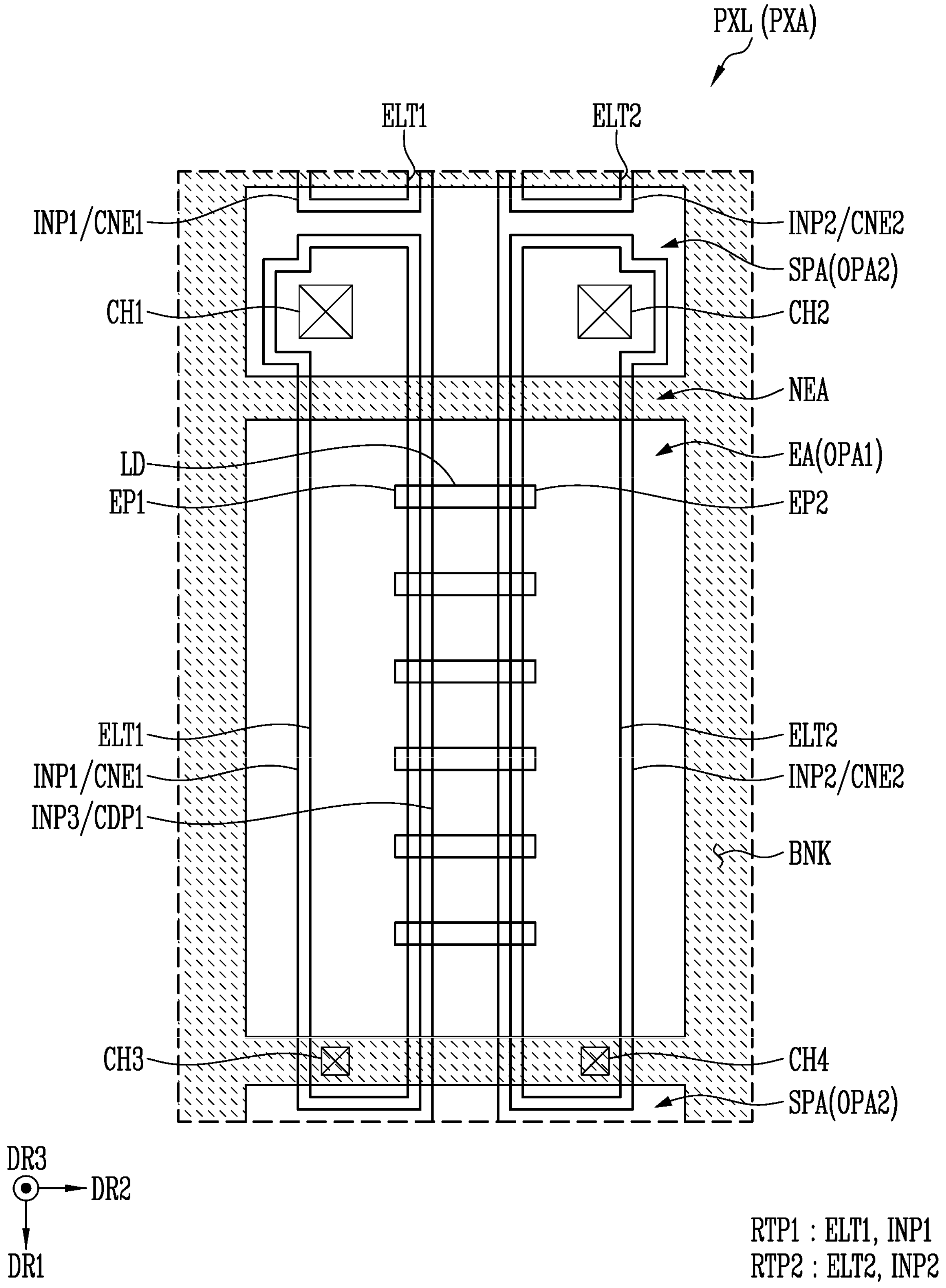

FIGS. 21 to 23 are plan views illustrating a pixel PXL in accordance with one or more embodiments of the present disclosure. For example, FIGS. 21 to 23 are plan views illustrating different modifications of the pixel PXL according to the embodiment of FIG. 5 or 18. In the description of the embodiment of FIGS. 21 to 23, like reference numerals will be used to designate components similar or equal to those of the previous embodiments, and detailed explanation thereof will be omitted.

Referring to FIG. 21, the third contact hole CH3 and the fourth contact hole CH4 may be positioned in the separation area SPA located under the emission area EA. In one or more embodiments, the first and second contact holes CH1 and CH2 and the third and fourth contact holes CH3 and CH4 may be disposed in different separation areas SPA. For example, the first and second contact holes CH1 and CH2 may be positioned in the separation area SPA located above the emission area EA, and the third and fourth contact holes CH3 and CH4 may be positioned in the separation area SPA located under the emission area EA.

Referring to FIG. 22, the third contact hole CH3 and the fourth contact hole CH4 may be positioned inside the emission area EA. In one or more embodiments, the third and fourth contact holes CH3 and CH4 may be positioned in the outer area of the emission area EA (e.g., the lower outer area of the emission area EA, or the upper outer area of the emission area EA).

Referring to FIG. 23, the third contact hole CH3 and the fourth contact hole CH4 may be positioned in the non-emission area NEA to overlap the bank BNK. In one or more embodiments, the third and fourth contact holes CH3 and CH4 may be positioned in the non-emission area NEA below the emission area EA or in the non-emission area NEA above the emission area EA.

In addition to the above-described embodiments, positions of the first, second, third, and/or fourth contact holes CH1, CH2, CH3, and CH4 may be variously changed.

Figure 24:
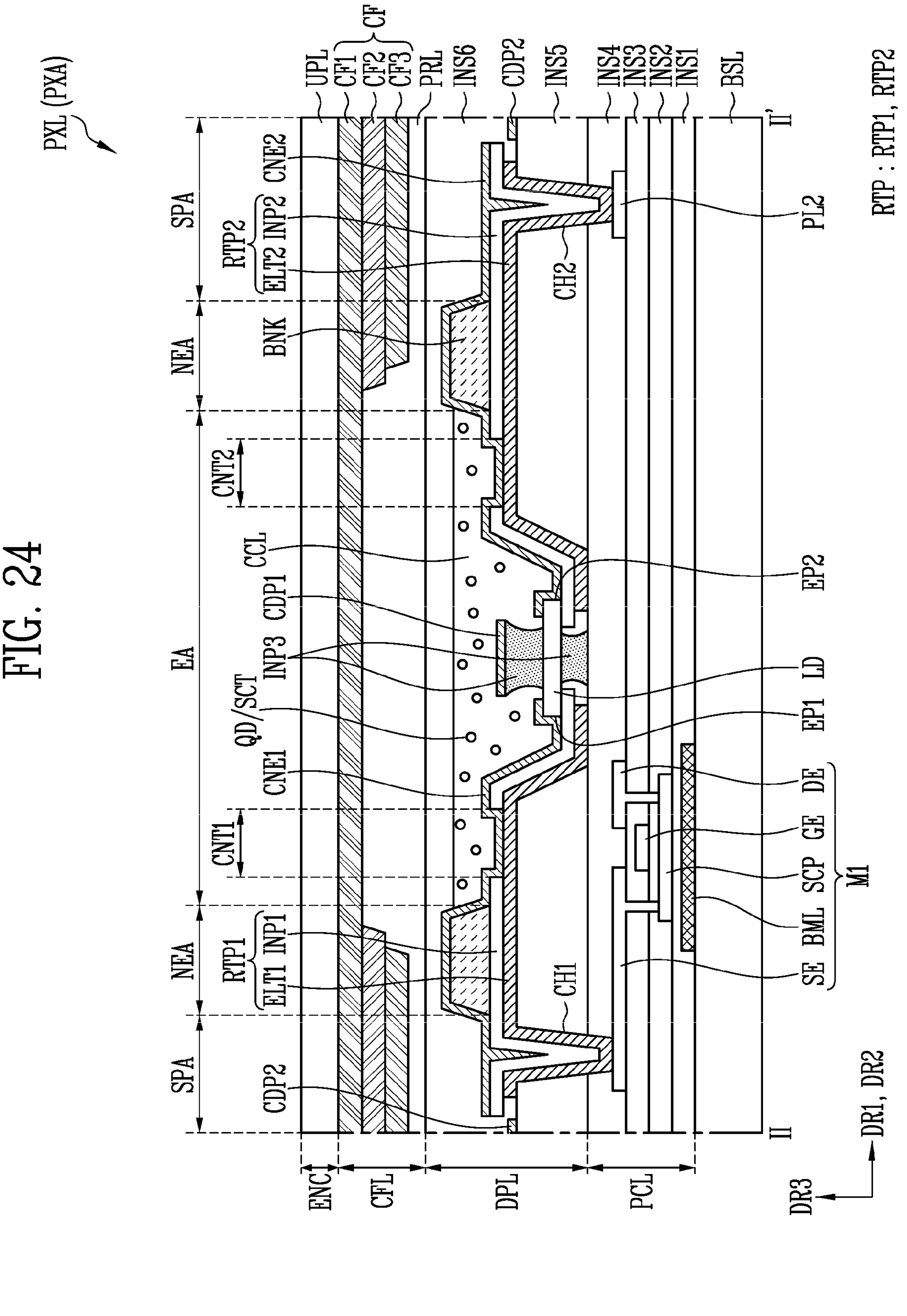
FIGS. 24 to 25 are sectional views each illustrating a pixel in accordance with one or more embodiments of the present disclosure.
Figure 25:
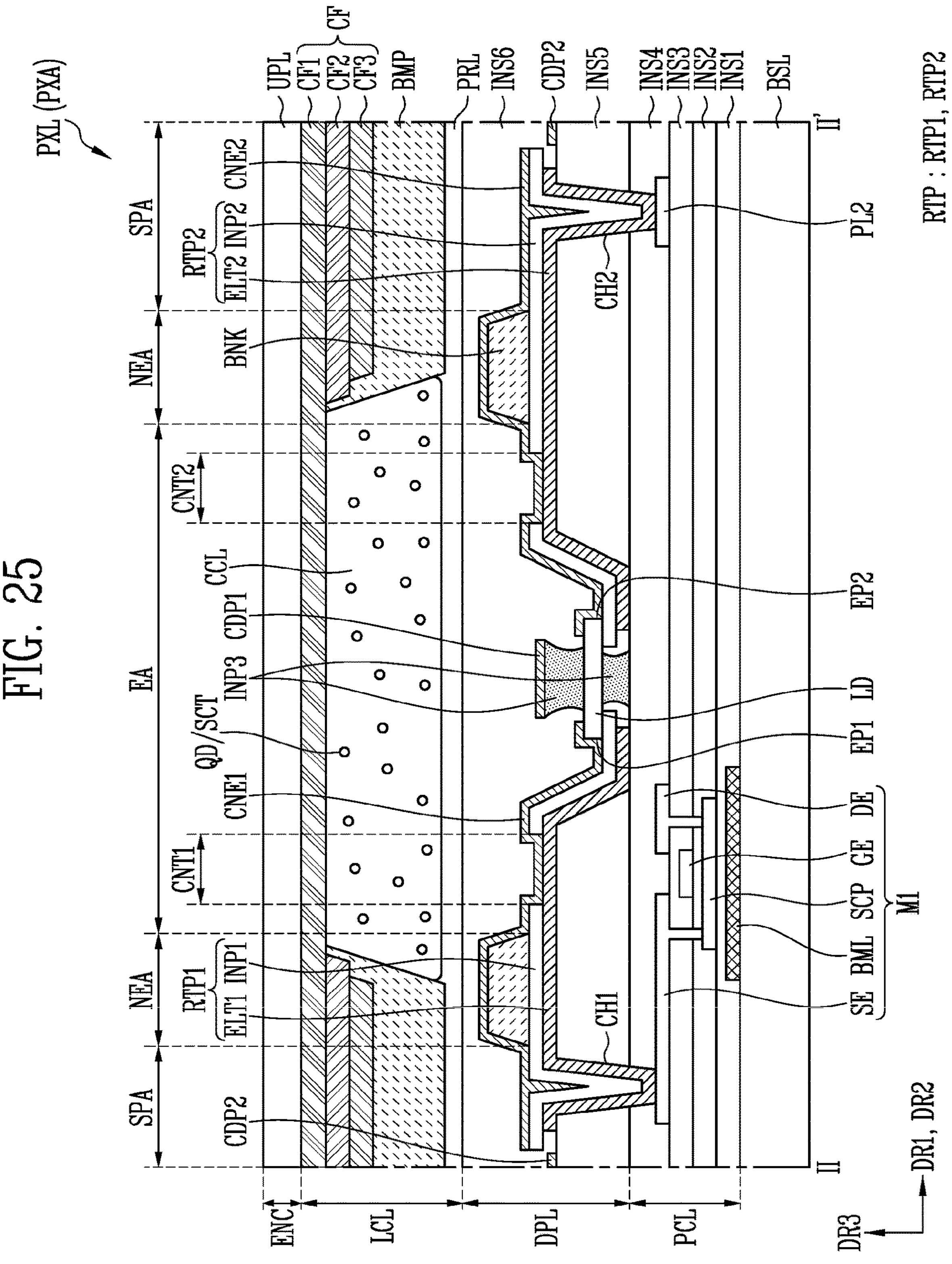

FIGS. 24 and 25 are sectional views illustrating a pixel PXL in accordance with one or more embodiments of the present disclosure. For example, FIGS. 24 and 25 illustrate different modifications of the pixel PXL according to the embodiment of FIG. 6. FIGS. 24 and 25 illustrate sections of the pixel PXL taken along the line II-II' of FIG. 5. However, the embodiments of FIGS. 24 and 25 may also be applied to the pixel PXL according to the embodiments of FIGS. 18 to 23. In the description of the embodiment of FIGS. 24 and 25, like reference numerals will be used to designate components similar or equal to those of the previous embodiments, and detailed explanation thereof will be omitted.

Referring to FIGS. 1 to 24, the display panel DP may include the upper substrate UPL, and the color filters CF may be provided and/or formed on a surface of the upper substrate UPL. The upper substrate UPL may be disposed over the base layer BSL on which the circuit layer PCL and the display layer DPL are formed, and may form the encapsulation layer ENC. The upper substrate UPL may be a rigid or soft substrate or film. The color filters CF may be disposed on a surface of the upper substrate UPL to face (or oppose) the circuit layer PCL and the display layer DPL, and may form the color filter layer CFL.

In one or more embodiments, the color filter layer CFL may further include the passivation layer PRL provided on a surface of the upper substrate UPL including the color filters CF. For example, the passivation layer PRL may be provided to cover surfaces of the color filters CF.

The passivation layer PRL may include at least one organic insulating layer and/or an inorganic insulating layer. In one or more embodiments, the passivation layer (PRL) may be composed of at least one insulating layer including a low refractive material (e.g., silicon oxide ($SiO_x$)) having a refractive index of approximately 1.4 to 1.6, but the present disclosure is not limited thereto.

Referring to FIGS. 1 to 25, the display panel DP may include the upper substrate UPL, and the color filters CF and the light conversion layer CCL may be provided and/or formed on a surface of the upper substrate UPL. For instance, the color filters CF and the light conversion layer CCL may be successively disposed on a surface of the upper substrate UPL facing (or opposing) the circuit layer PCL and the display layer DPL. The color filters CF and the light conversion layer CCL may form a light control layer LCL.

The light control layer LCL may further include a light blocking pattern BMP and/or a passivation layer PRL.

The light blocking pattern BMP may be provided in the non-emission area NEA and/or the separation area SPA to enclose the light conversion pattern CCL of each pixel PXL. For example, the light blocking pattern BMP may define (or partition) the emission area EA in which each light conversion pattern CCL is to be formed. The light blocking pattern BMP may include light blocking and/or reflective materials including a black matrix material. Therefore, light leakage may be prevented between the pixels PXL. The light blocking pattern BMP may include the same or different material as or from the bank BNK.

The passivation layer PRL may be provided on a surface of the upper substrate UPL including the light conversion pattern CCL and the light blocking pattern BMP. For instance, the passivation layer PRL may be formed to cover surfaces of the light conversion pattern CCL and the light blocking pattern BMP.

In addition to the above-described embodiments, positions of the color filters CFL and/or the light conversion layer CCL may be variously changed.

According to the above-described embodiments of the present disclosure, the conductive material may be applied onto the display area DA in which the light emitting elements LD are aligned, and concurrently (or simultaneously), the conductive layer formed of the conductive material may be separated, thus forming the first contact electrodes CNE1 and the second contact electrodes CNE2.

For example, above the light emitting elements LD, the first contact electrode CNE1 and the second contact electrode CNE2 may be reliably separated by the third insulating pattern INP3. Furthermore, even in areas where the light emitting elements LD are not aligned, including the area between the light emitting elements LD and the separation area SPA, the first contact electrode CNE1 and the second contact electrode CNE2 may be reliably separated by the first reverse tapered pattern RTP1, the second reverse tapered pattern RTP2, and/or the third insulating pattern INP3.

Therefore, a contact process for connecting the light emitting elements LD to the first and second electrodes ELT1 and ELT2 and/or the first and second contact electrodes CNE1 and CNE2 may be simplified, and the number of mask processes used for manufacturing the pixels PXL may be reduced. Therefore, in accordance with one or more embodiments of the present disclosure, the process of fabricating the pixel PXL and the display device DD including the same may be simplified.

Furthermore, as the process of fabricating the pixel PXL and the display device DD including the same is simplified, process variations that may occur in each process step may be reduced. Accordingly, the light emitting elements LD may be reliably connected to the first and second contact electrodes CNE1 and CNE2.

While the idea of the present disclosure are described by detailed embodiments, it should be noted that the above-described embodiments are merely descriptive and should not be considered limiting. It should be understood by those skilled in the art that various changes, substitutions, and alternations may be made herein without departing from the scope of the present disclosure as defined by the following claims.

The scope of the present disclosure is not limited by detailed descriptions of the present specification, and should be defined by the accompanying claims. Furthermore, all changes or modifications of the present disclosure derived from the meanings and scope of the claims, and equivalents thereof should be construed as being included in the scope of the present disclosure.

What is claimed is:

1. A display device comprising a pixel in a display area, the pixel comprising:

a first electrode and a second electrode spaced from each other;

a first insulating pattern on the first electrode, the first insulating pattern protruding to an outside of the first electrode while having a width greater than that of the first electrode;

a second insulating pattern on the second electrode, the second insulating pattern protruding to an outside of the second electrode while having a width greater than that of the second electrode;

a light emitting element arranged between the first insulating pattern and the second insulating pattern, the light emitting element comprising a first end and a second end;

a third insulating pattern on a portion of the light emitting element to expose the first end and the second end of the light emitting element;

a first contact electrode on the first end of the light emitting element and the first insulating pattern, and connected to the first end of the light emitting element; and a second contact electrode on the second end of the light emitting element and the second insulating pattern, and connected to the second end of the light emitting element, wherein portions of the first insulating pattern, the second insulating pattern, and the third insulating pattern touch a same side of the light emitting element, wherein the third insulating pattern consists of a first portion not touching a same side of the light emitting element as portions of the first insulating pattern and portions of the second insulating pattern and a second portion touching a same side of the light emitting element as portions of the first insulating pattern and portions of the second insulating pattern, wherein the portions of the first insulating pattern, the portions of the second insulating pattern, and the second portion of the third insulating pattern are spaced from each other in a first direction perpendicular to a thickness direction of the display device.

2. The display device according to claim 1, wherein the first insulating pattern overlaps the first electrode and protrudes to the outside of the first electrode in an entire peripheral area of the first electrode, and wherein the second insulating pattern overlaps the second electrode and protrudes to the outside of the second electrode in an entire peripheral area of the second electrode.

3. The display device according to claim 2, wherein the first insulating pattern and the second insulating pattern have individual patterns corresponding to the pixel.

4. The display device according to claim 3, wherein the first contact electrode has an individual pattern corresponding to the first insulating pattern, and wherein the second contact electrode has an individual pattern corresponding to the second insulating pattern.

5. The display device according to claim 1, wherein the first insulating pattern and the second insulating pattern are spaced from each other by a first distance shorter than a length of the light emitting element, and wherein the first end and the second end of the light emitting element are on the first insulating pattern and the second insulating pattern, respectively.

6. The display device according to claim 5, wherein the first electrode and the second electrode are spaced from each other by a second distance that is longer than the first distance.

7. The display device according to claim 1, wherein the first contact electrode is connected to the first electrode through a first contact portion in the first insulating pattern, and wherein the second contact electrode is connected to the second electrode through a second contact portion in the second insulating pattern.

8. The display device according to claim 1, wherein the third insulating pattern comprises:

an upper area comprising an upper surface; and a middle area located between the upper area and the light emitting element, and having a width narrower than that of the upper area.

9. The display device according to claim 8, wherein the first contact electrode and the second contact electrode are separated from each other with the third insulating pattern interposed therebetween.

10. The display device according to claim 1, wherein the pixel comprises a plurality of light emitting elements arranged between the first insulating pattern and the second insulating pattern, including the light emitting element.

11. The display device according to claim 10, wherein the third insulating pattern has a first height above the light emitting elements, and has a second height lower than the first height in an area between the light emitting elements.

12. The display device according to claim 10, wherein the third insulating pattern comprises a concave curved sidewall above the light emitting elements and a vertical sidewall in an area between the light emitting elements.

13. The display device according to claim 1, wherein the pixel further comprises a conductive pattern that is on the third insulating pattern and is separated from the first contact electrode and the second contact electrode.

14. The display device according to claim 13, wherein the conductive pattern comprises a same material as that of the first and second contact electrodes.

15. A display device comprising a plurality of pixels that are adjacent in a first direction in a display area of the display device, a pixel of the plurality of pixels comprising:

a first electrode and a second electrode spaced from each other;

a first insulating pattern on the first electrode, the first insulating pattern protruding to an outside of the first electrode while having a width greater than that of the first electrode;

a second insulating pattern on the second electrode, the second insulating pattern protruding to an outside of the second electrode while having a width greater than that of the second electrode;

a light emitting element arranged between the first insulating pattern and the second insulating pattern, the light emitting element comprising a first end and a second end;

a third insulating pattern on a portion of the light emitting element to expose the first end and the second end of the light emitting element;

a first contact electrode on the first end of the light emitting element and the first insulating pattern, and connected to the first end of the light emitting element; and a second contact electrode on the second end of the light emitting element and the second insulating pattern, and connected to the second end of the light emitting element, wherein portions of the first insulating pattern, the second insulating pattern, and the third insulating pattern touch a same side of the light emitting element, the portions of the first insulating pattern, the second insulating pattern, and the third insulating pattern that touch the same side of the light emitting element being spaced from each other in the first direction perpendicular to a thickness direction of the display device, wherein first electrodes of the plurality of pixels are separated from each other in a separation area located between emission areas of the plurality of pixels, wherein first insulating patterns of the plurality of pixels are separated from each other in the separation area, wherein first contact electrodes of the plurality of pixels are separated from each other in the separation area, and wherein the first insulating pattern and the first contact electrode of each of the pixels protrude to an outside of the first electrode of each of the pixels in the first direction.

* * * * *